United States Patent
Kim et al.

(10) Patent No.: US 12,527,195 B2
(45) Date of Patent: Jan. 13, 2026

(54) DISPLAY DEVICE HAVING WAVELENGTH CONVERSION PATTERN AND OPTICAL PATTERN

(71) Applicant: Samsung Display Co., LTD., Yongin-si (KR)

(72) Inventors: Jang Il Kim, Asan-si (KR); Chang Soon Jang, Seoul (KR); Jeong Ki Kim, Hwaseong-si (KR); Chan Su Kim, Asan-si (KR); Kyoung Hae Min, Asan-si (KR); Keun Chan Oh, Hwaseong-si (KR); Gak Seok Lee, Hwaseong-si (KR); Sang Hun Lee, Hwaseong-si (KR); So Yun Lee, Seoul (KR); Ji Eun Jang, Suwon-si (KR); You Young Jin, Suwon-si (KR); Seok Joon Hong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 419 days.

(21) Appl. No.: 18/018,265

(22) PCT Filed: Dec. 18, 2020

(86) PCT No.: PCT/KR2020/018728
§ 371 (c)(1),
(2) Date: Jan. 26, 2023

(87) PCT Pub. No.: WO2022/025365
PCT Pub. Date: Feb. 3, 2022

(65) Prior Publication Data
US 2023/0284512 A1 Sep. 7, 2023

(30) Foreign Application Priority Data
Jul. 27, 2020 (KR) .................... 10-2020-0093035

(51) Int. Cl.
*H10K 59/38* (2023.01)
*H10K 59/122* (2023.01)
*H10K 59/80* (2023.01)

(52) U.S. Cl.
CPC .......... *H10K 59/38* (2023.02); *H10K 59/122* (2023.02); *H10K 59/873* (2023.02);
(Continued)

(58) Field of Classification Search
CPC ..... H10K 59/38; H10K 59/873; H10K 59/879
See application file for complete search history.

(56) References Cited

U.S. PATENT DOCUMENTS 9,941,452 B2   4/2018   Mao et al.
10,367,171 B2  7/2019   Song
(Continued)

FOREIGN PATENT DOCUMENTS

CN   110911447 A   3/2020
CN   111199997 A   5/2020
(Continued)

OTHER PUBLICATIONS

Extended European Search Report-European Application No. 20947376.8 dated Jun. 17, 2024.
(Continued)

*Primary Examiner* — Nduka E Ojeh
(74) *Attorney, Agent, or Firm* — CANTOR COLBURN LLP

(57) ABSTRACT

A display device includes a first base portion in which a first emission area and a non-emission area are defined, a first light emitting element on the first base portion and overlapping the first emission area, a thin film encapsulation layer on the first light emitting element, a second base portion on the thin film encapsulation layer, a first color filter on the second base portion and overlapping the first emission area,
(Continued)

a first wavelength conversion pattern on the first color filter and overlapping the first emission area, and a first optical pattern between the first color filter and the first wavelength conversion pattern and overlapping the first emission area. A refractive index of the first optical pattern is smaller than that of the first wavelength conversion pattern, and one surface of the first optical pattern facing the first wavelength conversion pattern is concave toward the second base portion.

25 Claims, 41 Drawing Sheets

(52) U.S. Cl.
CPC ....... *H10K 59/8731* (2023.02); *H10K 59/879* (2023.02); *H10K 59/8792* (2023.02)

(56) References Cited

U.S. PATENT DOCUMENTS

| | | | |
|---|---|---|---|
| 10,670,901 B2* | 6/2020 | Lee | G02F 1/133345 |
| 10,916,722 B2 | 2/2021 | Park et al. | |
| 11,342,525 B2 | 5/2022 | Kim et al. | |
| 11,444,258 B2 | 9/2022 | Park et al. | |
| 11,903,229 B2 | 2/2024 | Park et al. | |
| 2003/0113639 A1* | 6/2003 | Kawase | G02B 5/201 |
| | | | 430/7 |
| 2011/0248256 A1* | 10/2011 | Cok | H10K 59/8792 |
| | | | 257/40 |
| 2015/0084026 A1* | 3/2015 | Miyamoto | H10K 50/858 |
| | | | 257/40 |
| 2018/0122836 A1 | 5/2018 | Kang et al. | |
| 2018/0156951 A1* | 6/2018 | Baek | G02B 5/285 |
| 2019/0310522 A1* | 10/2019 | Chu | G02F 1/133617 |
| 2020/0161579 A1 | 5/2020 | Kim et al. | |
| 2022/0085114 A1 | 3/2022 | Seong et al. | |
| 2022/0336780 A1* | 10/2022 | Sun | G02B 1/02 |
| 2023/0116030 A1* | 4/2023 | Sui | H10K 59/879 |
| | | | 257/40 |
| 2023/0284512 A1* | 9/2023 | Kim | H10K 59/873 |
| | | | 257/91 |
| 2024/0237386 A9 | 7/2024 | Park et al. | |

FOREIGN PATENT DOCUMENTS

| | | |
|---|---|---|
| JP | 2004259692 | 9/2004 |
| KR | 1020130015734 | 2/2013 |
| KR | 1020160027608 | 3/2016 |
| KR | 1020190014293 | 2/2019 |
| KR | 1020190027006 | 3/2019 |
| KR | 1020190055612 | 5/2019 |
| KR | 1020190086605 | 7/2019 |
| KR | 1020190118224 | 10/2019 |
| KR | 1020190122919 | 10/2019 |
| KR | 1020200032294 | 3/2020 |
| KR | 1020200058665 A | 5/2020 |
| KR | 1020200083879 A | 7/2020 |
| KR | 1020200100910 | 8/2020 |
| WO | 2020141651 A1 | 7/2020 |

OTHER PUBLICATIONS

International Search Report—PCT/KR2020/018728 dated Apr. 20, 2021.

* cited by examiner

DISPLAY DEVICE HAVING WAVELENGTH CONVERSION PATTERN AND OPTICAL PATTERN

TECHNICAL FIELD

The disclosure relates to a display device.

BACKGROUND ART

The importance of display devices has steadily increased with the development of multimedia technology. Accordingly, various types of display devices such as a liquid crystal display (LCD) device, an organic light emitting diode (OLED) display device and the like have been developed.

Among the display devices, a self-light emitting display device includes a self-light emitting element such as an organic light emitting element. The self-light emitting element may include two opposite electrodes and a light emitting layer interposed therebetween. In the case of using the organic light emitting element as the self-light emitting element, the electrons and holes from the two electrodes are recombined in the light emitting layer to produce excitons, which transition from the excited state to the ground state, emitting light.

The self-light emitting display device is attracting attention as a next-generation display device having high display quality characteristics such as wide viewing angle, high brightness and contrast, and quick response speed with low power consumption, lightweight, and thin by not including an additional light source such as a backlight unit.

DISCLOSURE

Technical Problem

As one method for allowing each pixel of the display device to uniquely display one primary color, there is a method of arranging a color conversion pattern or a wavelength conversion pattern for each pixel on an optical path from a light source to a viewer.

Embodiments of the disclosure provide a display device having improved light efficiency.

However, embodiments of the disclosure are not restricted to the one set forth herein. The above and other features of embodiments the disclosure will become more apparent to one of ordinary skill in the art to which the disclosure pertains by referencing the detailed description of the present disclosure given below.

Technical Solution

According to an embodiment of the disclosure, a display device includes: a first base portion in which a first emission area and a non-emission area are defined; a first light emitting element positioned on the first base portion and overlapping the first emission area; a thin film encapsulation layer positioned on the first light emitting element; a second base portion positioned on the thin film encapsulation layer; a first color filter positioned between the second base portion and the first base portion and overlapping the first emission area; a first wavelength conversion pattern positioned on the first color filter and overlapping the first emission area; and a first optical pattern positioned between the first color filter and the first wavelength conversion pattern and overlapping the first emission area, where a refractive index of the first optical pattern is smaller than a refractive index of the first wavelength conversion pattern, and one surface of the first optical pattern facing the first wavelength conversion pattern includes a curved surface concave toward the second base portion.

In some embodiments, the refractive index of the first optical pattern may be about 1.1 or more and about 1.4 or less, and the refractive index of the first wavelength conversion pattern may be about 1.7 or more and about 1.9 or less.

In some embodiments, the display device may further comprise a bank pattern positioned between the second base portion and the first base portion and surrounding the first wavelength conversion pattern while overlapping the non-emission area, and the first optical pattern may be positioned in a space partitioned by the bank pattern.

In some embodiments, a height of the bank pattern measured with respect to one surface of the second base portion may be higher than a height of the first optical pattern measured with respect to the one surface of the second base portion.

In some embodiments, the first optical pattern may include a portion in which the height of the first optical pattern increases as a distance thereof from the bank pattern decreases.

In some embodiments, the first optical pattern may be in direct contact with the bank pattern in a space defined by the bank pattern.

In some embodiments, the display device may further include a column spacer positioned on one surface of the bank pattern facing the first base portion, and the column spacer may include a same material as the first optical pattern.

In some embodiments, the first optical pattern and the column spacer may include a resin and a plurality of particles dispersed in the resin and including an inorganic material.

In some embodiments, the display device may further include a capping layer positioned on the first wavelength conversion pattern and the bank pattern and covering the column spacer, and a portion of the capping layer overlapping the column spacer may be in contact with the thin film encapsulation layer.

In some embodiments, the display device may further include a filler positioned between the capping layer and the thin film encapsulation layer, and the filler may be in contact with the capping layer and the thin film encapsulation layer.

In some embodiments, the first optical pattern may further include a plurality of convex patterns protruding from one surface of the first optical pattern toward the first wavelength conversion pattern.

In some embodiments, a first opening exposing a part of the first color filter may be defined in the first optical pattern, and a part of the first wavelength conversion pattern may be positioned in the first opening.

In some embodiments, an edge of the first emission area may completely surround the first opening in a plan view.

In some embodiments, the display device may further include a capping layer positioned between the first optical pattern and the first wavelength conversion pattern, and the capping layer may be in contact with the part of the first color filter exposed through the first opening.

In some embodiments, the first base portion may further include a second emission area and a third emission area. The display device may further include a second light emitting element positioned on the first base portion and overlapping the second emission area; a third light emitting element positioned on the first base portion and overlapping the third emission area; a second color filter positioned between the second base portion and the first base portion and overlapping the second emission area; a second wavelength conversion pattern positioned on the second color filter and overlapping the second emission area; a second optical pattern positioned between the second color filter and the second wavelength conversion pattern and overlapping the second emission area; a third color filter positioned between the second base portion and the first base portion and overlapping the third emission area; a light transmission pattern positioned on the third color filter and overlapping the third emission area; and a third optical pattern positioned between the third color filter and the light transmission pattern and overlapping the third emission area. The first optical pattern, the second optical pattern and the third optical pattern may include a same material as each other.

In some embodiments, in a plan view, an area of the third optical pattern may be different from an area of the first optical pattern and an area of the second optical pattern.

In some embodiments, a first opening exposing a part of the first color filter may be defined in the first optical pattern, a second opening exposing a part of the second color filter may be defined in the second optical pattern, and a third opening exposing a part of the third color filter may be defined in the third optical pattern. In a plan view, an area of the third opening may be different from an area of the first opening and an area of the second opening.

According to another embodiment of the disclosure, a display device includes: a first base portion in which a first emission area and a non-emission area are defined; a first light emitting element positioned on the first base portion and overlapping the first emission area; a thin film encapsulation layer positioned on the first light emitting element; a filler positioned on the thin film encapsulation layer; a second base portion positioned on the filler; a first color filter positioned between the second base portion and the first base portion and overlapping the first emission area; a first wavelength conversion pattern positioned on the first color filter and overlapping the first emission area; and a first optical pattern positioned between the first wavelength conversion pattern and the filler and overlapping the first emission area. A refractive index of the first optical pattern is greater than a refractive index of the filler, and one surface of the first optical pattern facing the filler includes a curved surface convex toward the filler.

In some embodiments, the refractive index of the filler may be about 1.4 or more and about 1.7 or less, and the refractive index of the first optical pattern may be about 1.8 or more and about 2.5 or less.

In some embodiments, the display device may further include a bank pattern positioned between the second base portion and the first base portion and surrounding the first wavelength conversion pattern while overlapping the non-emission area; and a column spacer positioned on one surface of the bank pattern facing the first base portion. The column spacer and the first optical pattern may include a same material.

In some embodiments, the column spacer may be in contact with the thin film encapsulation layer, and the first optical pattern may be spaced apart from the thin film encapsulation layer with the filler interposed therebetween.

In some embodiments, the display device may further include a capping layer covering the first wavelength conversion pattern and the bank pattern. The first optical pattern and the column spacer may be positioned on one surface of the capping layer facing the first base portion.

In some embodiments, an edge of the first emission area may completely surround the first optical pattern in a plan view.

In some embodiments, the first base portion may further include a second emission area and a third emission area. The display device may further include a second light emitting element positioned on the first base portion and overlapping the second emission area; a third light emitting element positioned on the first base portion and overlapping the third emission area; a second color filter positioned between the second base portion and the first base portion and overlapping the second emission area; a second wavelength conversion pattern positioned on the second color filter and overlapping the second emission area; a second optical pattern positioned between the second wavelength conversion pattern and the filler and overlapping the second emission area; a third color filter positioned between the second base portion and the first base portion and overlapping the third emission area; a light transmission pattern positioned on the third color filter and overlapping the third emission area; and a third optical pattern positioned between the light transmission pattern and the filler and overlapping the third emission area. One surface of the second optical pattern facing the filler and one surface of the third optical pattern facing the filler may have a curved surface convex toward the filler.

In some embodiments, each of the first optical pattern, the second optical pattern, and the third optical pattern may be provided in plural, and the number of the first optical patterns overlapping the first emission area and the number of the second optical patterns overlapping the second emission area may be different from the number of the third optical patterns overlapping the third emission area.

Other features and embodiments may be apparent from the following detailed description, the drawings, and the claims.

Advantageous Effects

According to embodiments of the disclosure, it is possible to provide a display device having improved light efficiency.

Advantageous effects according to the disclosure are not limited to those mentioned above, and various other advantageous effects are included herein.

MODES OF THE INVENTION

Figure 1:
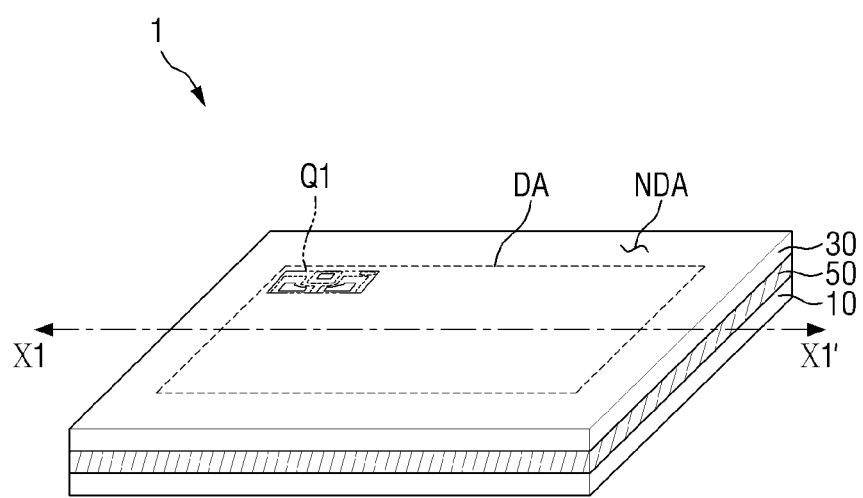
FIG. 1 is a schematic perspective view of a display device according to one embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

When an element or layer is referred to as being "on" another element or layer, it may be directly on the other element or layer or intervening elements or layers may be present. In contrast, when an element is referred to as being "directly on" another element, there are no intervening elements present. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use in addition to the orientation depicted in the figures. For example, if the device in the figures is turned over, elements described as "below" or "beneath" other elements or features would then be oriented "above" the other elements or features. Thus, the term "below" can encompass both an orientation of above and below.

Although the terms first, second, third, fourth, etc. may be used herein to describe various components, these components should not be limited by these terms. These terms are used to distinguish one component from another component. Thus, a first component discussed below could be termed any one of a second component, a third component, and a fourth component without departing from the teachings of the present disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the drawings are schematic in nature and their shapes are not intended to illustrate the actual shape of a region of a device and are not intended to be limiting.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

Figure 2:
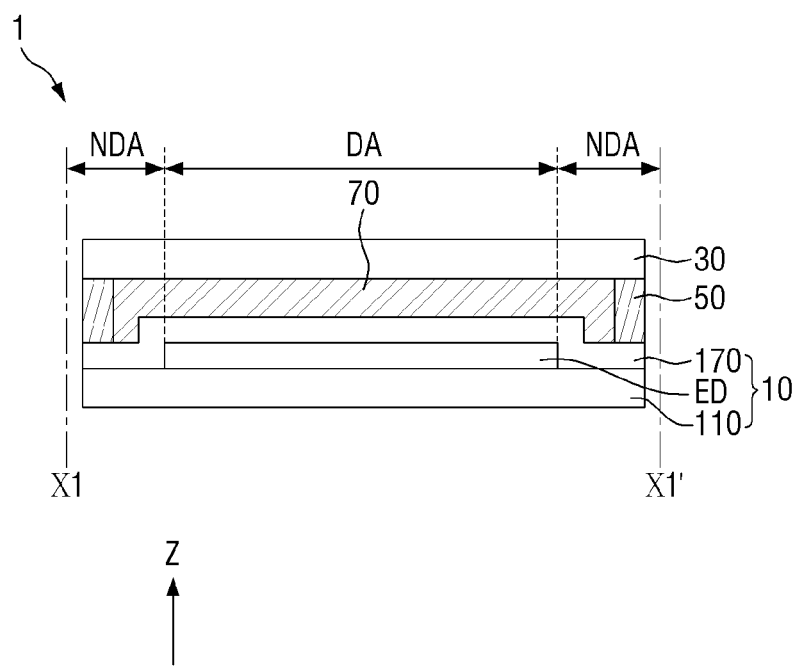
FIG. 2 is a schematic cross-sectional view of a display device according to one embodiment taken along line X1-X1' of FIG. 1.

FIG. 1 is a schematic perspective view of a display device according to one embodiment. FIG. 2 is a schematic cross-sectional view of a display device according to one embodiment taken along line X1-X1' of FIG. 1.

Referring to FIGS. 1 and 2, a display device 1 may be applied to a variety of electronic apparatuses, i.e., small and medium electronic devices such as a tablet PC, a smartphone, a car navigation unit, a camera, a center information display (CID) provided in a vehicle, a wristwatch-type electronic device, a personal digital assistant (PDA), a portable multimedia player (PMP) and a game console, and medium and large electronic devices such as a television, an external billboard, a monitor, a desktop computer integrated with a monitor, and a laptop computer. These are merely suggested as examples, but the display device 1 may also be applied to other electronic devices without departing from the present disclosure.

In some embodiments, the display device 1 may have a rectangular shape in a plan view. The display device 1 may include two first sides extending in a first direction X and two second sides extending in a second direction Y intersecting the first direction X. A corner where the first side and the second side of the display device 1 meet may have a right angle. However, the present disclosure is not limited thereto, and the corner may have a curved surface. In some embodiments, the length of the first side and the length of the second side may be different from each other, but the present disclosure is not limited thereto. The planar shape of the display device 1 is not limited to the exemplified one, but may have a circular shape or other shapes.

The display device 1 may include a display area DA in which an image is displayed and a non-display area NDA in which no image is displayed. In some embodiments, the non-display area NDA may be located around the display area DA and may surround the display area DA. An image displayed in the display area DA may be visually recognized by a user in a third direction Z, as indicated by an arrow in the drawings, intersecting the first direction X and the second direction Y.

Hereinafter, a schematic stacked structure of the display device 1 will be described. In some embodiments, as shown in FIG. 2, the display device 1 may include a display substrate (or a display panel) 10 and a color conversion substrate (or a color conversion panel) 30 facing the display substrate 10, and may further include a sealing portion 50 bonding the display substrate 10 to the color conversion substrate 30, and a filler 70 filled between the display substrate 10 and the color conversion substrate 30.

The display substrate 10 may include elements and circuits for displaying an image, for example, a pixel circuit such as a switching element, a pixel defining layer and a self-light emitting element that define emission area and a non-emission area, which will be described later, in the display area DA. In an embodiment, the self-light emitting element may include at least one of an organic light emitting diode, a quantum dot light emitting diode, an inorganic micro light emitting diode (e.g., micro LED), or an inorganic nano light emitting diode (e.g., nano LED). Hereinafter, for simplicity of description, embodiments where the self-light emitting element is an organic light emitting element will be described.

In the schematic stacked structure of the display substrate 10, a light emitting element ED may be positioned on a first base portion 110, and a thin film encapsulation layer 170 may be positioned on the light emitting element ED to cover the light emitting element ED. A specific stacked structure of the display substrate 10 will be described later.

The color conversion substrate 30 may be located above the display substrate 10 to face the display substrate 10. In some embodiments, the color conversion substrate 30 may include a color conversion pattern for converting the color of incident light. In some embodiments, the color conversion substrate 30 may include at least one of a color filter or a wavelength conversion pattern, as the color conversion pattern. In some embodiments, the color conversion substrate 30 may include both the color filter and the wavelength conversion pattern.

The sealing portion 50 may be positioned between the display substrate 10 and the color conversion substrate 30 in the non-display area NDA. The sealing portion 50 may be disposed along edges of the display substrate 10 and the color conversion substrate 30 in the non-display area NDA to surround the display area DA in a plan view. The display substrate 10 and the color conversion substrate 30 may be bonded to each other through the sealing portion 50.

In some embodiments, the sealing portion 50 may include or be made of an organic material. For example, the sealing portion 50 may include or be made of an epoxy-based resin, but is not limited thereto.

In some embodiments, the sealing portion 50 may be positioned to overlap the thin film encapsulation layer 170 of the display substrate 10. In such embodiments, the sealing portion 50 may be positioned between the thin film encapsulation layer 170 and the color conversion substrate 30 in the non-display area NDA. In some embodiments, the sealing portion 50 may be in direct contact with the thin film encapsulation layer 170.

The filler 70 may be positioned in a space surrounded by the sealing portion 50 between the display substrate 10 and the color conversion substrate 30. The filler 70 may fill the space between the display substrate 10 and the color conversion substrate 30.

In some embodiments, the filler 70 may include or be made of a material that can transmit light. In some embodiments, the filler 70 may include or be made of an organic material. For example, the filler 70 may include or be made of a silicone-based organic material, an epoxy-based organic material, a mixture of a silicone-based organic material and an epoxy-based organic material, or the like.

In some embodiments, the filler 70 may include or be made of a material having an extinction coefficient of substantially zero. There is a correlation between a refractive index and an extinction coefficient, and as the refractive index decreases, the extinction coefficient also decreases. In addition, when the refractive index is 1.7 or less, the extinction coefficient may substantially converge to zero. In some embodiments, the filler 70 may include or be made of a material having a refractive index of 1.7 or less, and thus it is possible to prevent or minimize light provided from the self-light emitting element from being absorbed while passing through the filler 70. In some embodiments, the filler 70 may include or be made of an organic material having a refractive index in a range of 1.4 to 1.6.

Figure 3:
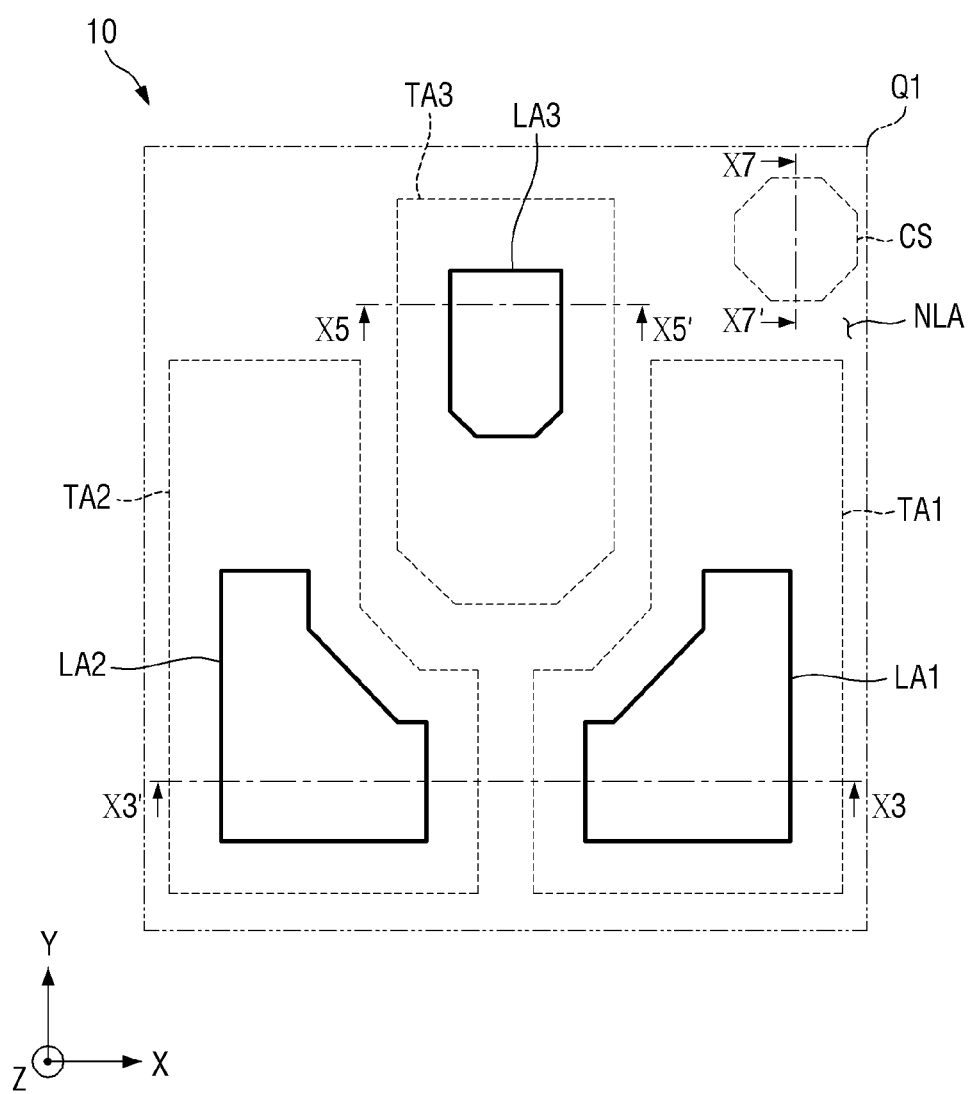
FIG. 3 is an enlarged plan view of portion Q1 of FIG. 1, and more specifically, is a schematic plan view of a display substrate included in the display device of FIG. 1.
Figure 4:
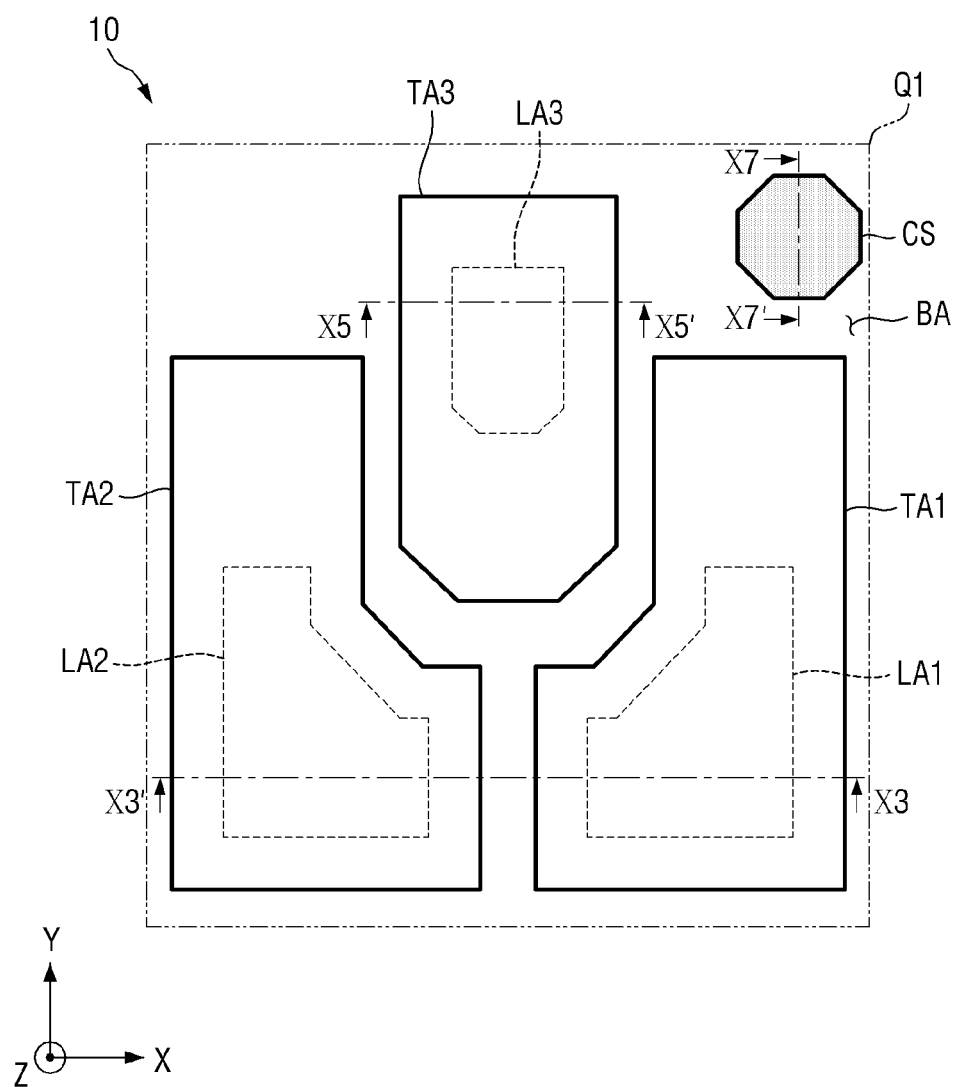
FIG. 4 is an enlarged plan view of portion Q1 of FIG. 1, and more specifically, is a schematic plan view of a color conversion substrate included in the display device of FIG. 1.

FIG. 3 is an enlarged plan view of portion Q1 of FIG. 1, and more specifically, is a schematic plan view of a display substrate included in the display device of FIG. 1. FIG. 4 is an enlarged plan view of portion Q1 of FIG. 1, and more specifically, is a schematic plan view of a color conversion substrate included in the display device of FIG. 1.

Referring further to FIGS. 3 and 4 in addition to FIGS. 1 and 2, a plurality of emission areas and a non-emission area NLA may be defined on the display substrate 10 in the display area DA. In some embodiments, a first emission area LA1, a second emission area LA2, and a third emission area LA3 may be defined in the display area DA of the display substrate 10. In the first emission area LA1, the second emission area LA2, and the third emission area LA3, light generated from the light emitting element of the display substrate 10 may be emitted to the outside of the display substrate 10, and in the non-emission area NLA, light may not be emitted to the outside of the display substrate 10.

In some embodiments, light provided to the color conversion substrate 30 from the first emission area LA1, the second emission area LA2, and the third emission area LA3 may be light of a third color. In some embodiments, the light of the third color may be blue light, and may have a peak wavelength in a range of about 440 nm to about 480 nm.

In some embodiments, the first emission area LA1, the second emission area LA2, and the third emission area LA3 may form or collectively define one group (hereinafter, "emission area group"), and a plurality of groups may be defined in the display area DA. The emission area group may be repeatedly disposed along the first direction X and the second direction Y.

In some embodiments, as shown in FIG. 3, each of the first emission area LA1 and the second emission area LA2 may include a region (hereinafter, "first extended region") extending along the first direction X and a region (hereinafter, "second extended region") extending along the second direction Y. In addition, the first extended region of the first emission area LA1 and the first extended region of the second emission area LA2 may be disposed to face each other. With reference to the drawing, the third emission area LA3 may be located to or positioned at one side of the first emission area LA1 and the second emission area LA2 in the second direction Y, and more specifically, to the upper left of the first emission area LA1 and the upper right of the second emission area LA2.

However, the present disclosure is not limited thereto, and the arrangement of the first emission area LA1, the second emission area LA2, and the third emission area LA3 may be variously changed.

In some embodiments, the size of at least one of the first emission area LA1, the second emission area LA2, or the third emission area LA3 may be different from the size of another one thereof. For example, the size of the third emission area LA3 may be smaller than that of the first emission area LA1 and that of the second emission area LA2. In addition, the size of the second emission area LA2 may be the same as or smaller than that of the first emission area LA1. In such an embodiment, the amount of light provided to each light transmitting area of the color conversion substrate 30 may be varied by varying the size of the emission area, and accordingly, the amount of light for each color converted in the color conversion substrate 30 or the amount of light for each color emitted to the outside of the display device 1 may be adjusted.

However, the present disclosure is not limited thereto, and in another embodiment, the size of the first emission area LA1, the size of the second emission area LA2, and the size of the third emission area LA3 may be substantially the same as each other. In addition, the magnitude relationship between the sizes of the emission areas may be variously modified.

In some embodiments, the non-display area NDA of the display substrate 10 may be located around the display area DA and may surround the display area DA.

In the display area DA, a plurality of light transmitting areas and a light blocking area BA may be defined in the color conversion substrate 30. In the light transmitting areas, light emitted from the display substrate 10 may pass through the color conversion substrate 30 to be provided to the outside of the display device 1. The light blocking area BA may be a region where light emitted from the display substrate 10 does not transmit.

In some embodiments, a first light transmitting area TA1, a second light transmitting area TA2, and a third light transmitting area TA3 may be defined in the color conversion substrate 30.

The first light transmitting area TA1 may correspond to or overlap the first emission area LA1. Similarly, the second light transmitting area TA2 may correspond to or overlap the second emission area LA2, and the third light transmitting area TA3 may correspond to or overlap the third emission area LA3.

In some embodiments, the size of the first light transmitting area TA1 may be larger than that of the first emission area LA1, and in a plan view, the edge of the first light transmitting area TA1 may completely surround the edge of the first emission area LAT. In addition, the size of the second light transmitting area TA2 may be larger than that of the second emission area LA2, and in a plan view, the edge of the second light transmitting area TA2 may completely surround the edge of the second emission area LA2. In addition, the size of the third light transmitting area TA3 may be larger than that of the third emission area LA3, and in a plan view, the edge of the third light transmitting area TA3 may completely surround the edge of the third emission area LA3.

In some embodiments, the size of the first light transmitting area TA1 may be substantially the same as that of the second light transmitting area TA2, and the size of the third light transmitting area TA3 may be smaller than that of the first light transmitting area TA1 and that of the second light transmitting area TA2.

In some embodiments, the light of the third color provided from the display substrate 10 may be provided to the outside of the display device 1 in a state where part thereof has been wavelength-converted and another part thereof has not been wavelength-converted through the first light transmitting area TA1, the second light transmitting area TA2, and the third light transmitting area TA3. When the light emitted from the first light transmitting area TA1 to the outside of the display device 1 is referred to as first exit light, the light emitted from the second light transmitting area TA2 to the outside of the display device 1 is referred to as second exit light and the light emitted from the third light transmitting area TA3 to the outside of the display device 1 is referred to as third exit light, the first exit light may be light of a first color, the second exit light may be light of a second color different from the first color, and the third exit light may be light of a third color. In some embodiments, the light of the third color may be blue light having a peak wavelength in a range of 440 nm to about 480 nm as described above, and the light of the first color may be red light having a peak wavelength in a range of about 610 nm to about 650 nm. In addition, the light of the second color may be green light having a peak wavelength in a range of about 510 nm to about 550 nm. The light of the first color and the light of the second color may be light into which the light of the third color has been wavelength-converted.

The light blocking area BA may be positioned around the first light transmitting area TA1, the second light transmitting area TA2, and the third light transmitting area TA3 of the color conversion substrate 30 in the display area DA. In some embodiments, the light blocking area BA may surround the first light transmitting area TA1, the second light transmitting area TA2, and the third light transmitting area TA3.

A column spacer CS may be positioned in the light blocking area BA of the color conversion substrate 30 in the display area DA. The column spacer CS may maintain a gap between the color conversion substrate 30 and the display substrate 10 to be substantially constant, thereby improving uniformity and spreadability of the filler 70.

In some embodiments, the column spacer CS may be positioned to one side of the first light transmitting area TA1 in the second direction Y and to one side of the third light transmitting area TA3 in the first direction X.

Hereinafter, the structure of the display device 1 will be described in more detail.

Figure 5:
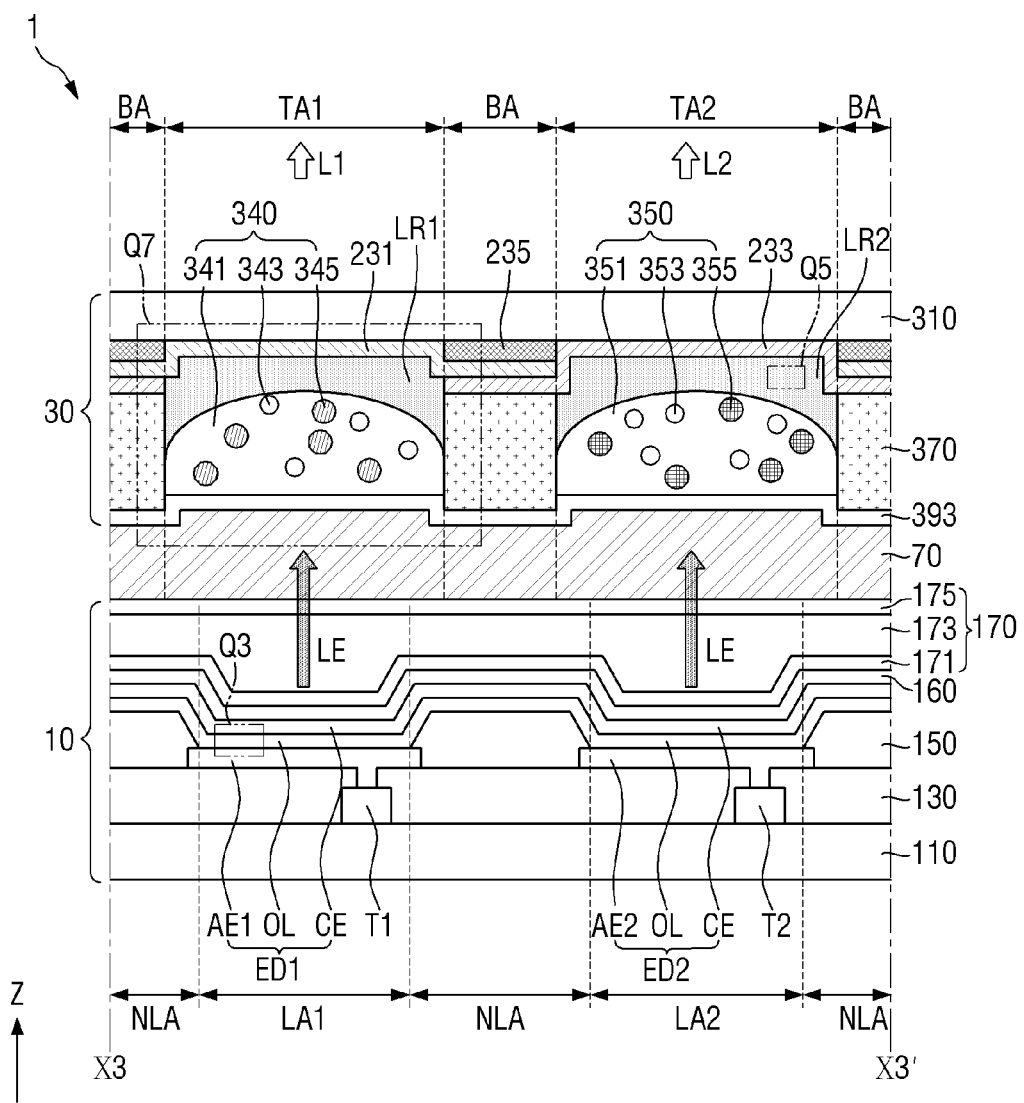
FIG. 5 is a cross-sectional view of a display device according to one embodiment, taken along line X3-X3' of FIGS. 3 and 4.
Figure 6:
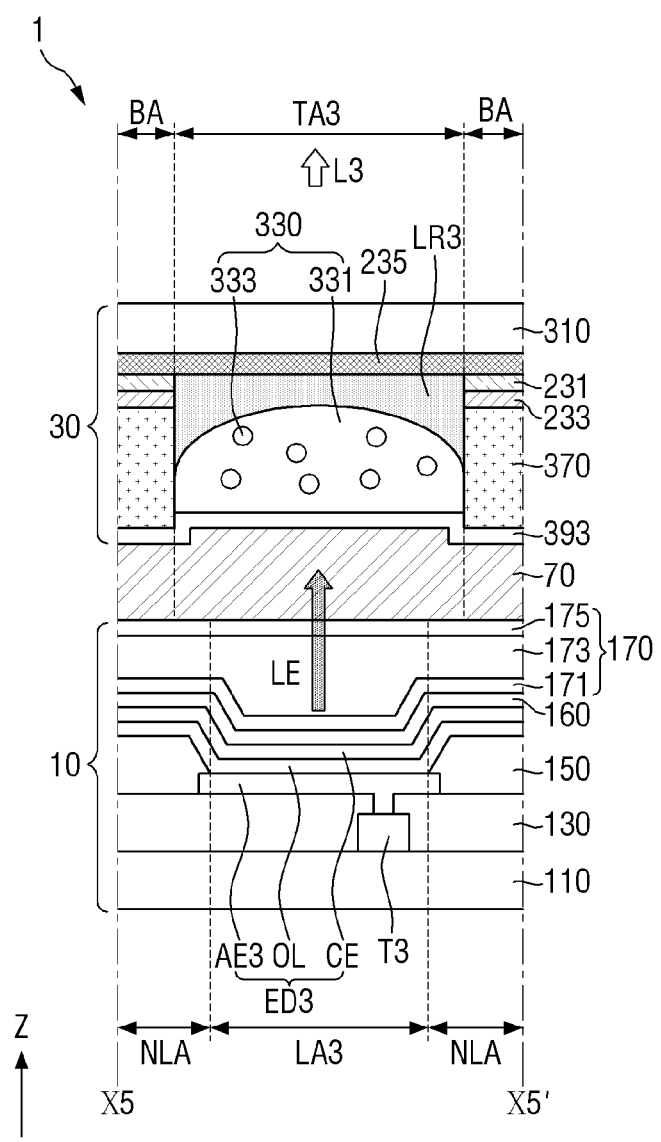
FIG. 6 is a cross-sectional view of a display device according to one embodiment, taken along line X5-X5' of FIGS. 3 and 4.
Figure 7:
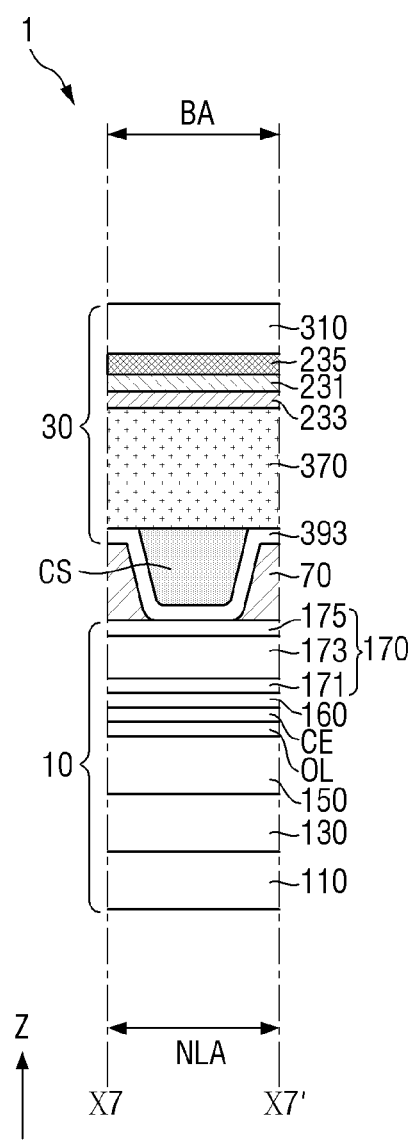
FIG. 7 is a cross-sectional view of a display device according to one embodiment, taken along line X7-X7' of FIGS. 3 and 4.
Figure 8:
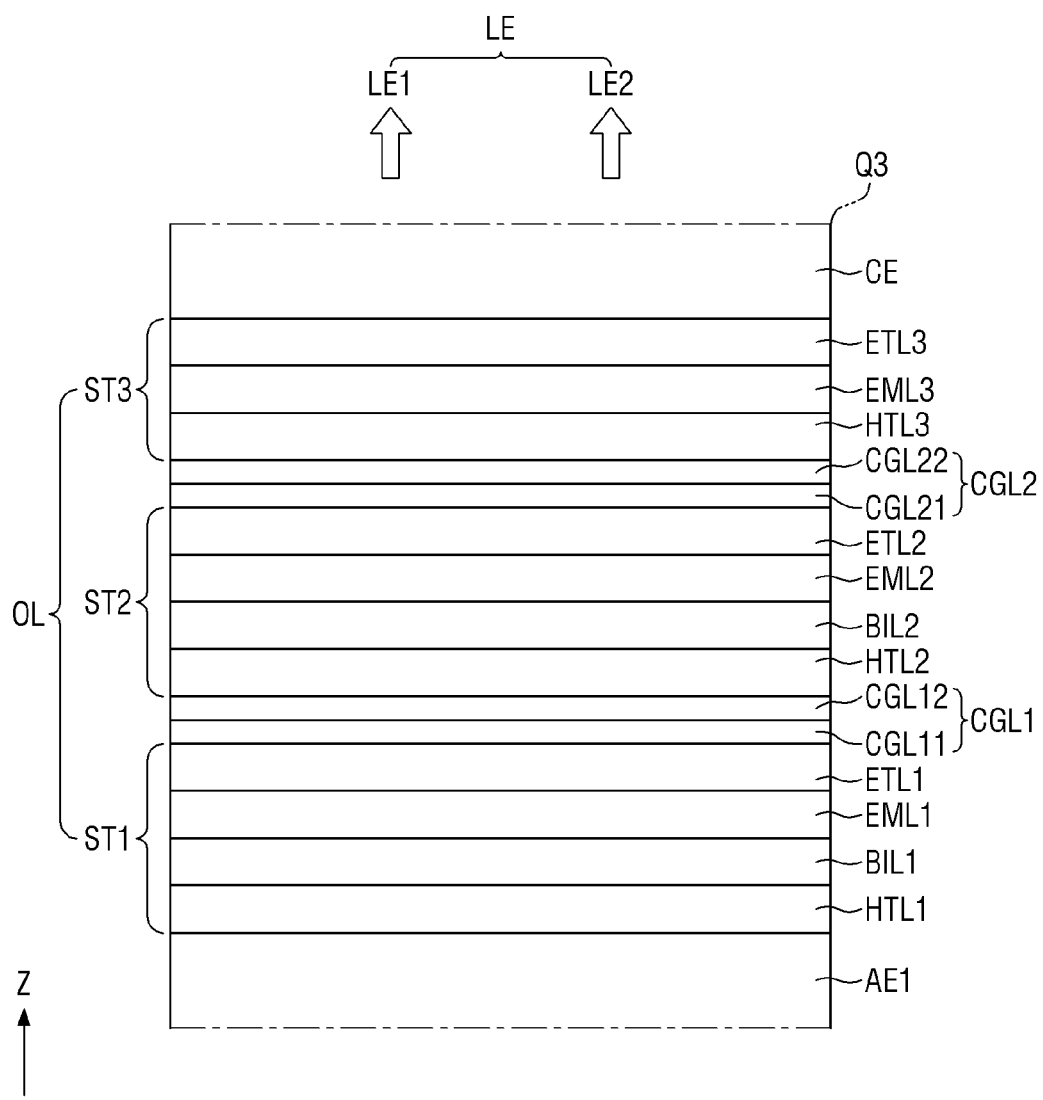
FIG. 8 is an enlarged view of portion Q3 of FIG. 5.
Figure 9:
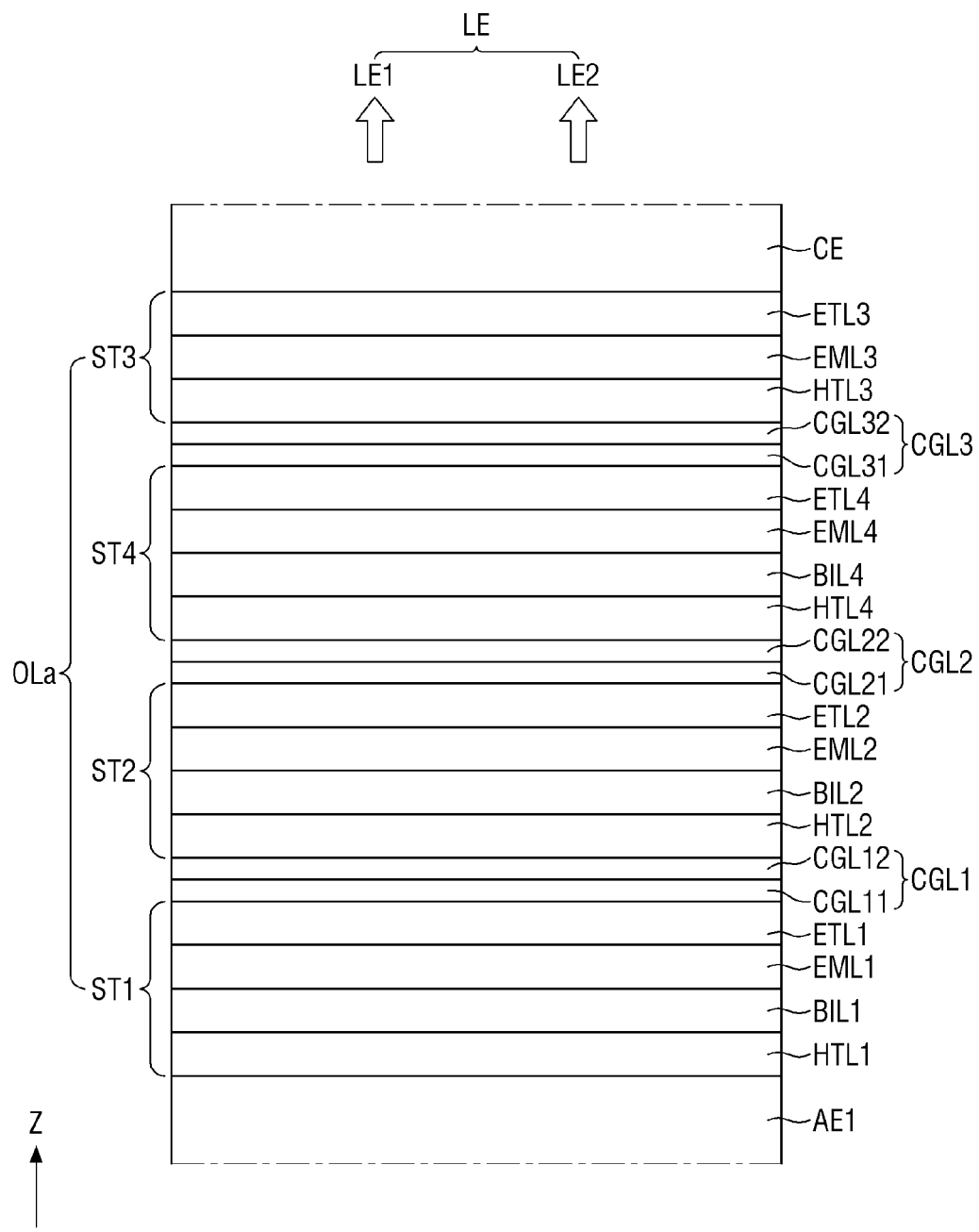
FIG. 9 is a view showing a modified example of the structure shown in FIG. 8.
Figure 10:
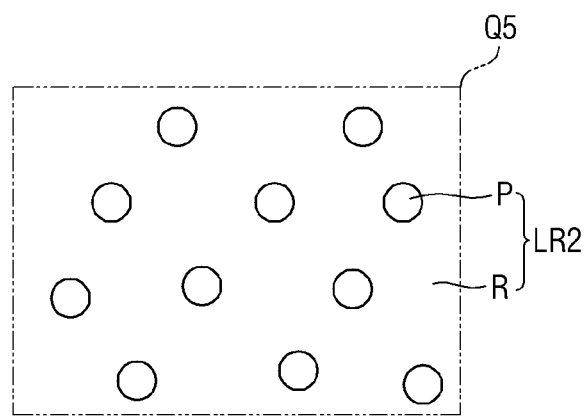
FIG. 10 is an enlarged view of portion Q5 of FIG. 5.
Figure 11:
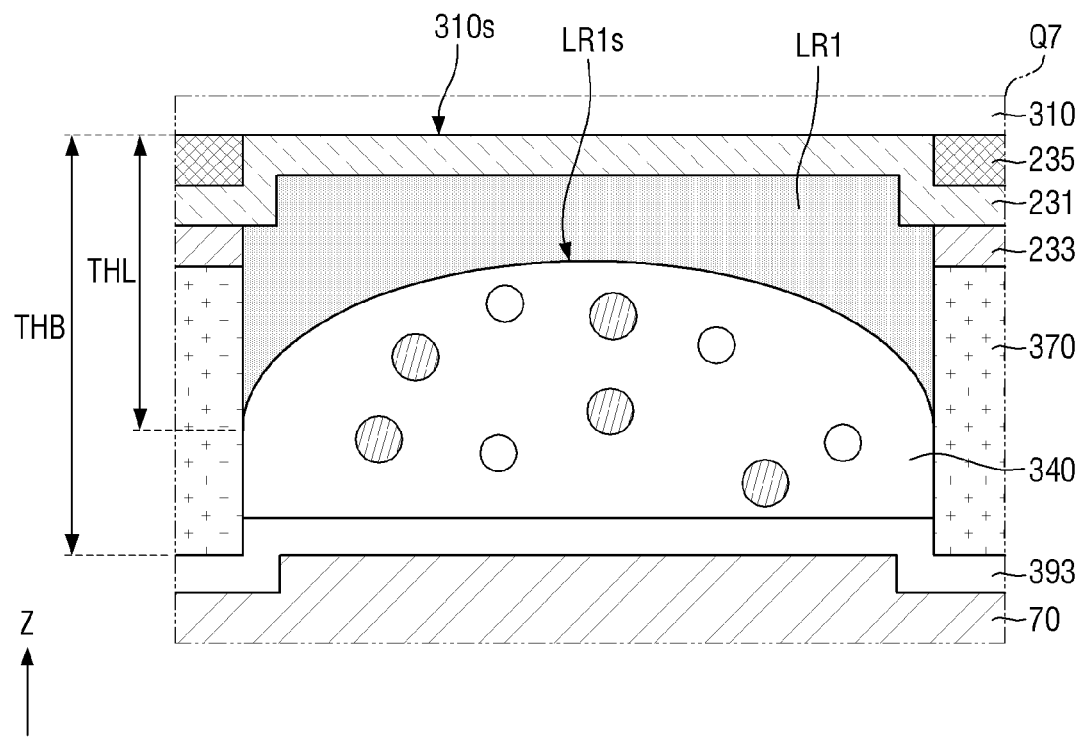
FIG. 11 is an enlarged view of portion Q7 of FIG. 5.

FIG. 5 is a cross-sectional view of a display device according to one embodiment, taken along line X3-X3' of FIGS. 3 and 4. FIG. 6 is a cross-sectional view of a display device according to one embodiment, taken along line X5-X5' of FIGS. 3 and 4. FIG. 7 is a cross-sectional view of a display device according to one embodiment, taken along line X7-X7' of FIGS. 3 and 4. FIG. 8 is an enlarged view of portion Q3 of FIG. 5. FIG. 9 is a view showing a modified example of the structure shown in FIG. 8. FIG. 10 is an enlarged view of portion Q5 of FIG. 5. FIG. 11 is an enlarged view of portion Q7 of FIG. 5.

Referring further to FIGS. 5 to 11 in addition to FIGS. 1 to 4, as described above, the display device 1 may include the display substrate 10 and the color conversion substrate 30, and may further include the filler 70 positioned between the display substrate 10 and the color conversion substrate 30.

Hereinafter, the display substrate 10 will be described.

The first base portion 110 may include or be made of a light transmissive material. In some embodiments, the first base portion 110 may be a glass substrate or a plastic substrate. In some embodiments, the first base portion 110 may have flexibility. In some embodiments, the first base portion 110 may further include a separate layer, e.g., a buffer layer or an insulating layer, disposed on the glass substrate or the plastic substrate.

In some embodiments, as described above, the plurality of emission areas LA1, LA2, and LA3 and the non-emission area NLA may be defined in the first base portion 110 or the display substrate 10.

As shown in FIGS. 5 and 6, switching elements T1, T2, and T3 may be positioned on the first base portion 110. In some embodiments, the first switching element T1 may overlap the first emission area LA1, the second switching element T2 may overlap the second emission area LA2, and the third switching element T3 may overlap the third emission area LA3. Although illustrated in the drawings is an embodiment where the first switching element T1, the second switching element T2, and the third switching element T3 do not overlap the non-emission area NLA, this is merely an example. In another embodiment, at least one of the first switching element T1, the second switching element T2, or the third switching element T3 may overlap the non-emission area NLA. Alternatively, in still another embodiment, all of the first switching element T1, the second switching element T2, and the third switching element T3 may overlap the non-emission area NLA.

Although not shown in the drawings, a plurality of signal lines (e.g., gate line, data line, power line, and the like) that transmit signals to the switching elements may be further positioned on the first base portion 110.

Each of the first switching element T1, the second switching element T2, and the third switching element T3 may be a thin film transistor.

An insulating layer 130 may be located on the first switching element T1, the second switching element T2 and the third switching element T3. In some embodiments, the insulating layer 130 may be a planarization layer. In some embodiments, the insulating layer 130 may include an organic material. For example, the insulating layer 130 may include acrylic resin, epoxy resin, imide resin, ester resin, or the like. In some embodiments, the insulating layer 130 may include a photosensitive organic material.

A first anode electrode AE1, a second anode electrode AE2, and a third anode electrode AE3 may be positioned on the insulating layer 130.

The first anode electrode AE1 may overlap the first emission area LA1 and may at least partially extend to the non-emission area NLA. The second anode electrode AE2 may overlap the second emission area LA2, and at least a portion thereof may extend to the non-emission area NLA. The third anode electrode AE3 may overlap the third emission area LA3, and at least a portion thereof may extend to the non-emission area NLA. The first anode electrode AE1 may be connected to the first switching element T1 through the insulating layer 130, and the second anode electrode AE2 may be connected to the second switching element T2 through the insulating layer 130. The third anode electrode AE3 may be connected to the third switching element T3 through the insulating layer 130.

In some embodiments, the first anode electrode AE1, the second anode electrode AE2, and the third anode electrode AE3 may be reflective electrodes. In an embodiment, the first anode electrode AE1, the second anode electrode AE2 and the third anode electrode AE3 may be a metal layer including at least one of Ag, Mg, Al, Pt, Pd, Au, Ni, Nd, Ir, or Cr. In another embodiment, the first anode electrode AE1, the second anode electrode AE2 and the third anode electrode AE3 may further include a metal oxide layer stacked on the metal layer. In an embodiment, the first anode electrode AE1, the second anode electrode AE2, and the third anode electrode AE3 may have a multilayer structure, e.g., a two-layer structure of ITO/Ag, Ag/ITO, ITO/Mg, or ITO/MgF, or a three-layer structure such as ITO/Ag/ITO.

A pixel defining layer 150 may be positioned on the first anode electrode AE1, the second anode electrode AE2 and the third anode electrode AE3. In an embodiment, an opening exposing the first anode electrode AE1, an opening exposing the second anode electrode AE2, and an opening exposing the third anode electrode AE3 may be defined through the pixel defining layer 150, and may define the first emission area LA1, the second emission area LA2, the third emission area LA3, and the non-emission area NLA. That is, a region of the first anode electrode AE1 which is exposed without being covered by the pixel defining layer 150 may be the first emission area LA1. Similarly, a region of the second anode electrode AE2 which is exposed without being covered by the pixel defining layer 150 may be the second emission area LA2, and a region of the third anode electrode AE3 which is exposed without being covered by the pixel defining layer 150 may be the third emission area LA3. Further, a region where the pixel defining layer 150 is located may be the non-emission area NLA.

In some embodiments, the pixel defining layer 150 may include an organic insulating material selected from acrylic resin, epoxy resin, phenolic resin, polyamide resin, polyimide resin, unsaturated polyester resin, polyphenylene resin, polyphenylenesulfide resin and benzocyclobutene (BCB).

In some embodiments, the pixel defining layer 150 may overlap a first color filter 231, a second color filter 233, and a third color filter 235, which will be described later. In addition, in some embodiments, the pixel defining layer 150 may also overlap a bank pattern 370 to be described later.

As shown in FIGS. 5 to 7, a light emitting layer OL may be positioned on the first anode electrode AE1, the second anode electrode AE2, the third anode electrode AE3, and the pixel defining layer 150.

In some embodiments, the light emitting layer OL may have a shape of a continuous film formed over the plurality of emission areas LA1, LA2, and LA3 and the non-emission area NLA. A more detailed description of the light emitting layer OL will be given later.

As shown in FIGS. 5 to 7, a cathode electrode CE may be positioned on the light emitting layer OL.

In some embodiments, the cathode electrode CE may have a semi-transmissive or transmissive property. In an embodiment where the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. In an embodiment where the cathode electrode CE has a thickness of tens to hundreds of angstroms, the cathode electrode CE may have a semi-transmissive property.

In an embodiment where the cathode electrode CE has a transmissive property, the cathode electrode CE may include a transparent conductive oxide (TCO). For example, the cathode electrode CE may include tungsten oxide (WxOy), titanium oxide ($TiO_2$), indium tin oxide (ITO), indium zinc oxide (IZO), zinc oxide (ZnO), indium tin zinc oxide (ITZO), magnesium oxide (MgO) or the like.

The first anode electrode AE1, the light emitting layer OL and the cathode electrode CE may constitute (or collectively define) a first light emitting element ED1. The second anode electrode AE2, the light emitting layer OL and the cathode electrode CE may constitute a second light emitting element ED2. The third anode electrode AE3, the light emitting layer OL and the cathode electrode CE may constitute a third light emitting element ED3. Each of the first light emitting element ED1, the second light emitting element ED2, and the third light emitting element ED3 may emit emission light LE, and the emission light LE may be provided to the color conversion substrate 30.

As shown in FIG. 8, the emission light LE finally emitted from the light emitting layer OL may be mixed light in which a first component LET and a second component LE2 are mixed. The first component LET and the second component LE2 of the emission light LE may each have a peak wavelength of 440 nm or more and less than 480 nm. The peak wavelengths of the first component LET and the second component LE2 may be selected to be the same as or to be different from each other. That is, the emission light LE may be blue light.

As shown in FIG. 8, in some embodiments, the light emitting layer OL may have a structure, e.g., a tandem structure, in which a plurality of light emitting layers are disposed to overlap each other. For example, the light emitting layer OL may include a first stack ST1 including a first light emitting layer EML1, a second stack ST2 positioned on the first stack ST1 and including a second light emitting layer EML2, a third stack ST3 positioned on the second stack ST2 and including a third light emitting layer EML3, a first charge generation layer CGL1 positioned between the first stack ST1 and the second stack ST2, and a second charge generation layer CGL2 positioned between the second stack ST2 and the third stack ST3. The first stack ST1, the second stack ST2, and the third stack ST3 may be disposed to overlap each other.

The first light emitting layer EML1, the second light emitting layer EML2, and the third light emitting layer EML3 may be disposed to overlap each other.

In some embodiments, all of the first light emitting layer EML1, the second light emitting layer EML2, and the third light emitting layer EML3 may emit light of the blue wavelength. For example, each of the first light emitting layer EML1, the second light emitting layer EML2, and the third light emitting layer EML3 may be a blue light emitting layer and may include an organic material. However, the present disclosure is not limited thereto, and in another embodiment, at least one of the first light emitting layer EML1, the second light emitting layer EML2, or the third light emitting layer EML3 may include an inorganic material that emits blue light. For example, at least one of the first light emitting layer EML1, the second light emitting layer EML2, or the third light emitting layer EML3 may be formed of an inorganic light emitting element or may be a part of an inorganic light emitting element. In some other embodiments, the inorganic light emitting element may have a width of a nano size.

In some embodiments, at least one of the first light emitting layer EML1, the second light emitting layer EML2, or the third light emitting layer EML3 may emit first blue light having a first peak wavelength, and at least another one thereof may emit second blue light having a second peak wavelength different from the first peak wavelength. For example, any one of the first light emitting layer EML1, the second light emitting layer EML2, and the third light emitting layer EML3 may emit the first blue light having the first peak wavelength, and the other two thereof may emit the second blue light having the second peak wavelength. That is, the emission light LE finally emitted from the light emitting layer OL may be mixed light in which the first component LE1 and the second component LE2 are mixed, the first component LE1 may be the first blue light having the first peak wavelength, and the second component LE2 may be the second blue light having the second peak wavelength.

In some embodiments, one of the first peak wavelength and the second peak wavelength may be in a range of 440 nm or more and less than 460 nm, and the other one thereof may be in a range of 460 nm or more and 480 nm or less. However, the range of the first peak wavelength and the range of the second peak wavelength are not limited thereto. For example, the range of the first peak wavelength and the range of the second peak wavelength may both include 460 nm. In some embodiments, one of the first blue light and the second blue light may be deep blue color, and the other one thereof may be sky blue color.

According to some embodiments, the emission light LE emitted from the light emitting layer OL may be blue light and may include a long wavelength component and a short wavelength component. Therefore, ultimately, the light emitting layer OL may emit blue light having an emission peak in a broader wavelength range, as the emission light LE. Accordingly, color visibility can be improved at a side viewing angle compared to a conventional light emitting element that emits blue light having a sharp emission peak.

In some embodiments, each of the first light emitting layer EML1, the second light emitting layer EML2, and the third light emitting layer EML3 may include a host and a dopant. A material of the host is not particularly limited as long as it is generally used. For example, tris(8-hydroxyquinolinato) aluminium (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), or the like may be used as the material of the host.

The first light emitting layer EML1, the second light emitting layer EML2, and the third light emitting layer EML3 that emit blue light may each include a fluorescent material containing at least one selected from, e.g., spiro-DPVBi, spiro-6P, distyryl-benzene (DSB), distyryl-arylene (DSA), polyfluorene (PFO)-based polymer, and poly(p-phenylene vinylene) (PPV)-based polymer. In an embodiment, for example, a phosphorescent material containing an organometallic complex such as (4,6-F2ppy)2Irpic may be included in the first light emitting layer EML1, the second light emitting layer EML2, and the third light emitting layer EML3. However, the material that emits blue light is not limited thereto.

As described above, at least one of the first light emitting layer EML1, the second light emitting layer EML2, or the third light emitting layer EML3 emits blue light in a wavelength band different from that of at least another one thereof. In order to emit blue light in different wavelength bands, the first light emitting layer EML1, the second light emitting layer EML2, and the third light emitting layer EML3 may include the same material as each other, and a method of adjusting a resonance distance may be used. Alternatively, in order to emit blue light in different wavelength ranges, at least one of the first light emitting layer EML1, the second light emitting layer EML2, and the third light emitting layer EML3, and at least another one of the first light emitting layer EML1, the second light emitting layer EML2, and the third light emitting layer EML3 may include different materials from each other.

However, the present disclosure is not limited thereto. All of the first light emitting layer EML1, the second light emitting layer EML2, and the third light emitting layer EML3 may emit blue light having a peak wavelength of 440 nm to 480 nm, and may include or be made of the same material as each other.

Alternatively, in still another embodiment, at least one of the first light emitting layer EML1, the second light emitting layer EML2, or the third light emitting layer EML3 may emit first blue light having a first peak wavelength, another one thereof may emit second blue light having a second peak wavelength different from the first peak wavelength, and the remaining one thereof may emit third blue light having a third peak wavelength different from the first peak wavelength and the second peak wavelength. In some other embodiments, any one of the first peak wavelength, the second peak wavelength, and the third peak wavelength may be in a range of 440 nm or more and less than 460 nm. Another one of the first peak wavelength, the second peak wavelength, and the third peak wavelength may be in a range of 460 nm or more and less than 470 nm, and the remaining one thereof may be in a range of 470 nm or more and 480 nm or less.

According to still some other embodiments, the emission light LE emitted from the light emitting layer OL is blue light and includes a long wavelength component, an intermediate wavelength component, and a short wavelength component. Therefore, ultimately, the light emitting layer OL may emit blue light having an emission peak in a broader wavelength range as the emission light LE, thereby improving the color visibility at a side viewing angle.

According to the above-described embodiments, compared to a conventional light emitting element that does not employ a tandem structure, i.e., a structure in which a plurality of light emitting layers are stacked, the light efficiency is increased, and the lifespan of the display device can be improved.

Alternatively, in still some other embodiments, at least one of the first light emitting layer EML1, the second light emitting layer EML2, or the third light emitting layer EML3 may emit light of the third color, e.g., blue light, and at least another one thereof may emit light of the second color, e.g., green light. In still some other embodiments, the peak wavelength of the blue light emitted from at least one of the first light emitting layer EML1, the second light emitting layer EML2, or the third light emitting layer EML3 may be in a range of 440 nm or more and 480 nm or less, or in a range of 460 nm or more and 480 nm or less. The green light emitted from at least another one of the first light emitting layer EML1, the second light emitting layer EML2, or the third light emitting layer EML3 may have a peak wavelength in a range of 510 nm to 550 nm.

For example, any one of the first light emitting layer EML1, the second light emitting layer EML2, and the third light emitting layer EML3 may be a green light emitting layer that emits green light, and the other two thereof may be blue light emitting layers that emit blue light. In an embodiment where the other two of the first light emitting layer EML1, the second light emitting layer EML2, and the third light emitting layer EML3 are the blue light emitting layers, the blue light emitted from the two blue light emitting layers may have a same peak wavelength range as each other, or may have different peak wavelength ranges from each other.

According to still some other embodiments, the emission light LE emitted from the light emitting layer OL may be mixed light in which the first component LET that is blue light and the second component LE2 that is green light are mixed. For example, in an embodiment where the first component LET is dark blue light and the second component LE2 is green light, the emission light LE may have a sky blue color. Similarly to the above-described embodiments, the emission light LE emitted from the light emitting layer OL is mixed light of blue light and green light, and includes along wavelength component and a short wavelength component. Therefore, ultimately, the light emitting layer OL may emit blue light having an emission peak in a broader wavelength range as the emission light LE, thereby improving the color visibility at a side viewing angle. In such an embodiment, since the second component LE2 of the emission light LE is green light, the green light component of the light provided from the display device 1 to the outside may be supplemented, thereby improving the color reproducibility of the display device 1.

In still some other embodiments, a green light emitting layer among the first light emitting layer EML1, the second light emitting layer EML2, and the third light emitting layer EML3 may include a host and a dopant. A material of the host including the green light emitting layer is not particularly limited as long as it is generally used. For example, tris(8-hydroxyquinolinato)aluminium (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4', 4"-Tris(carbazol-9-yl)-triphenylamine (TCTA), 1,3,5-tris (N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), or the like may be used as the material of the host.

The dopant included in the green light emitting layer may include a fluorescent material containing, for example, tris (8-hydroxyquinolinato)aluminium(III) (Alq3), or a phosphorescent material such as fac tris(2-phenylpyridine) iridium (Ir(ppy)3), bis(2-phenylpyridine)(acetylacetonate) iridium(III) (Ir(ppy)2(acac)), or 2-phenyl-4-methyl-pyridine iridium (Ir(mpyp)3).

The first charge generation layer CGL1 may be positioned between the first stack ST1 and the second stack ST2. The first charge generation layer CGL1 may serve to allow electric charge to be injected into each light emitting layer. The first charge generation layer CGL1 may serve to control charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11, and between the n-type charge generation layer CGL11 and the second stack ST2.

The first charge generation layer CGL1 may have a structure in which the n-type charge generation layer CGL11 and the p-type charge generation layer CGL12 are in contact with each other. The n-type charge generation layer CGL11 is disposed closer to the anode electrodes AE1, AE2 (FIG. 7) and AE3 (FIG. 7) than the cathode electrode CE. The p-type charge generation layer CGL12 is disposed closer to the cathode electrode CE than the anode electrodes AE1, AE2 (FIG. 7) and AE3 (FIG. 7). The n-type charge generation layer CGL11 supplies electrons to the first light emitting layer EML1 adjacent to the anode electrodes AE1, AE2 (FIG. 7) and AE3 (FIG. 7) and the p-type charge generation layer CGL12 supplies holes to the second light emitting layer EML2 included in the second stack ST2. The first charge generation layer CGL1 is disposed between the first stack ST1 and the second stack ST2 to provide electric charge to each light emitting layer, thereby increasing light emission efficiency, and decreasing a driving voltage.

The first stack ST1 may be positioned on the first anode electrode AE1 (FIG. 8), the second anode electrode AE2 (FIG. 7), and the third anode electrode AE3 (FIG. 7) and may further include a first hole transport layer HTL1, a first electron block layer BILL, and a first electron transport layer ETL1.

The first hole transport layer HTL1 may be positioned on the first anode electrode AE1, the second anode electrode AE2 (FIG. 7), and the third anode electrode AE3 (FIG. 7). The first hole transport layer HTL1 serves to facilitate the transport of holes and may include a hole transport material. The hole transport material may include a carbazole-based derivative such as N-phenylcarbazole or polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N,N'- diphenylbenzidine (NPB), 4,4'-Cyclohexylidenebis[N,N-bis(4-methylphenyl)benzenamine] (TAPC), or the like, but is not limited thereto.

The first electron block layer BIL1 may be positioned on the first hole transport layer HTL1, and between the first hole transport layer HTL1 and the first light emitting layer EML1. The first electron block layer BIL1 may include a hole transport material and a metal or metal compound to prevent electrons generated in the first light emitting layer EML1 from moving into the first hole transport layer HTL1. In some embodiments, the first hole transport layer HTL1 and the first electron block layer BIL1 described above may also be formed of a single layer in which respective materials are mixed.

The first electron transport layer ETL1 may be positioned on the first light emitting layer EML1, and between the first charge generation layer CGL1 and the first light emitting layer EML1. In some embodiments, the first electron transport layer ETL1 may include an electron transport material such as Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl)anthracene (ADN), or a mixture thereof. However, the present disclosure is not limited to the above types of the electron transport material. The second stack ST2 may be positioned on the first charge generation layer CGL1, and further include a second hole transport layer HTL2, a second electron block layer BIL2, and a second electron transport layer ETL1.

The second hole transport layer HTL2 may be positioned on the first charge generation layer CGL1. The second hole transport layer HTL2 may include or be made of the same material as the first hole transport layer HTL1, or may include at least one material selected from the materials described above with respect to the first hole transport layer HTL1. The second hole transport layer HTL2 may be formed of a single layer or a plurality of layers.

The second electron block layer BIL2 may be positioned on the second hole transport layer HTL2, and between the second hole transport layer HTL2 and the second light emitting layer EML2. The second electron block layer BIL2 may be formed of the same material and the same structure as the first electron block layer BIL1, or may include at least one material selected from the materials described above with respect to the first electron block layer BIL1.

The second electron transport layer ETL2 may be positioned on the second light emitting layer EML2, and between the second charge generation layer CGL2 and the second light emitting layer EML2. The second electron transport layer ETL2 may be formed of the same material and the same structure as the first electron transport layer ETL1, or may include at least one material selected from the materials described above with respect to the first electron transport layer ETL1. The second electron transport layer ETL2 may be formed of a single layer or a plurality of layers.

The second charge generation layer CGL2 may be positioned on the second stack ST2 and between the second stack ST2 and the third stack ST3.

The second charge generation layer CGL2 may have the same structure as the first charge generation layer CGL1 described above. For example, the second charge generation layer CGL2 may include an n-type charge generation layer CGL21 disposed closer to the second stack ST2 and a p-type charge generation layer CGL22 disposed closer to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may include or be made of different materials from each other, or may be made of the same material as each other.

The third stack ST3 may be positioned on the second charge generation layer CGL2, and may further include a third hole transport layer HTL3 and a third electron transport layer ETL3.

The third hole transport layer HTL3 may be positioned on the second charge generation layer CGL2. The third hole transport layer HTL3 may include or be made of the same material as the first hole transport layer HTL1, or may include oat least one material selected from the materials described above with respect to the first hole transport layer HTL1. The third hole transport layer HTL3 may be formed of a single layer or a plurality of layers. In an embodiment where the third hole transport layer HTL3 is formed of a plurality of layers, each layer may include a different material.

The third electron transport layer ETL3 may be positioned on the third light emitting layer EML3, and between the cathode electrode CE and the third light emitting layer EML3. The third electron transport layer ETL3 may include or be formed of the same material and the same structure as the first electron transport layer ETL1, or may include at least one material selected from the materials described above with respect to the first electron transport layer ETL1. The third electron transport layer ETL3 may be formed of a single layer or a plurality of layers. In an embodiment where the third electron transport layer ETL3 is formed of a plurality of layers, each layer may include a different material.

Although not shown in the drawings, a hole injection layer may be further positioned at least one of between the first stack ST1 and the first anode electrode AE1 between the second anode electrode AE2 (FIG. 7) and the third anode electrode AE3 (FIG. 7) between the second stack ST2 and the first charge generation layer CGL1, or between the third stack ST3 and the second charge generation layer CGL2. The hole injection layer may serve to allow holes to be more smoothly injected into the first light emitting layer EML1, the second light emitting layer EML2, and the third light emitting layer EML3. In some embodiments, the hole injection layer may include or be formed of at least one selected from cupper phthalocyanine (CuPc), poly(3,4)-ethylenedioxythiophene (PEDOT), polyaniline (PANI), and N,N-di-naphthyl-N,N'-diphenyl benzidine (NPD), but is not limited thereto. In some embodiments, the hole injection layer may be positioned between the first stack ST1 and the first anode electrode AE1, between the second anode electrode AE2 (FIG. 7) and the third anode electrode AE3 (FIG. 7), between the second stack ST2 and the first charge generation layer CGL1, and between the third stack ST3 and the second charge generation layer CGL2.

Although not shown in the drawings, an electron injection layer may be further positioned at least one of between the third electron transport layer ETL3 and the cathode electrode CE, between the second charge generation layer CGL2 and the second stack ST2, or between the first charge generation layer CGL1 and the first stack ST1. The electron injection layer may serve to facilitate electron injection, and may include tris(8-hydroxyquinolino)aluminum (Alq3), PBD, TAZ, spiro-PBD, BAlq, or SAlq, but is not limited thereto. In addition, the electron injection layer may be a metal halide compound, for example, may include at least one selected from $MgF_2$, LiF, NaF, KF, RbF, CsF, FrF, LiI, NaI, KI, RbI, CsI, FrI, and $CaF_2$, but is not limited thereto. In addition, the electron injection layer may include a lanthanum-based material such as Yb, Sm, or Eu. Alternatively, the electron injection layer may include both a metal halide material and a lanthanum-based material, such as RbI:Yb or KI:Yb. In an embodiment where the electron injection layer includes both a metal halide material and a lanthanum-based material, the electron injection layer may be formed by co-depositing the metal halide material and the lanthanum-based material. In some embodiments, the electron injection layer may be positioned between the third electron transport layer ETL3 and the cathode electrode CE, between the second charge generation layer CGL2 and the second stack ST2, and between the first charge generation layer CGL1 and the first stack ST1.

In addition to the above-described structure, the structure of the light emitting layer OL may be modified. For example, the light emitting layer OL may be modified into a light emitting layer OLa as shown in FIG. 9. In an embodiment, as shown in FIG. 9, the light emitting layer OLa may further include a fourth stack ST4 positioned between the third stack ST3 and the second stack ST2, and a third charge generation layer CGL3 positioned between the third stack ST3 and the fourth stack ST2.

The fourth stack ST4 may include a fourth light emitting layer EML4, and may further include a fourth hole transport layer HTL4, a third electron block layer BIL4, and a fourth electron transport layer ETL4.

At least one of the first light emitting layer EML1, the second light emitting layer EML2, the third light emitting layer EML3, or the fourth light emitting layer EML4 may emit green light and at least one of the first light emitting layer EML1, the second light emitting layer EML2, the third light emitting layer EML3, or the fourth light emitting layer EML4, and at least another one thereof may emit blue light having different peak wavelength ranges.

Alternatively, at least one of the first light emitting layer EML1, the second light emitting layer EML2, the third light emitting layer EML3, or the fourth light emitting layer EML4 may emit green light, and at least another one thereof may emit blue light. For example, any one of the first light emitting layer EML1, the second light emitting layer EML2, the third light emitting layer EML3, and the fourth light emitting layer EML4 may be a green light emitting layer, and the other three thereof may all be blue light emitting layers.

The fourth hole transport layer HTL4 may be positioned on the second charge generation layer CGL2. The fourth hole transport layer HTL4 may be made of the same material as the first hole transport layer HTL1, or may include one or more materials selected from examples of materials included in the first hole transport layer HTL1. The fourth hole transport layer HTL4 may be formed of a single layer or a plurality of layers. In an embodiment where the fourth hole transport layer HTL4 is formed of a plurality of layers, each layer may include a different material.

The third electron block layer BIL4 may be positioned on the fourth hole transport layer HTL4, and may be positioned between the fourth hole transport layer HTL4 and the fourth light emitting layer EML4. The third electron block layer BIL4 may include or be formed of the same material and the same structure as the first electron block layer BIL1, or may include at least one material selected from the materials described above with respect to the first electron block layer BIL1. In some other embodiments, the third electron block layer BIL4 may be omitted.

The fourth electron transport layer ETL4 may be positioned on the fourth light emitting layer EML4, and may be positioned between the third charge generation layer CGL3 and the fourth light emitting layer EML4. The fourth electron transport layer ETL4 may include or be formed of the same material and the same structure as the first electron transport layer ETL1, or may include at least one selected from the materials described above with respect to the first electron transport layer ETL1. The fourth electron transport layer ETL4 may be formed of a single layer or a plurality of layers. In an embodiment where the fourth electron transport layer ETL4 is formed of a plurality of layers, each layer may include a different material.

The third charge generation layer CGL3 may have the same structure as the first charge generation layer CGL1 described above. For example, the third charge generation layer CGL3 may include an n-type charge generation layer CGL31 disposed closer to the fourth stack ST4 and a p-type charge generation layer CGL32 disposed closer to the cathode electrode CE. The p-type charge generation layer CGL32 may be disposed on the n-type charge generation layer CGL31.

Although not shown in the drawings, the electron injection layer may be further positioned between the fourth stack ST4 and the third charge generation layer CGL3. In addition, the hole injection layer may be further positioned between the fourth stack ST4 and the second charge generation layer CGL2.

In some embodiments, the light emitting layer OL (shown in FIG. 8) or OLa (shown in FIG. 9) may not include a red light emitting layer in common, and thus may not emit light of the first color, e.g., red light. That is, the emission light LE may not include a light component having a peak wavelength of 610 nm to about 650 nm.

As shown in FIGS. 5 to 7, a first capping layer 160 may be positioned on the cathode electrode CE. The first capping layer 160 may be disposed in common in the first emission area LA1, the second emission area LA2, the third emission area LA3, and the non-emission area NLA, and may improve viewing angle characteristics and increase external luminous efficiency.

The first capping layer 160 may include at least one of an inorganic material or an organic material having light transmittance. That is, the first capping layer 160 may be formed of an inorganic layer, an organic layer, or an organic layer including inorganic particles. For example, the first capping layer 160 may include a triamine derivative, a carbazole biphenyl derivative, an arylenediamine derivative, tris(8-hydroxyquinolino)aluminum (Alq3), or the like.

In addition, the first capping layer 160 may include or be formed of a mixture of a high refractive material and a low refractive material. Alternatively, the first capping layer 160 may include two layers having different refractive indices from each other, e.g., a high refractive layer and a low refractive layer.

As shown in FIGS. 5 to 7, the thin film encapsulation layer 170 may be disposed on the first capping layer 160. The thin film encapsulation layer 170 is disposed in common to the first emission area LA1, the second emission area LA2, the third emission area LA3 and the non-emission area NLA. In some embodiments, the thin film encapsulation layer 170 may directly cover the first capping layer 160.

In some embodiments, the thin film encapsulation layer 170 may include a lower inorganic layer 171, an organic layer 173, and an upper inorganic layer 175 sequentially stacked on the first capping layer 160.

The lower inorganic layer 171 may cover the first light emitting element ED1, the second light emitting element ED2, and the third light emitting element ED3 in the display area DA.

The lower inorganic layer 171 may include an inorganic material and may have a multilayer structure.

The organic layer 173 may be positioned on the lower inorganic layer 171. The organic layer 173 may cover the first light emitting element EDT, the second light emitting element ED2, and the third light emitting element ED3 in the display area DA.

In some embodiments, the organic layer 173 may include or be formed of acrylic resin, methacrylic resin, polyisoprene, vinyl resin, epoxy resin, urethane resin, cellulose resin, perylene resin or the like.

The upper inorganic layer 175 may be positioned on the organic layer 173. The upper inorganic layer 175 may cover the organic layer 173. Although not shown in the drawings, in some embodiments, the upper inorganic layer 175 may be in direct contact with the lower inorganic layer 171 in the non-display area to form an inorganic-inorganic junction.

In some embodiments, each of the lower inorganic layer 171 and the upper inorganic layer 175 may include or be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

In some embodiments, each of the lower inorganic layer 171 and the upper inorganic layer 175 may be formed into a single layer, but is not limited thereto. At least one of the lower inorganic layer 171 or the upper inorganic layer 175 may have a structure, e.g., a multilayer structure, in which a plurality of inorganic layers are stacked one on another.

In addition to the above-described structure, the structure of the thin film encapsulation layer 170 may be variously modified.

Hereinafter, the color conversion substrate 30 will be described with further reference to FIGS. 12 to 17 in addition to FIGS. 5 to 7.

Figure 12:
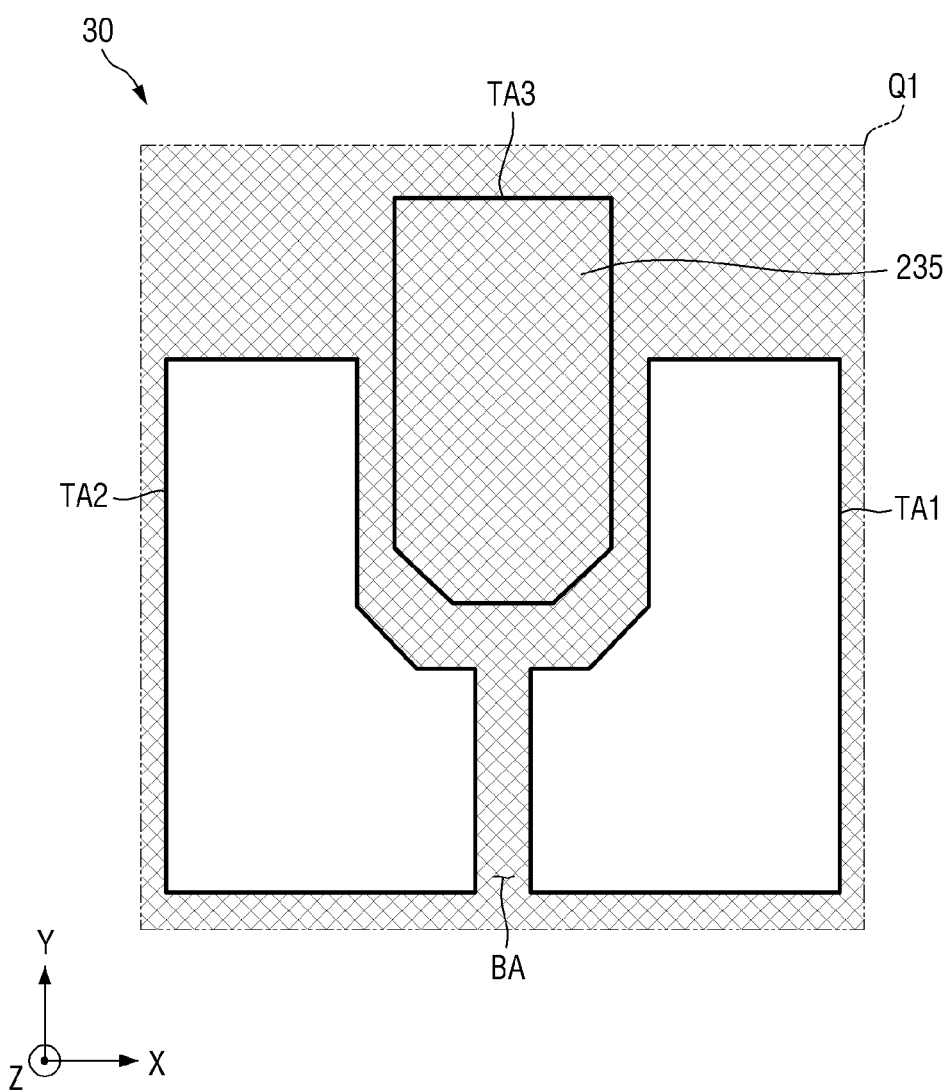
FIG. 12 is a plan view illustrating a schematic arrangement of a third color filter in a color conversion substrate of a display device according to one embodiment.
Figure 13:
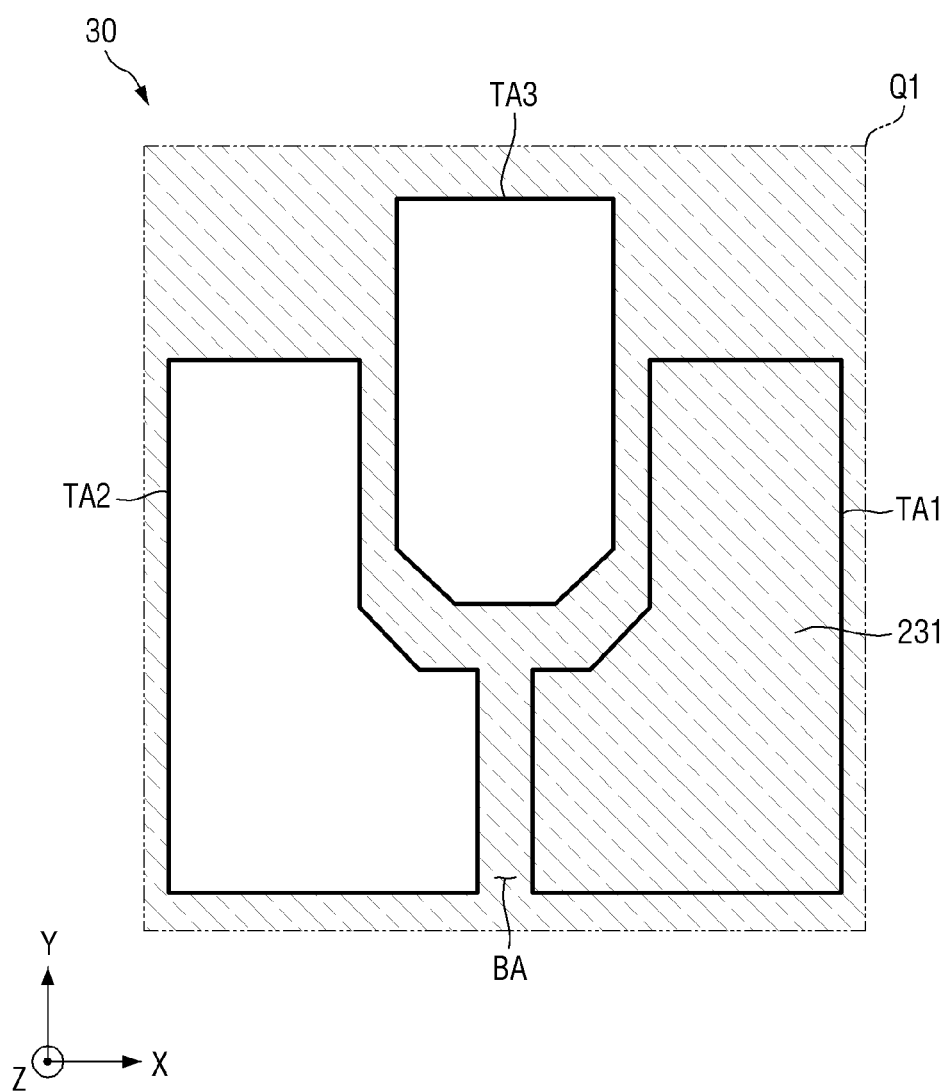
FIG. 13 is a plan view illustrating a schematic arrangement of a first color filter in a color conversion substrate of a display device according to one embodiment.
Figure 14:
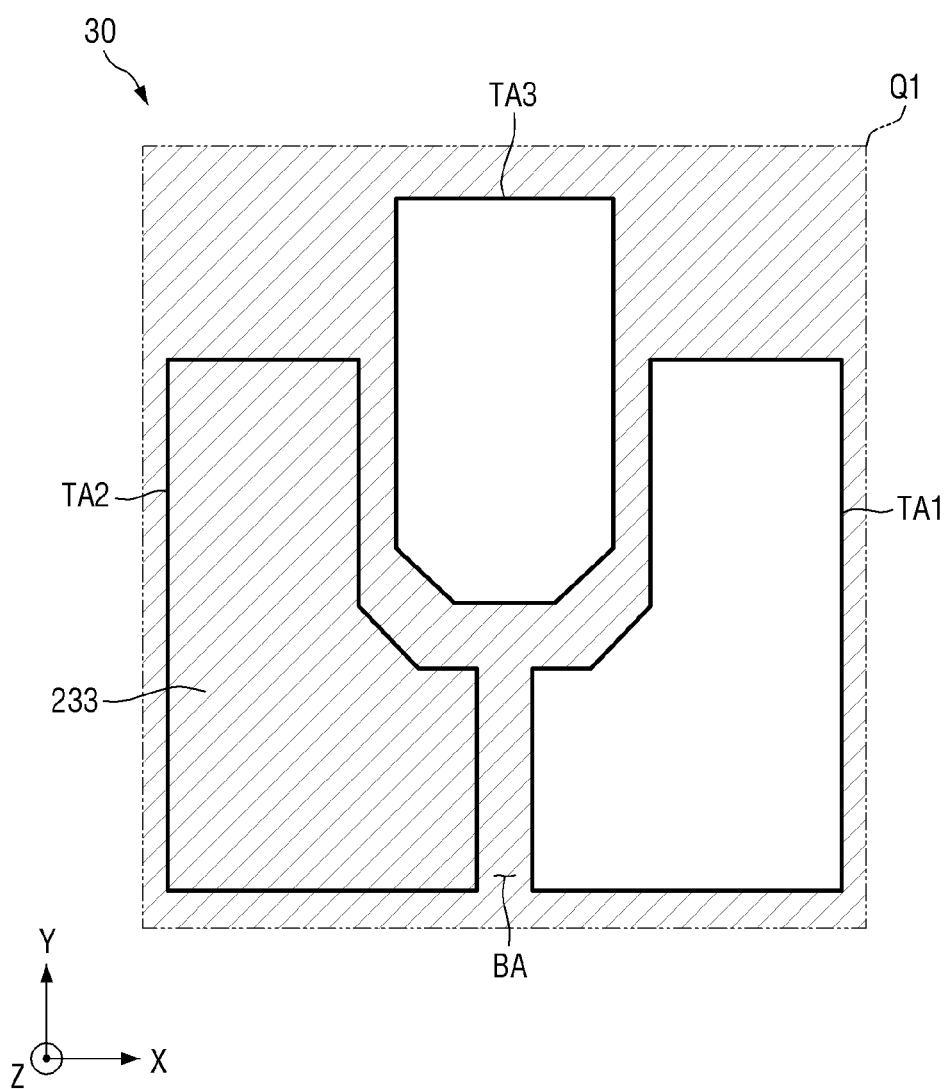
FIG. 14 is a plan view illustrating a schematic arrangement of a second color filter in a color conversion substrate of a display device according to one embodiment.
Figure 15:
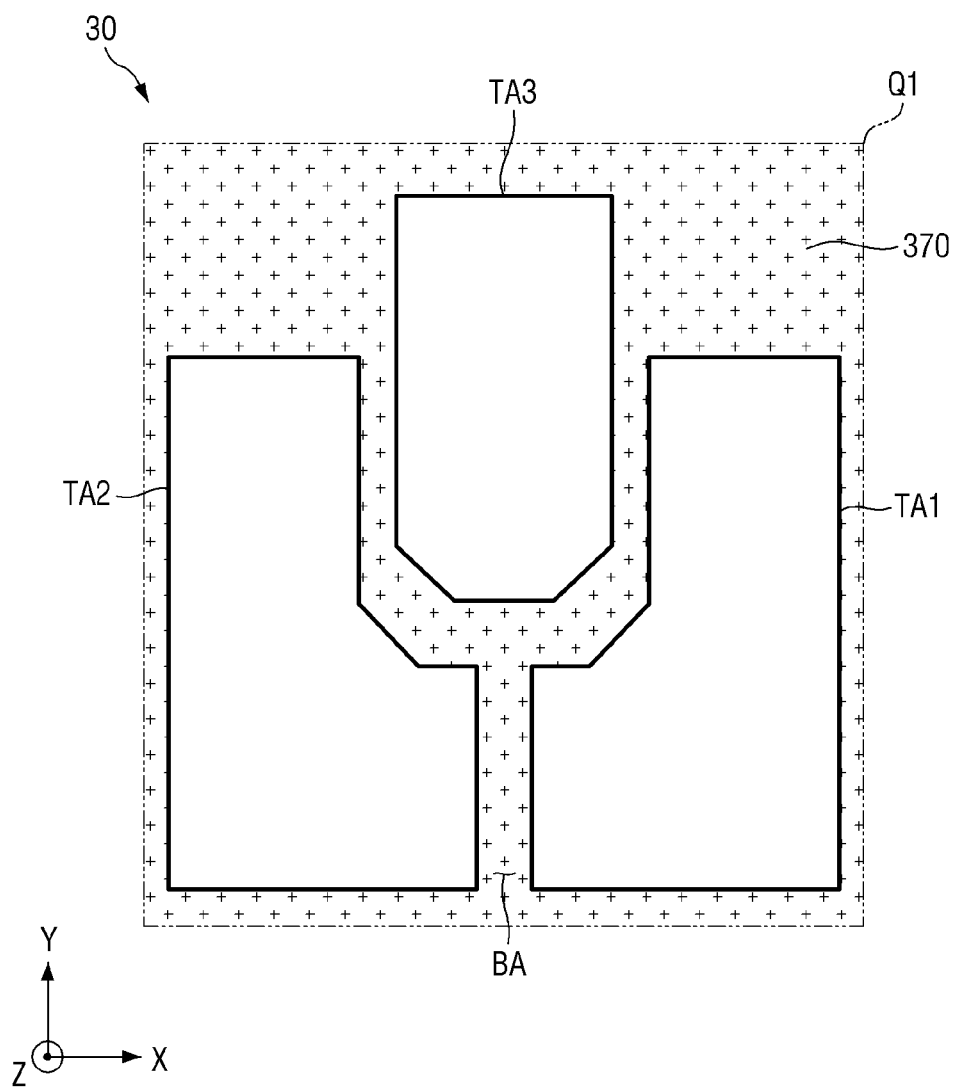
FIG. 15 is a plan view illustrating a schematic arrangement of a bank pattern in a color conversion substrate of a display device according to one embodiment.
Figure 16:
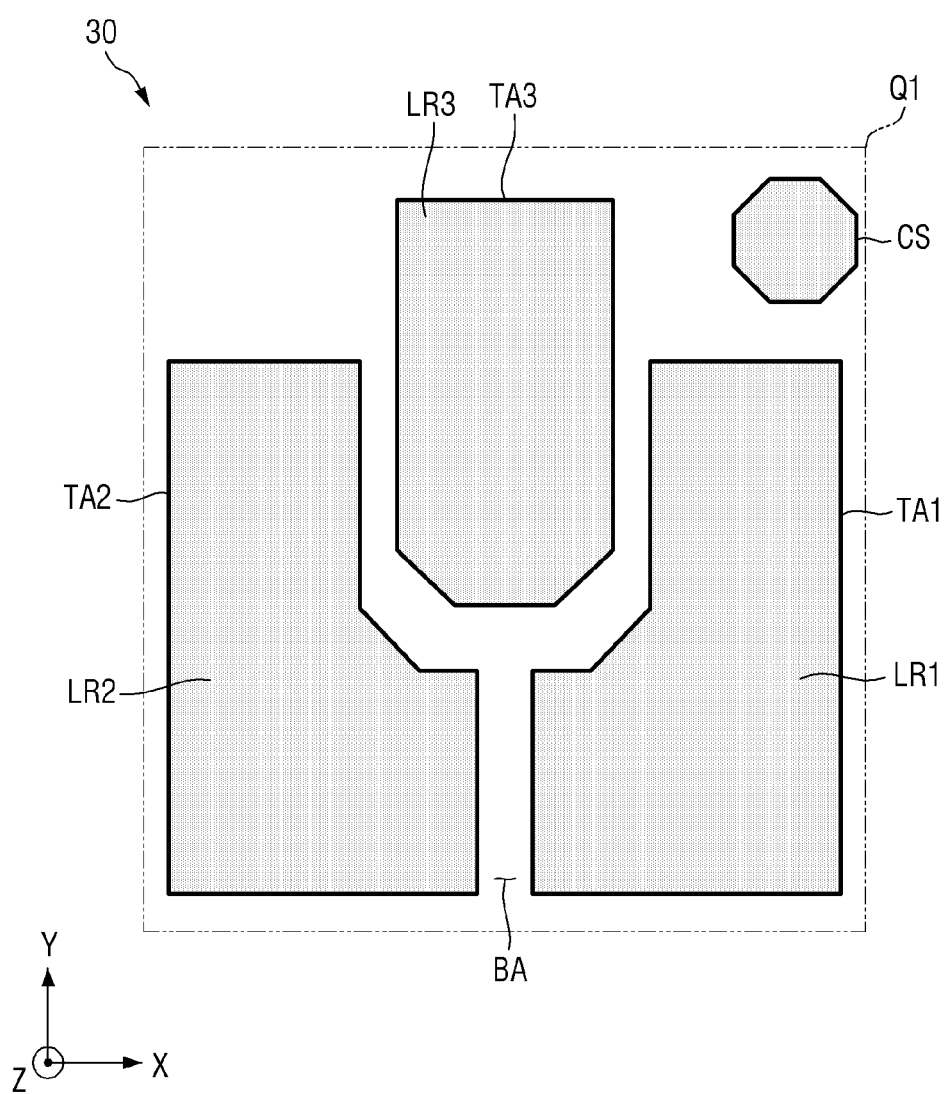
FIG. 16 is a plan view illustrating a schematic arrangement of an optical pattern and a column spacer in a color conversion substrate of a display device according to one embodiment.
Figure 17:
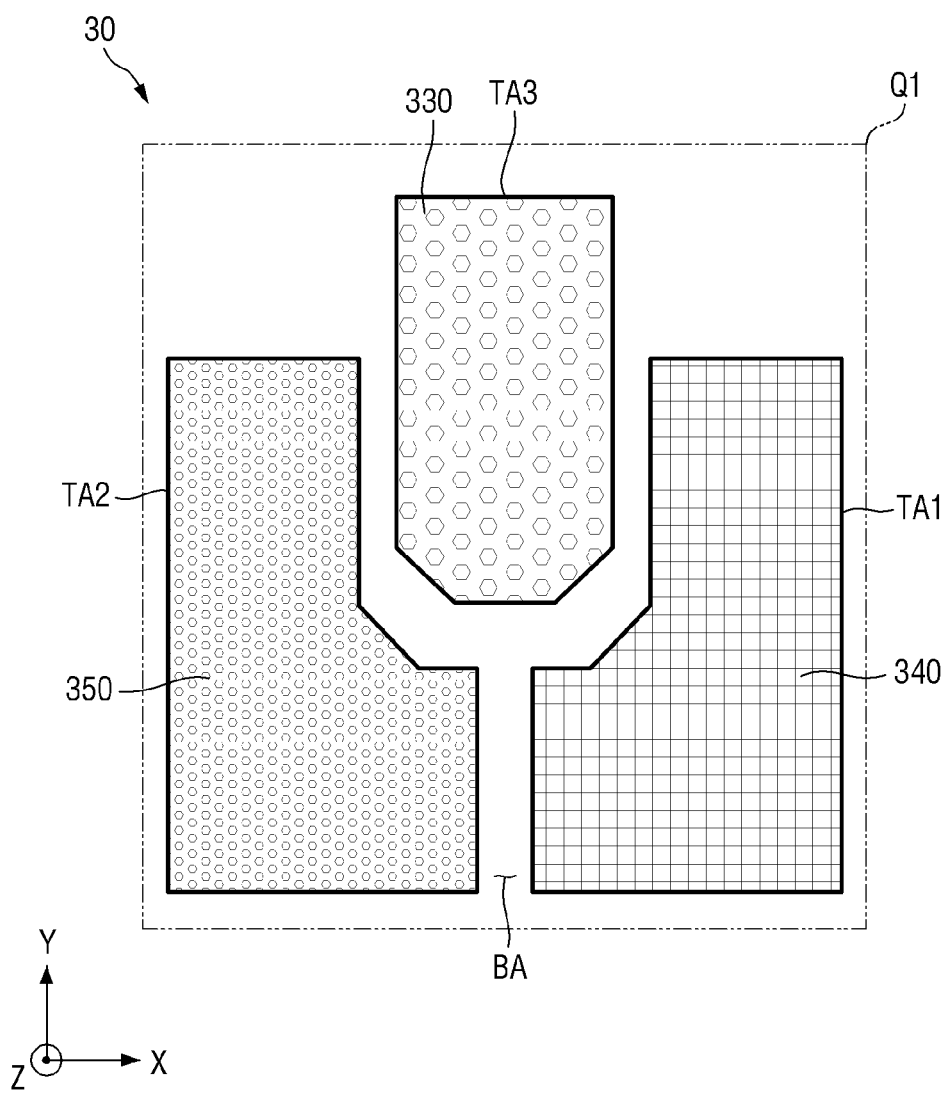
FIG. 17 is a plan view illustrating a schematic arrangement of a first wavelength conversion pattern, a second wavelength conversion pattern, and a light transmission pattern in a color conversion substrate of a display device according to one embodiment.

FIG. 12 is a plan view illustrating a schematic arrangement of a third color filter in a color conversion substrate of a display device according to one embodiment. FIG. 13 is a plan view illustrating a schematic arrangement of a first color filter in a color conversion substrate of a display device according to one embodiment. FIG. 14 is a plan view illustrating a schematic arrangement of a second color filter in a color conversion substrate of a display device according to one embodiment. FIG. 15 is a plan view illustrating a schematic arrangement of a bank pattern in a color conversion substrate of a display device according to one embodiment. FIG. 16 is a plan view illustrating a schematic arrangement of an optical pattern and a column spacer in a color conversion substrate of a display device according to one embodiment. FIG. 17 is a plan view illustrating a schematic arrangement of a first wavelength conversion pattern, a second wavelength conversion pattern, and a light transmission pattern in a color conversion substrate of a display device according to one embodiment.

Referring further to FIGS. 12 to 17 in addition to FIGS. 5 to 7, a second base portion 310 shown in FIGS. 5 to 7 may include or be made of a light transmissive material.

In some embodiments, the second base portion 310 may include a glass substrate or a plastic substrate. In some embodiments, the second base portion 310 may further include a separate layer, for example, an insulating layer such as an inorganic layer, located on the glass substrate or the plastic substrate.

As described above, in some embodiments, the plurality of light transmitting areas TA1, TA2, and TA3 and the light blocking area BA may be defined in the second base portion 310.

As shown in FIGS. 5 to 7, and 12, the third color filter 235 may be positioned on one surface of the second base portion 310 facing the display substrate 10.

The third color filter 235 may be disposed to overlap the third light transmitting area TA3.

The third color filter 235 may selectively transmit light of the third color (e.g., blue light), and may block or absorb light of the first color (e.g., red light) and light of the second color (e.g., green light). In some embodiments, the third color filter 235 may be a blue color filter, and may include a blue colorant such as a blue dye or a blue pigment. In an embodiment, the colorant may include both a dye and a pigment.

The third color filter 235 may be disposed to further overlap the non-emission area NLA or the light blocking area BA.

A portion of the third color filter 235 that overlaps the light blocking area BA may absorb part of light flowing into the display device 1 from the outside of the display device 1, thereby reducing reflected light caused by external light. A reflection of a significant portion of the external light may cause distortion of the color reproducibility of the display device 1. However, according to an embodiment, the third color filter 235 is further positioned in the non-emission area NLA and the non-display area NDA, such that color distortion caused by reflection of external light may be reduced.

In an embodiment where the third color filter 235 includes a blue colorant, external light that has passed through the third color filter 235 or reflected light may be blue light. The eye color sensibility perceived by a user's eyes depends on the color of the light. More specifically, light in the blue wavelength band may be perceived as less sensitive to the user than light in a green wavelength band and light in a red wavelength band. Accordingly, in an embodiment, as the third color filter 235 including the blue colorant is further disposed to overlap the light blocking area BA, the user may perceive the reflected light relatively less sensitively.

As shown in FIGS. 5 to 7, 13, and 14, the first color filter 231 and the second color filter 233 may be positioned on one surface of the second base portion 310 facing the display substrate 10.

The first color filter 231 may be disposed to overlap the first emission area LA1 or the first light transmitting area TA1.

In some embodiments, the first color filter 231 may block or absorb light of the third color (e.g., blue light). That is, the first color filter 231 may function as a blue light blocking filter that blocks blue light. In some embodiments, the first color filter 231 may selectively transmit light of the first color (e.g., red light) and may block or absorb light of the third color (e.g., blue light) and light of the second color (e.g., green light). For example, the first color filter 231 may be a red color filter and may include a red colorant.

The first color filter 231 may be disposed to further overlap the non-emission area NLA or the light blocking area BA, and a portion of the first color filter 231 in the light blocking area BA may be positioned on the third color filter 235.

The second color filter 233 may block or absorb light of the third color (e.g., blue light). That is, the second color filter 233 may also function as a blue light blocking filter. In some embodiments, the second color filter 233 may selectively transmit light of the second color (e.g., green light) and may block or absorb light of the third color (e.g., blue light) and light of the first color (e.g., red light). For example, the second color filter 233 may be a green color filter and may include a green colorant.

The second color filter 233 may be disposed to further overlap the non-emission area NLA or the light blocking area BA, and a portion of the second color filter 233 in the light blocking area BA may be positioned on the first color filter 231.

The bank pattern 370 may be positioned on one surface of the color filter, e.g., the second color filter 233, facing the display substrate 10 in the light blocking area BA. In some embodiments, the bank pattern 370 may be positioned directly on one surface of the second color filter 233 and may be in direct contact with the second color filter 233.

In some embodiments, the bank pattern 370 may be disposed to overlap the non-emission area NLA. In some embodiments, as shown in FIG. 15, the bank pattern 370 may surround the first light transmitting area TA1, the second light transmitting area TA2, and the third light transmitting area TA3 in a plan view. The bank pattern 370 may partition a space in which a first wavelength conversion pattern 340, a second wavelength conversion pattern 350, and a light transmission pattern 330 are disposed.

In some embodiments, as shown in FIG. 15, the bank pattern 370 may be formed in one pattern that is integrally connected, that is, integrally formed in a single unitary and indivisible part, but is not limited thereto. In another embodiment, a portion of the bank pattern 370 surrounding the first light transmitting area TA1, a portion of the bank pattern 370 surrounding the second light transmitting area TA2, and a portion of the bank pattern 370 surrounding the third light transmitting area TA3 may be formed in individual patterns separated from each other.

When the first wavelength conversion pattern 340, the second wavelength conversion pattern 350, and the light transmission pattern 330 are formed by a method of discharging an ink composition using a nozzle or the like, i.e., an inkjet printing method, the bank pattern 370 may serve as a guide for stably positioning the discharged ink composition at a desired position. That is, the bank pattern 370 may function as a barrier wall.

In some embodiments, the bank pattern 370 may overlap the pixel defining layer 150.

In some embodiments, the bank pattern 370 may include an organic material having photocurability. In addition, in some embodiments, the bank pattern 370 may include an organic material having photocurability and including a light blocking material. In an embodiment where the bank pattern 370 has alight blocking property, it is possible to prevent intrusion of light between the emission areas adjacent to each other in the display area DA. For example, the bank pattern 370 may prevent the emission light LE emitted from the second light emitting element ED2 from being incident on the first wavelength conversion pattern 340 that overlaps the first emission area LA1. In addition, the bank pattern 370 may block or prevent external light from penetrating into components positioned therebelow in the non-emission area NLA.

A first optical pattern LR1 may be positioned on the first color filter 231, a second optical pattern LR2 may be positioned on the second color filter 233, and a third optical pattern LR3 may be positioned on the third color filter 235, as shown in FIGS. 5, 6 and 16. The first optical pattern LR1 may overlap the first light transmitting area TA1, the second optical pattern LR2 may overlap the second light transmitting area TA2, and the third optical pattern LR3 may overlap the third light transmitting area TA3.

The first optical pattern LR1, the second optical pattern LR2, and the third optical pattern LR3 may be located in a space partitioned by the bank pattern 370. In some embodiments, the first optical pattern LR1, the second optical pattern LR2, and the third optical pattern LR3 may be in direct contact with the bank pattern 370.

In some embodiments, the height of each optical pattern may be smaller than the height of the bank pattern 370. For example, as shown in FIG. 11, a height THB of the bank pattern 370 measured from one surface 310s of the second base portion 310 (or a distance of the lowermost point of the bank pattern 370 from the one surface 310s of the second base portion 310) may be greater than a height THL of the first optical pattern LR1 measured from the one surface 310s of the second base portion 310 (or a distance of the lowermost point of the first optical pattern LR1 from the one surface 310s of the second base portion 310). In such an embodiment, the bank pattern 370 is closer to the display substrate 10 than the first optical pattern LR1 is.

In some embodiments, the height of each optical pattern may vary depending on a region. For example, as shown in FIG. 11, the height THL of the first optical pattern LR1 may increases as the distance from the bank pattern 370 decreases.

In some embodiments, one surface of each optical pattern may include a curved surface. In some embodiments, as shown in FIG. 11, one surface LR1s of the first optical pattern LR1 facing the first wavelength conversion pattern 340 may have a lens shape. For example, the one surface LR1s of the first optical pattern LR1 may have a concave shape curved toward the second base portion 310.

Features of one surface (e.g., the heights and the shapes) of the second optical pattern LR2 and the third optical pattern LR3 are substantially the same as those of the first optical pattern LR1, and thus, any repetitive detailed description thereof will be omitted.

In some embodiments, the first optical pattern LR1, the second optical pattern LR2, and the third optical pattern LR3 may include or be made of the same material as each other and may be simultaneously formed in the same process. In some embodiments, the first optical pattern LR1, the second optical pattern LR2, and the third optical pattern LR3 may include or be formed of a material having a low refractive index.

In some embodiments, the refractive index of the first optical pattern LR1 may be lower than that of the first wavelength conversion pattern 340 to be described later. For example, the refractive index of the first optical pattern LR1 may be lower than that of the first wavelength conversion pattern 340 by 0.2 or more or 0.3 or more.

Similarly, the refractive index of the second optical pattern LR2 may be lower than that of the second wavelength conversion pattern 350 to be described later. For example, the refractive index of the second optical pattern LR2 may be lower than that of the second wavelength conversion pattern 350 by 0.2 or more or 0.3 or more.

In addition, the refractive index of the third optical pattern LR3 may be lower than that of the light transmission pattern 330 to be described later. For example, the refractive index of the third optical pattern LR3 may be lower than that of the light transmission pattern 330 by 0.2 or more or 0.3 or more.

In some embodiments, the refractive indices of the first optical pattern LR1, the second optical pattern LR2, and the third optical pattern LR3 may be about 1.1 or more and 1.4 or less, about 1.15 or more and about 1.3 or less, or about 1.2 or more and about 1.3 or less.

In some embodiments, each optical pattern may recycle part of light provided from the display substrate 10. For example, the first optical pattern LR1 may reflect part of light, emitted toward the second base portion 310 without being light-converted in the first wavelength conversion pattern 340, back to the first wavelength conversion pattern 340. Since the refractive index of the first optical pattern LR1 is smaller than that of the first wavelength conversion pattern 340, a critical angle at which total reflection occurs may be reduced, and accordingly, the amount of light having an incident angle greater than the critical angle may increase. Light having an incident angle greater than the critical angle is totally reflected, and as a result, the amount of light reflected from the one surface LR1s (see FIG. 11) of the first optical pattern LR1 may be increased. In addition, as the one surface LR1s (see FIG. 11) of the first optical pattern LR1 has a concave shape, the amount of light recycled to the first wavelength conversion pattern 340 may be increased. In addition, since the first optical pattern LR1 may cover a part of the side surface of the bank pattern 370, it may reflect part of light, emitted toward the bank pattern 370 without being light-converted in the first wavelength conversion pattern 340, back to the first wavelength conversion pattern 340. Accordingly, the amount of light recycled may be further increased, and as a result, the light use efficiency of the display device 1 may be further improved.

As described above, the second optical pattern LR2 may improve the light use efficiency in the second light transmitting area TA2, and the third optical pattern LR3 may improve the light use efficiency in the third light transmitting area TA3.

In some embodiments, the refractive index of the first optical pattern LR1 may be smaller than that of the first wavelength conversion pattern 340 and also smaller than that of the first color filter 231. In addition, the refractive index of the second optical pattern LR2 may be smaller than that of the second wavelength conversion pattern 350 and also smaller than that of the second color filter 233. The refractive index of the third optical pattern LR3 may be smaller than that of the light transmission pattern 330 and also smaller than that of the third color filter 235.

As the refractive index of each color filter is greater than that of each optical pattern, the light passing through each optical pattern and incident on each color filter may have relatively improved straightness, thereby increasing the light output efficiency of the display device 1.

In some embodiments, each optical pattern may include inorganic particles. For example, as shown in FIG. 10, the second optical pattern LR2 may include a plurality of particles P and a resin R in which the plurality of particles P are dispersed.

In some embodiments, the resin R may include a polymer material. For example, the resin R may include any one polymer material or a combination of a plurality of polymer materials selected from an acrylic polymer material, a silicone polymer material, a urethane polymer material, and an imide polymer material. Alternatively, the resin R may include at least one of a siloxane polymer, a silsesquioxane polymer, an acrylic polymer substituted with a fluorine atom, a silicone polymer substituted with a fluorine atom, a urethane polymer substituted with a fluorine atom, or an imide polymer substituted with a fluorine atom. In some embodiments, the resin R may be formed from an acrylic resin, a silicone resin, a urethane resin, or an imide resin. The resin R may be formed by solidifying a polymer resin such as an acrylic resin, a silicone resin, a urethane resin, or an imide resin in a high temperature process or an ultraviolet treatment process.

In some embodiments, the resin R may have photosensitivity.

In some embodiments, the particle P may include or be made of an inorganic material. For example, the particle P may be at least one of a zinc oxide (ZnO) particle, a titanium dioxide ($TiO_2$) particle, a magnesium fluoride ($MgF_2$) particle, an iron oxide ($Fe_3O_4$) particle, a hollow silica particle, a non-hollow silica particle, a nano silicate particle, or a porogen particle. In some embodiments, when the particle is a hollow particle having a structure with an empty inside, the particle may have a diameter of 20 nm to 200 nm, and a shell thickness of 5 nm to 20 nm. In addition, the diameter of the hollow may be determined based on the thickness of the shell and the diameter of the particle. The refractive indices of the first optical pattern LR1, the second optical pattern LR2, and the third optical pattern LR3 may be adjusted by adjusting the thickness of the shell and the diameter of the particle.

In some embodiments, two or more types of particles P having different diameters from each other may be dispersed in the resin R.

As described above, since the first optical pattern LR1 and the third optical pattern LR3 include or are made of the same material as the second optical pattern LR2, they may also include the resin R and the particles P.

As shown in FIGS. 7 and 16, the column spacer CS may be positioned on the bank pattern 370. As described above, the column spacer CS may maintain a gap between the display substrate 10 and the color conversion substrate 30 to be substantially constant.

In some embodiments, the column spacer CS may be positioned directly on the bank pattern 370 and may be in direct contact with the bank pattern 370.

In some embodiments, the column spacer CS may include or be made of the same material as that of the first optical pattern LR1, the second optical pattern LR2, and the third optical pattern LR3, and may be simultaneously formed through the same process (e.g., a photoresist process and the like) as that of the first optical pattern LR1, the second optical pattern LR2, and the third optical pattern LR3.

Since the column spacer CS include or is made of the same material as that of the first optical pattern LR1, the second optical pattern LR2, and the third optical pattern LR3, in some embodiments, the refractive index of the column spacer CS may be the same as that of the first optical pattern LR1, and may be lower than that of the first wavelength conversion pattern 340, the second wavelength conversion pattern 350, and the light transmission pattern 330. In some embodiments, the refractive index of the column spacer CS may be about 1.1 or more and 1.4 or less, about 1.15 or more and about 1.3 or less, or about 1.2 or more and about 1.3 or less. In addition, when the optical pattern includes the resin R and the particles P as shown in FIG. 11, the column spacer CS may also include the resin R and the particles P.

As shown in FIGS. 5 to 7 and 17, the first wavelength conversion pattern 340, the second wavelength conversion pattern 350, and the light transmission pattern 330 may be positioned in a space partitioned (or defined) by the bank pattern 370. In some embodiments, the first wavelength conversion pattern 340, the second wavelength conversion pattern 350, and the light transmission pattern 330 may be positioned in the display area DA.

The light transmission pattern 330 may overlap the third emission area LA3 or the third light emitting element ED3. The light transmission pattern 330 may be located in a space partitioned by the bank pattern 370 in the third light transmitting area TA3, and may be positioned on the third optical pattern LR3.

In some embodiments, as shown in FIG. 17, the light transmission pattern 330 may be formed in an island shape pattern.

The light transmission pattern 330 may transmit incident light. The emission light LE provided from the third light emitting element ED3 may be blue light as described above. The emission light LE, which is blue light, passes through the light transmission pattern 330 and the third color filter 235 and is emitted to the outside of the display device 1. That is, the third emission light (L3) emitted from the third emission area LA3 to the outside of the display device 1 may be blue light.

In some embodiments, the light transmission pattern 330 may include a first base resin 331, and may further include a first scatterer 333 dispersed in the first base resin 331.

The first base resin 331 may include or be made of a material having high light transmittance. In some embodiments, the first base resin 331 may include or be formed of an organic material. For example, the first base resin 331 may include an organic material such as epoxy resin, acrylic resin, cardo resin, or imide resin.

The first scatterer 333 may have a refractive index different from that of the first base resin 331 and form an optical interface with the first base resin 331. For example, the first scatterer 333 may be light scattering particles. The first scatterer 333 is not particularly limited as long as it is a material capable of scattering at least a portion of the transmitted light, but may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like. The first scatterer 333 may scatter light in a random direction irrespective of the incident direction of incident light, without substantially converting the wavelength of the light passing through the light transmission pattern 330.

In some embodiments, the light transmission pattern 330 may be in direct contact with the third optical pattern LR3 and the bank pattern 370.

As described above, the refractive index of the light transmission pattern 330 may be greater than that of the third optical pattern LR3, and in some embodiments, the refractive index of the light transmission pattern 330 may be greater than that of the third optical pattern LR3 by 0.2 or more or 0.3 or more. In some embodiments, when the refractive index of the third optical pattern LR3 is about 1.1 or more and 1.4 or less, about 1.15 or more and about 1.3 or less, or about 1.2 or more and about 1.3 or less, the refractive index of the light transmission pattern 330 may be 1.7 to 1.9.

The first wavelength conversion pattern 340 may be positioned on the first optical pattern LR1 and may overlap the first emission area LA1, the first light emitting element EDT, or the first light transmitting area TA1.

In some embodiments, the first wavelength conversion pattern 340 may be located in a space partitioned by the bank pattern 370 in the first light transmitting area TA1.

In some embodiments, as shown in FIG. 17, the first wavelength conversion pattern 340 may be formed in an island pattern shape.

In some embodiments, the first wavelength conversion pattern 340 may be in direct contact with the first optical pattern LR1 and the bank pattern 370.

The first wavelength conversion pattern 340 may emit light by converting or shifting the peak wavelength of incident light to another specific peak wavelength. In some embodiments, the first wavelength conversion pattern 340 may convert the emission light LE provided from the first light emitting element ED1 into red light having a peak wavelength in a range of 610 nm to 650 nm and may emit the red light.

In some embodiments, as shown in FIG. 5, the first wavelength conversion pattern 340 may include a second base resin 341 and a first wavelength shifter 345 dispersed in the second base resin 341, and may further include a second scatterer 343 dispersed in the second base resin 341.

The second base resin 341 may include or be made of a material having high light transmittance. In some embodiments, the second base resin 341 may include or be formed of an organic material. In some embodiments, the second base resin 341 may be made of the same material as the first base resin 331, or may include at least one selected from the materials described above as the constituent materials of the first base resin 331.

The first wavelength shifter 345 may convert or shift the peak wavelength of incident light to another specific peak wavelength. In some embodiments, the first wavelength shifter 345 may convert the emission light LE of the third color, which is blue light, provided from the first light emitting element ED1 into red light having a single peak wavelength in a range of 610 nm to 650 nm, and may emit the red light.

Examples of the first wavelength shifter 345 may include a quantum dot, a quantum bar, a phosphor, and the like. For example, a quantum dot may be a particulate material that emits light of a specific color when an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

The group II-VI compound may be selected from binary compounds, ternary compounds, and quaternary compounds, wherein the binary compounds are selected from CdSe, CdTe, ZnS, ZnSe, ZnTe, ZnO, HgS, HgSe, HgTe, MgSe, MgS and mixtures thereof, the ternary compounds are selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, and the quaternary compounds are selected from HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from binary compounds, ternary compounds, and quaternary compounds, wherein the binary compounds are selected from GaN, GaP, GaAs, GaSb, AlN, AlP, AlAs, AlSb, InN, InP, InAs, InSb and mixtures thereof, the ternary compounds are selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof, and the quaternary compounds are selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from binary compounds, ternary compounds, and quaternary compounds, wherein the binary compounds are selected from SnS, SnSe, SnTe, PbS, PbSe, PbTe and mixtures thereof, the ternary compounds are selected from SnSeS, SnSeTe, SnSTe, PbSeS, PbSeTe, PbSTe, SnPbS, SnPbSe, SnPbTe and mixtures thereof, and the quaternary compounds are selected from SnPbSSe, SnPbSeTe, SnPbSTe and mixtures thereof. The Group IV element may be selected from Si, Ge and mixtures thereof. The Group IV compound may be a binary compound selected from SiC, SiGe and mixtures thereof.

In this case, the binary compound, the tertiary compound or the quaternary compound may exist in particles at a uniform concentration, or may exist in the same particle divided into states where concentration distributions are partially different. Further, the particles may have a core/shell structure in which one quantum dot surrounds another quantum dot. An interface between the core and the shell may have a concentration gradient in which the concentration of elements presents in the shell decreases toward the center.

In some embodiments, the quantum dot may have a core-shell structure including a core including the nanocrystal described above and a shell surrounding the core. The shell of the quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of elements presents in the shell decreases toward the center. Examples of the shell of the quantum dot may include a metal or non-metal oxide, a semiconductor compound, and a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$, or a tertiary compound such as $MgAl_2O_4$, $CoFe_2O_4$, $NiFe_2O_4$ and $CoMn_2O_4$, but the invention is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or the like, but the invention is not limited thereto.

The light emitted from the first wavelength shifter 345 may have a full width of half maximum (FWHM) of the emission wavelength spectrum, which is about 45 nm or less, about 40 nm or less, or about 30 nm or less. Thus, the purity and reproducibility of colors displayed by the display device 1 can be further improved. In addition, the light emitted from the first wavelength shifter 345 may be emitted in various directions regardless of the incident direction of incident light. Accordingly, side visibility of the first color displayed in the first light transmitting area TA1 may be improved.

Part of the emission light LE provided from the first light emitting element ED1 may pass through the first wavelength conversion pattern 340 and be emitted, without being converted into red light by the first wavelength shifter 345. A component of the emission light LE incident on the first color filter 231 without being converted by the first wavelength conversion pattern 340 may be blocked by the first color filter 231. On the other hand, the emission light LE that has converted into red light by the first wavelength conversion pattern 340 passes through the first color filter 231 and is emitted to the outside. That is, the first emission light (L1) emitted to the outside of the display device 1 through the first light transmitting area TA1 may be red light.

The second scatterer 343 may have a refractive index different from that of the second base resin 341 and form an optical interface with the second base resin 341. For example, the second scatterer 343 may be light scattering particles. Other features of the second scatterer 343 is substantially the same as or similar to the those of the first scatterer 333 described above, and thus any repetitive detailed description thereof will be omitted.

As described above, the refractive index of the first wavelength conversion pattern 340 may be greater than that of the first optical pattern LR1, and in some embodiments, the refractive index of the first wavelength conversion pattern 340 may be greater than that of the first optical pattern LR1 by 0.2 or more or 0.3 or more. In some embodiments, when the refractive index of the first optical pattern LR1 is about 1.1 or more and 1.4 or less, about 1.15 or more and about 1.3 or less, or about 1.2 or more and about 1.3 or less, the refractive index of the first wavelength conversion pattern 340 may be 1.7 to 1.9.

By configuring the refractive index difference between the first optical pattern LR1 and the first wavelength conversion pattern 340 to be relatively large, total reflection may easily occur on one surface of the first optical pattern LR1 facing the first wavelength conversion pattern 340. That is, the amount of light reflected from one surface of the first optical pattern LR1 toward the first wavelength conversion pattern 340 may be increased, and accordingly, light use efficiency may be improved.

The second wavelength conversion pattern 350 may be located in a space partitioned by the bank pattern 370 in the second light transmitting area TA2.

In some embodiments, as shown in FIG. 17, the second wavelength conversion pattern 350 may be formed in an island pattern shape.

In some embodiments, the second wavelength conversion pattern 350 may be in direct contact with the second optical pattern LR2 and the bank pattern 370.

The second wavelength conversion pattern 350 may emit light by converting or shifting the peak wavelength of incident light to another specific peak wavelength. In some embodiments, the second wavelength conversion pattern 350 may convert the emission light LE provided from the second light emitting element ED2 into green light having a peak wavelength in a range of about 510 nm to about 550 nm and emit the green light.

In some embodiments, as shown in FIG. 5, the second wavelength conversion pattern 350 may include a third base resin 351 and a second wavelength shifter 355 dispersed in the third base resin 351, and may further include a third scatterer 353 dispersed in the third base resin 351.

The third base resin 351 may include or be made of a material having high light transmittance. In some embodiments, the third base resin 351 may include or be formed of an organic material. In some embodiments, the third base resin 351 may include or be made of the same material as the first base resin 331, or may include at least one selected from the materials described above as the constituent materials of the first base resin 331.

The second wavelength shifter 355 may convert or shift the peak wavelength of incident light to another specific peak wavelength. In some embodiments, the second wavelength shifter 355 may convert blue light having a peak wavelength in a range of 440 nm to 480 nm into green light having a peak wavelength in a range of 510 nm to 550 nm.

Examples of the second wavelength shifter 355 may include a quantum dot, a quantum rod, a phosphor, and the like. Other features of the second wavelength shifter 355 is substantially the same as or similar to those of the first wavelength shifter 345 described above, and thus any repetitive detailed description thereof will be omitted.

In some embodiments, both the first wavelength shifter 345 and the second wavelength shifter 355 may be defined by or formed of quantum dots. In this case, the particle size of the quantum dots constituting the second wavelength shifter 355 may be smaller than the particle size of the quantum dots constituting the first wavelength shifter 345.

The third scatterer 353 may have a refractive index different from that of the third base resin 351 and form an optical interface with the third base resin 351. For example, the third scatterer 353 may be light scattering particles. Other features of the third scatterer 353 is substantially the same as or similar to those of the second scatterer 343 described above, and thus any repetitive detailed description thereof will be omitted.

The emission light LE emitted from the second light emitting element ED2 may be provided to the second wavelength conversion pattern 350, and the second wavelength shifter 355 may convert the emission light LE provided from the second light emitting element ED2 into green light having a peak wavelength in a range of about 510 nm to about 550 nm and may emit the green light.

Part of the emission light LE, which is blue light, may pass through the second wavelength conversion pattern 350 without being converted into green light by the second wavelength shifter 355, and then may be blocked by the second color filter 233. On the other hand, the emission light LE that has converted into green light by the second wavelength conversion pattern 350 passes through the second color filter 233 and is emitted to the outside. Accordingly, the second emission light (L2) emitted from the second light transmitting area TA2 to the outside of the display device 1 may be green light.

As described above, the refractive index of the second wavelength conversion pattern 350 may be greater than that of the second optical pattern LR2, and in some embodiments, the refractive index of the second wavelength conversion pattern 350 may be greater than that of the second optical pattern LR2 by 0.2 or more, or 0.3 or more. In some embodiments, when the refractive index of the second optical pattern LR2 is about 1.1 or more and 1.4 or less, about 1.15 or more and about 1.3 or less, or about 1.2 or more and about 1.3 or less, the refractive index of the second wavelength conversion pattern 350 may be 1.7 to 1.9.

A second capping layer 393 may be positioned on the bank pattern 370, the column spacer CS, the light transmission pattern 330, the first wavelength conversion pattern 340, and the second wavelength conversion pattern 350. The second capping layer 393 may cover the light transmission pattern 330, the first wavelength conversion pattern 340, and the second wavelength conversion pattern 350. In addition, the second capping layer 393 may cover the column spacer CS.

In some embodiments, the second capping layer 393 may also be positioned in the non-display area NDA (see FIG. 1). In the non-display area NDA (see FIG. 1), the second capping layer 393 may be in direct contact with the second base portion 310, and may seal the light transmission pattern 330, the first wavelength conversion pattern 340 and the second wavelength conversion pattern 350. Accordingly, the second capping layer 393 can prevent contamination or damage of the light transmission pattern 330, the first wavelength conversion pattern 340 and the second wavelength conversion pattern 350 due to infiltration of impurities such as moisture or air from the outside.

In some embodiments, the second capping layer 393 may include or be made of an inorganic material. For example, the second capping layer 393 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

In some embodiments, a portion of the second capping layer 393 that overlaps the column spacer CS may be in direct contact with the thin film encapsulation layer 170. For example, a portion of the second capping layer 393 that overlaps the column spacer CS may be in contact with the upper inorganic layer 175 of the thin film encapsulation layer 170.

As described above, the filler 70 may be located in the space between the color conversion substrate 30 and the display substrate 10. In some embodiments, as shown in FIGS. 5 to 7, the filler 70 may be in direct contact with the second capping layer 393 and the thin film encapsulation layer 170.

In embodiments, as described above, the display device 1 includes the first optical pattern LR1, the second optical pattern LR2, and the third optical pattern LR3 having a refractive index relatively lower than that of the first wavelength conversion pattern 340, the second wavelength conversion pattern 350, and the light transmission pattern 330, such that light use efficiency is improved. In such embodiments, since the display device 1 includes the column spacers CS, a gap may be uniformly maintained in the display area DA, and thus the thickness of the filler 70 may be uniformly maintained. In such embodiment, as the thickness of the filler 70 is maintained uniformly, deterioration of display quality that may occur due to the non-uniform thickness of the filler 70 may be effectively prevented.

In such embodiments, since the first optical pattern LR1, the second optical pattern LR2, and the third optical pattern LR3 can be formed together in a process of forming the column spacer CS, the manufacturing process may be simplified.

Figure 18:
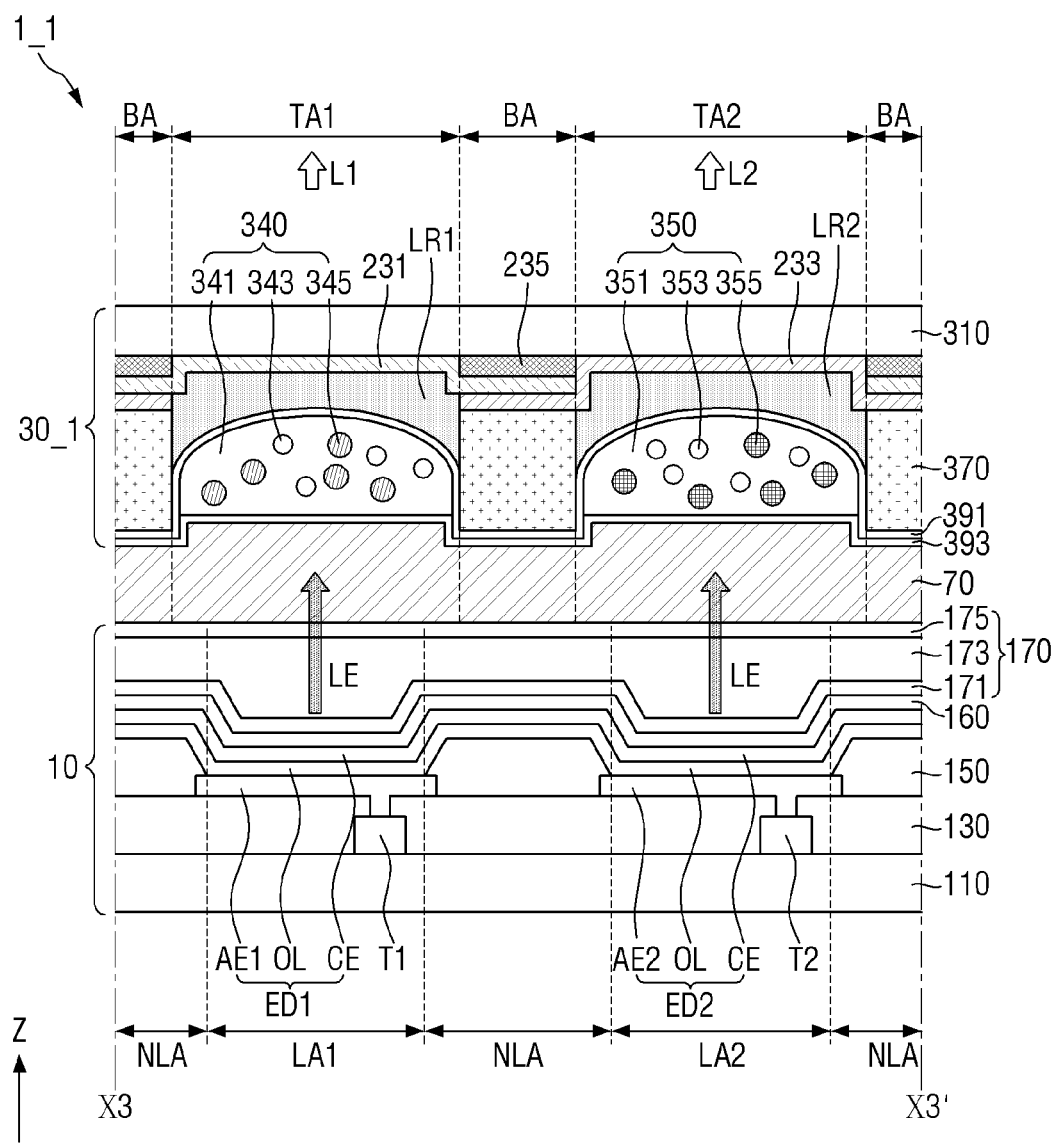
FIG. 18 is a cross-sectional view of a display device according to another embodiment taken along line X3-X3' of FIGS. 3 and 4.
Figure 19:
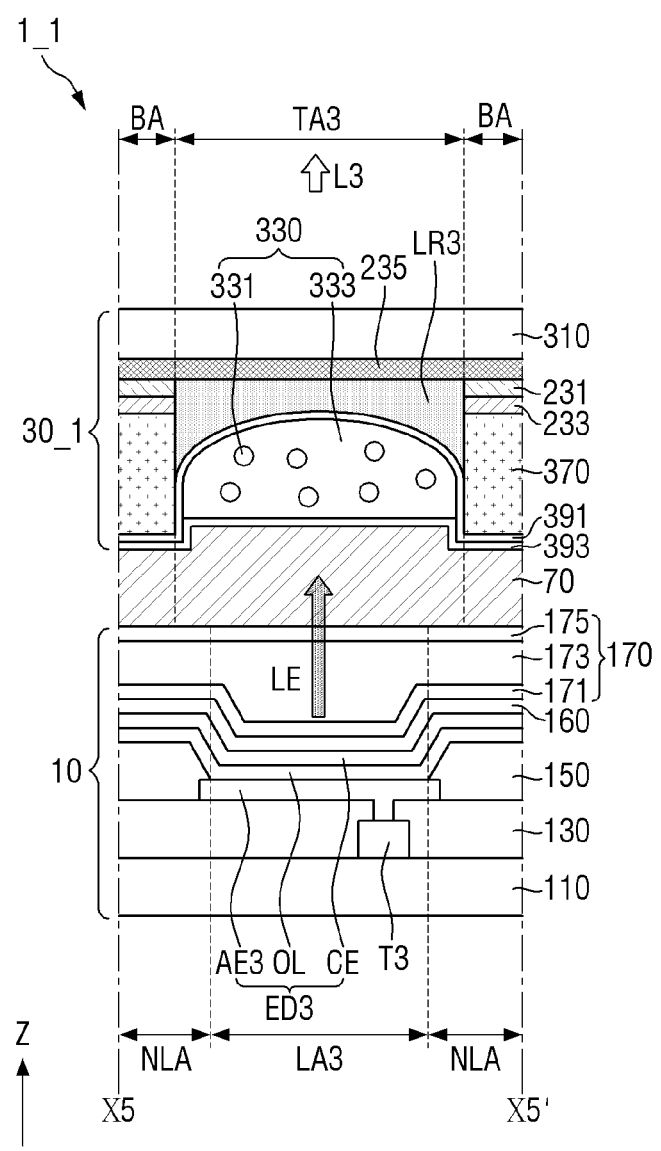
FIG. 19 is a cross-sectional view of a display device according to another embodiment taken along line X5-X5' of FIGS. 3 and 4.
Figure 20:
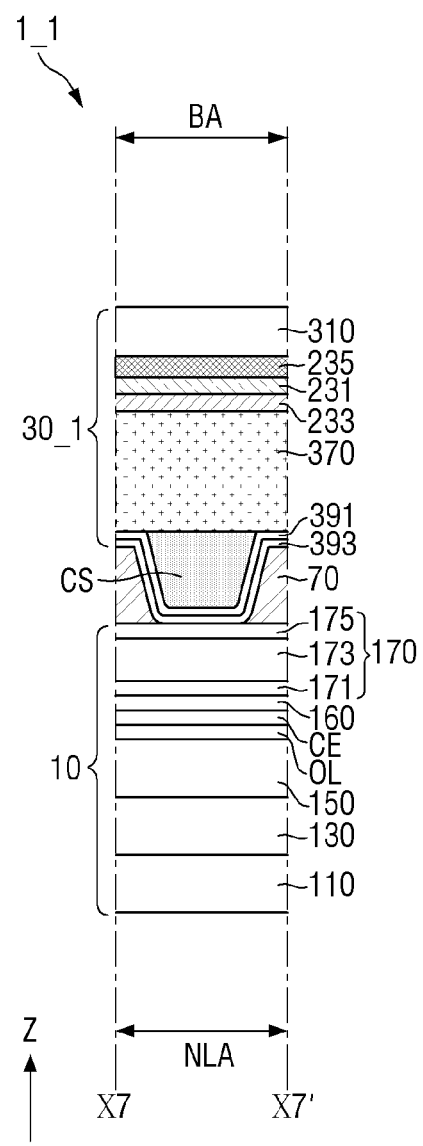
FIG. 20 is a cross-sectional view of a display device according to another embodiment taken along line X7-X7' of FIGS. 3 and 4.

FIG. 18 is a cross-sectional view of a display device according to another embodiment taken along line X3-X3' of FIGS. 3 and 4. FIG. 19 is a cross-sectional view of a display device according to another embodiment taken along line X5-X5' of FIGS. 3 and 4. FIG. 20 is a cross-sectional view of a display device according to another embodiment taken along line X7-X7' of FIGS. 3 and 4.

Referring to FIGS. 18 to 20, a display device 11 according to an embodiment includes the display substrate 10, a color conversion substrate 30_1, and the filler 70. The embodiment of the display device 1_1 shown in FIGS. 18 to 20 is substantially the same as the embodiment of FIGS. 5 to 7 except for the color conversion substrate 301, particularly, except that the color conversion substrate 30_1 further includes a third capping layer 391. Other features of the embodiment of FIGS. 18 to 20 and the embodiment of FIGS. 5 to 7 are substantially the same as or similar to each other. Thus, any repetitive detailed description thereof will be omitted and differences will be mainly described.

The third capping layer 391 may be positioned on the first optical pattern LR1, the second optical pattern LR2, the third optical pattern LR3, and the bank pattern 370. In some embodiments, the third capping layer 391 may be in direct contact with the first optical pattern LR1, the second optical pattern LR2, the third optical pattern LR3, and the bank pattern 370.

The column spacer CS may include or be made of the same material as that of the first optical pattern LR1, the second optical pattern LR2, and the third optical pattern LR3, and may be simultaneously formed through the same process. Accordingly, the third capping layer 391 may also cover the column spacer CS. In such an embodiment, the column spacer CS may be positioned between the bank pattern 370 and the third capping layer 391.

The third capping layer 391 can prevent contamination or damage of the first color filter 231, the second color filter 233, the third color filter 235 and the like due to infiltration of impurities such as moisture or air from the outside.

In some embodiments, the third capping layer 391 may include or be made of an inorganic material. In some embodiments, the third capping layer 391 may include or be made of the same material as the second capping layer 393, or may include at least one selected from the material described above with respect to the second capping layer 393.

The first wavelength conversion pattern 340, the second wavelength conversion pattern 350, and the light transmission pattern 330 may be positioned on the third capping layer 391. In some embodiments, the first wavelength conversion pattern 340, the second wavelength conversion pattern 350, and the light transmission pattern 330 may be in direct contact with the third capping layer 391.

The second capping layer 393 may be positioned on the bank pattern 370, the light transmission pattern 330, the first wavelength conversion pattern 340, and the second wavelength conversion pattern 350. In some embodiments, the second capping layer 393 may be in direct contact with the third capping layer 391 in the light blocking area BA.

Other configurations of the display device 1_1 may be substantially the same as those of the display device described above with reference to FIGS. 1 to 17.

Figure 21:
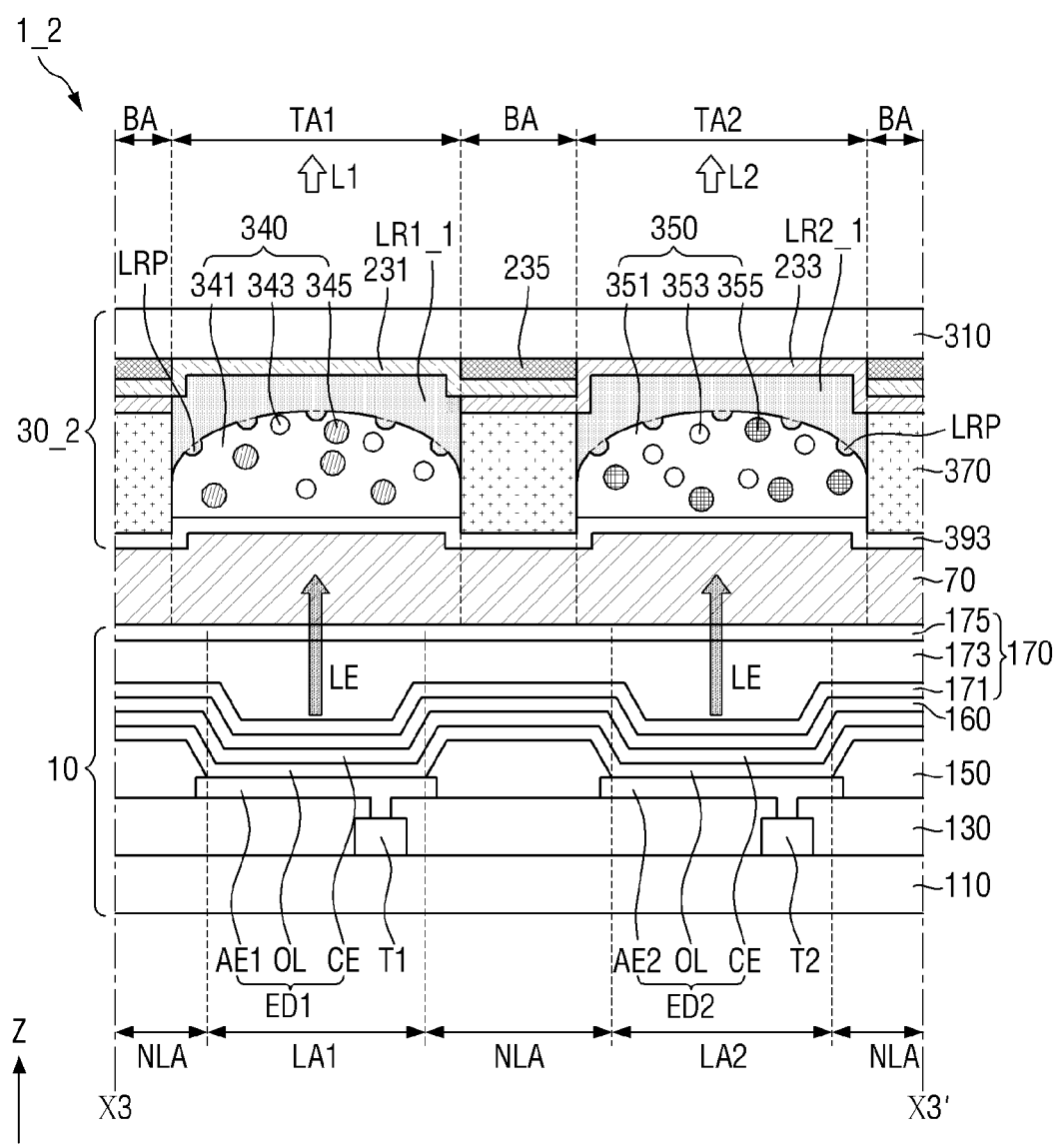
FIG. 21 is a cross-sectional view of a display device according to still another embodiment taken along line X3-X3' of FIGS. 3 and 4.
Figure 22:
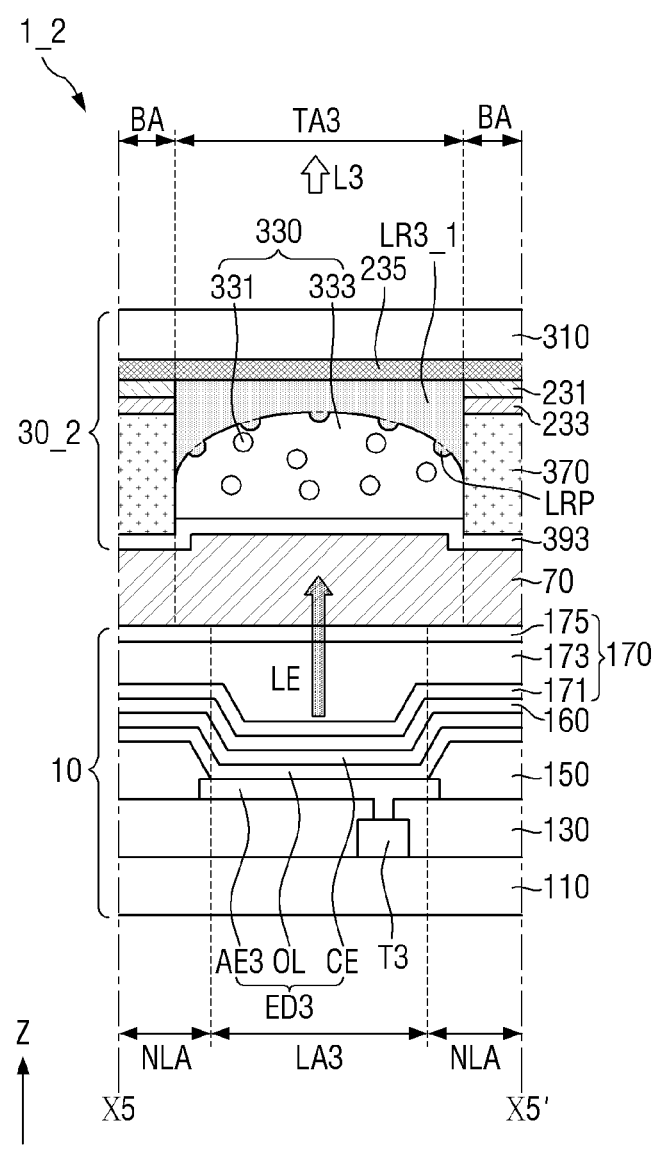
FIG. 22 is a cross-sectional view of a display device according to still another embodiment taken along line X5-X5' of FIGS. 3 and 4.
Figure 23:
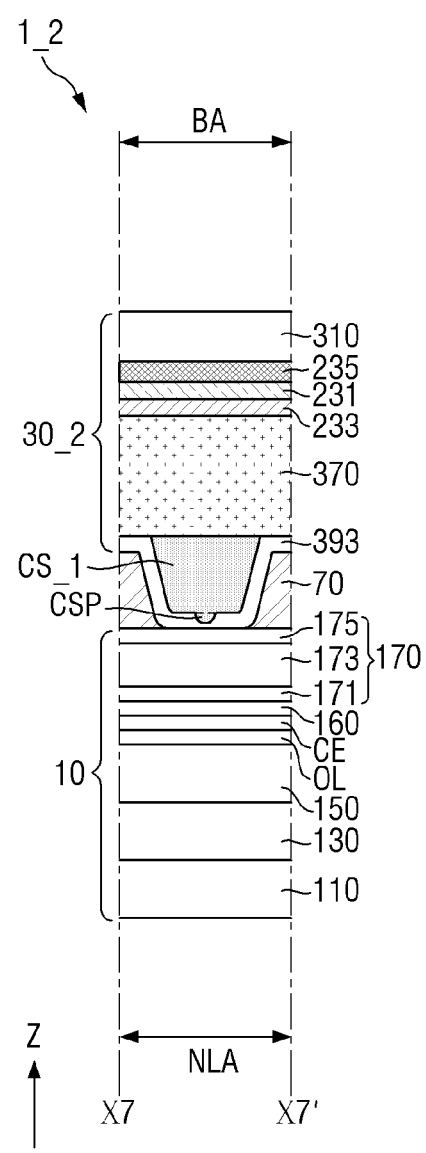
FIG. 23 is a cross-sectional view of a display device according to still another embodiment taken along line X7-X7' of FIGS. 3 and 4.

FIG. 21 is a cross-sectional view of a display device according to still another embodiment taken along line X3-X3' of FIGS. 3 and 4. FIG. 22 is a cross-sectional view of a display device according to still another embodiment taken along line X5-X5' of FIGS. 3 and 4. FIG. 23 is a cross-sectional view of a display device according to still another embodiment taken along line X7-X7' of FIGS. 3 and 4.

Referring to FIGS. 21 to 23, a display device 1_2 according to an embodiment includes the display substrate 10, a color conversion substrate 30_2, and the filler 70. The embodiment of the display device 1_2 shown in FIGS. 21 to 23 is substantially the same as the embodiment of FIGS. 5 to 7 except for the color conversion substrate 30_2, particularly, except for the configuration of a first optical pattern LR1_1, a second optical pattern LR2_1, a third optical pattern LR31, and a column spacer CS_1 of the color conversion substrate 30_2. Other features of embodiment of FIGS. 21 to 23 and the embodiment of FIGS. 5 to 7 are substantially the same as or similar to each other. Thus, any repetitive detailed description thereof will be omitted and differences will be mainly described.

Each of the first optical pattern LR1_1, the second optical pattern LR2_1, and the third optical pattern LR31 may include a convex pattern LRP protruding toward the first base portion 110 on one surface thereof. In some embodiments, the convex pattern LRP may be formed by inducing a gelation reaction in a process of heat-treating (or baking) the resin R (see FIG. 11) in which the particles P (see FIG. 11) are dispersed.

In some embodiments, the number of the convex patterns LRP that overlap each light transmitting area may be plural. For example, a plurality of convex patterns LRP that overlap the first light transmitting area TA1 or the first wavelength conversion pattern 340 may be provided.

As each optical pattern further includes the convex pattern LRP, the area of the reflection interface of each optical pattern, e.g., one surface of the first optical pattern LR1_1 facing the first wavelength conversion pattern 340, one surface of the second optical pattern LR2_1 facing the second wavelength conversion pattern 350, and one surface of the third optical pattern LR3_1 facing the light transmission pattern 330 may be increased, and thus the amount of recycled light may be increased.

The column spacer CS_1 may be formed in the same process using the same material as that of the first optical pattern LR1_1, the second optical pattern LR2_1, and the third optical pattern LR3_1. Accordingly, in some embodiments, the column spacer CS_1 may further include a convex pattern CSP protruding toward the first base portion 110.

Figure 24:
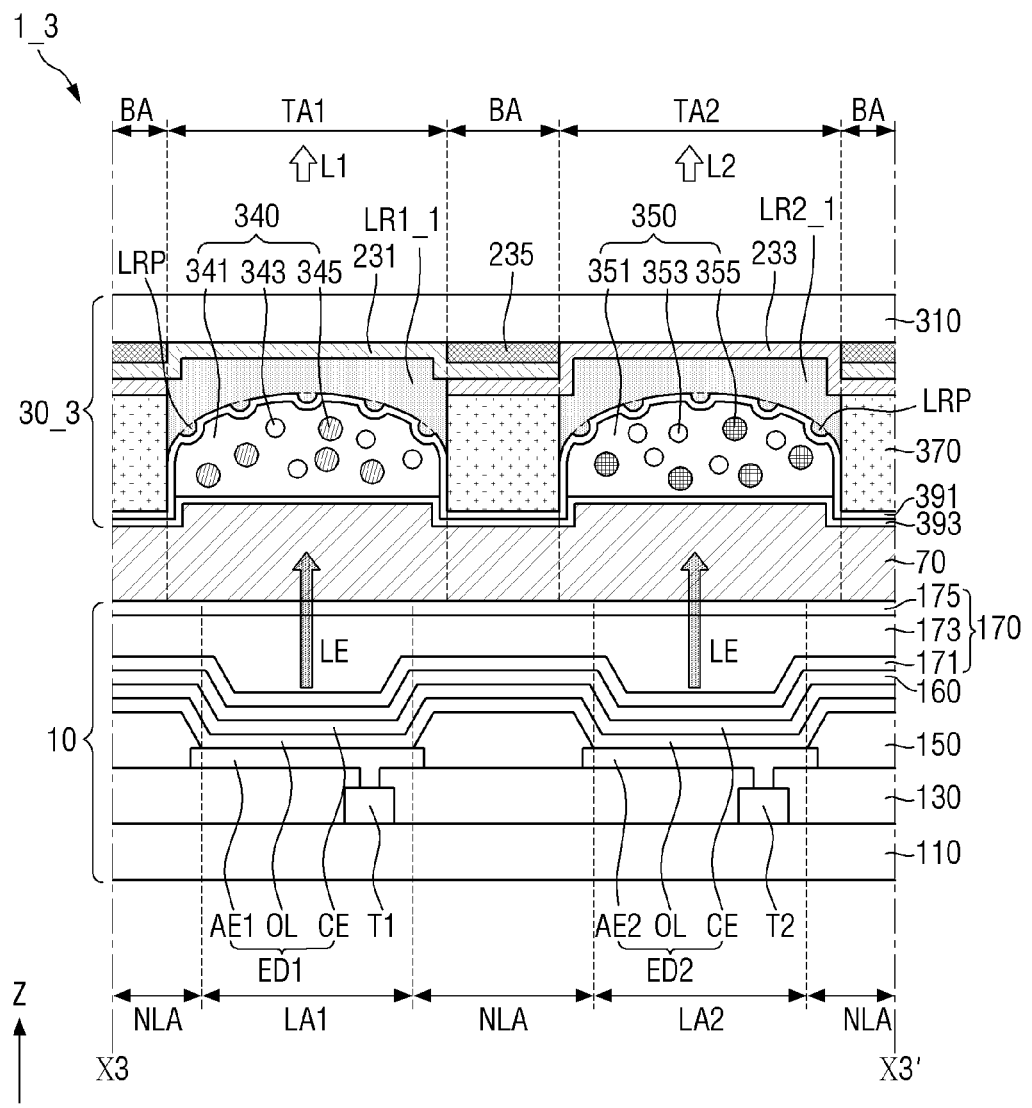
FIG. 24 is a cross-sectional view of a display device according to still another embodiment taken along line X3-X3' of FIGS. 3 and 4.
Figure 25:
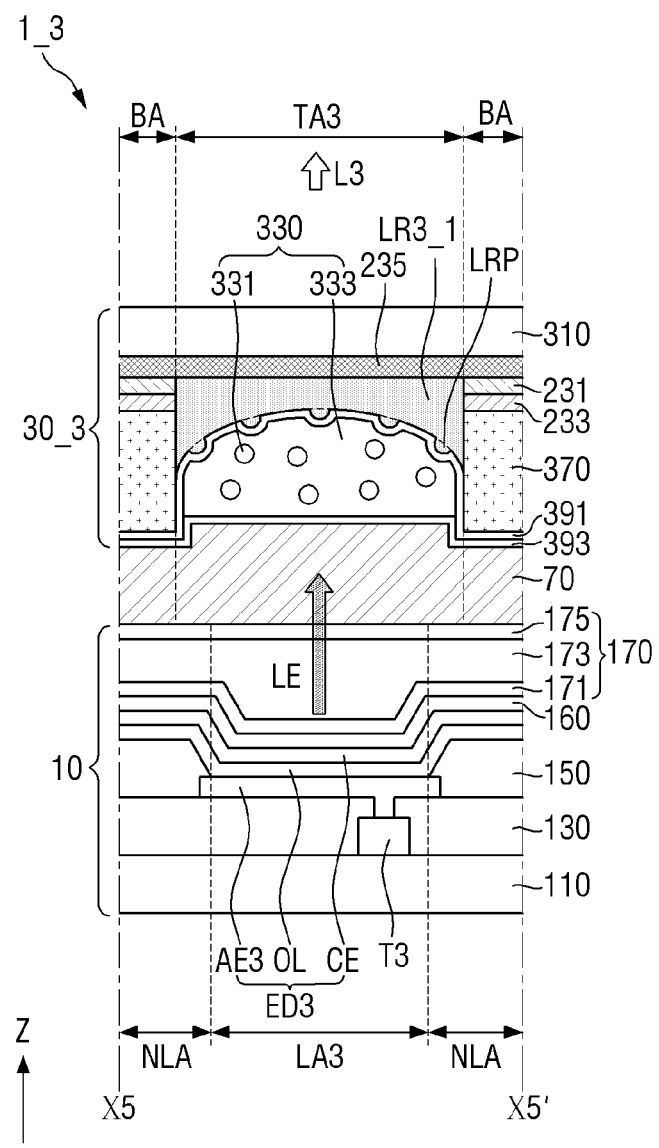
FIG. 25 is a cross-sectional view of a display device according to still another embodiment taken along line X5-X5' of FIGS. 3 and 4.
Figure 26:
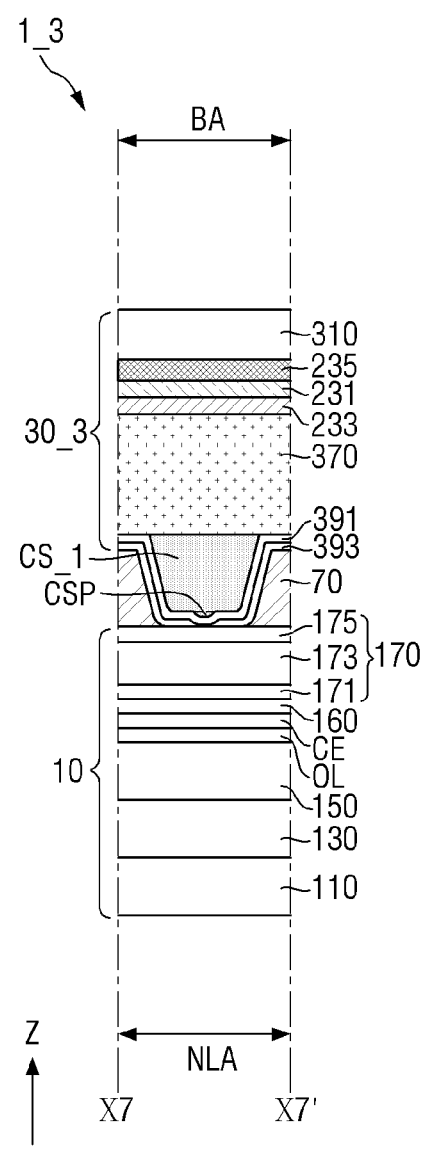
FIG. 26 is a cross-sectional view of a display device according to still another embodiment taken along line X7-X7' of FIGS. 3 and 4.

FIG. 24 is a cross-sectional view of a display device according to still another embodiment taken along line X3-X3' of FIGS. 3 and 4. FIG. 25 is a cross-sectional view of a display device according to still another embodiment taken along line X5-X5' of FIGS. 3 and 4. FIG. 26 is a cross-sectional view of a display device according to still another embodiment taken along line X7-X7' of FIGS. 3 and 4.

Referring to FIGS. 24 to 26, a display device 1_3 according to the present embodiment includes the display substrate 10, a color conversion substrate 30_3, and the filler 70. The embodiment of the display device 13 shown in FIGS. 24 to 26 is substantially the same as the embodiment of FIGS. 21 to 23 except that the color conversion substrate 30_3 further includes a third capping layer 391. Other features of the embodiment of the display device 13 of FIGS. 24 to 26 and the embodiment of FIGS. 21 to 23 are substantially the same as or similar to each other. Thus, any repetitive detailed description thereof will be omitted and differences will be mainly described.

The third capping layer 391 may be positioned on the first optical pattern LR1_1, the second optical pattern LR2_1, and the third optical pattern LR3_1, and may further cover the convex pattern LRP. In addition, when the column spacer CS_1 further includes the convex pattern CSP, the third capping layer 391 may further cover the convex pattern CSP of the column spacer CS_1.

A detailed description of other features the third capping layer 391, which are the same as those described above with reference to FIGS. 17 to 19, will be omitted.

Figure 27:
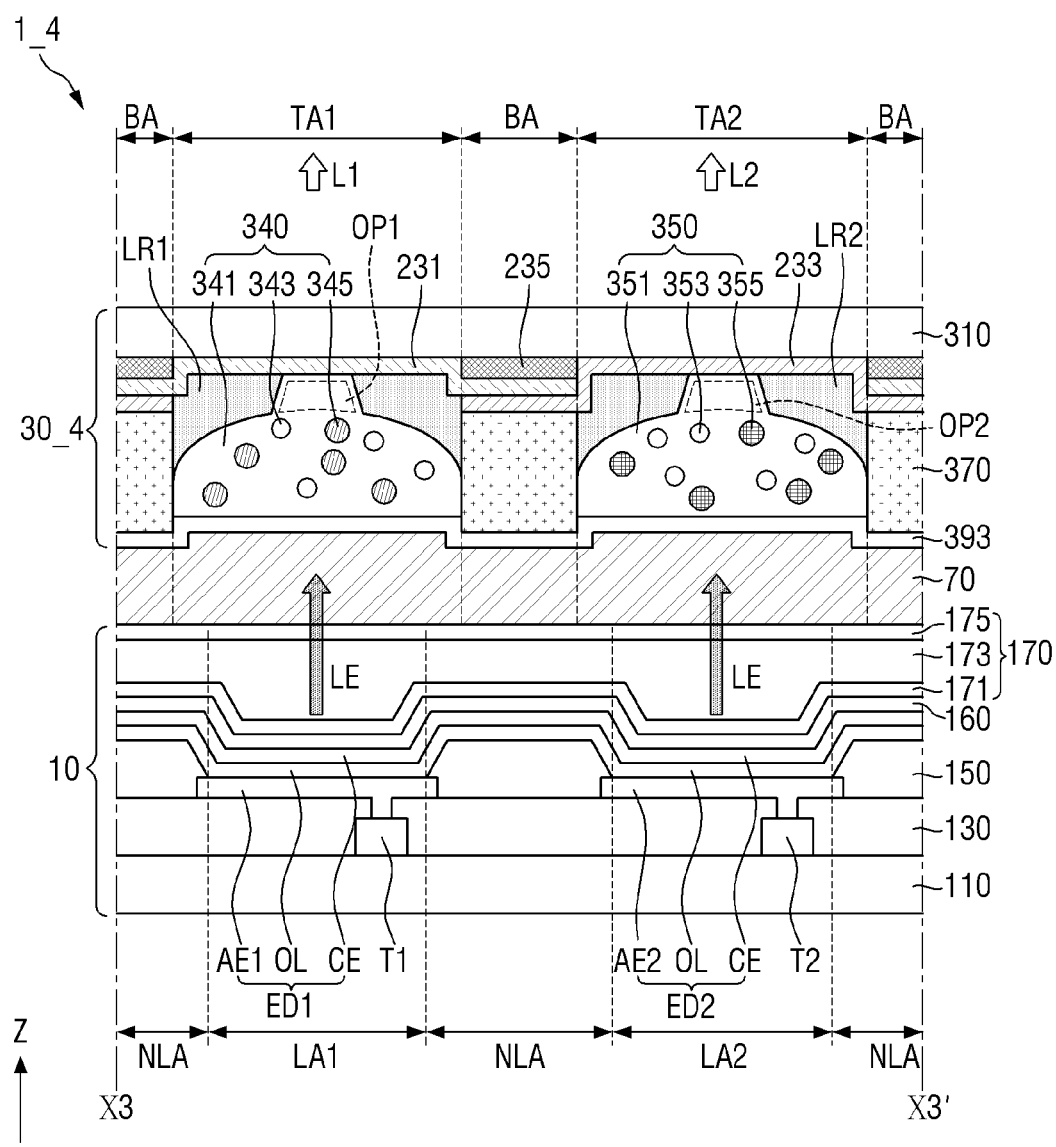
FIG. 27 is a cross-sectional view of a display device according to still another embodiment taken along line X3-X3' of FIGS. 3 and 4.
Figure 28:
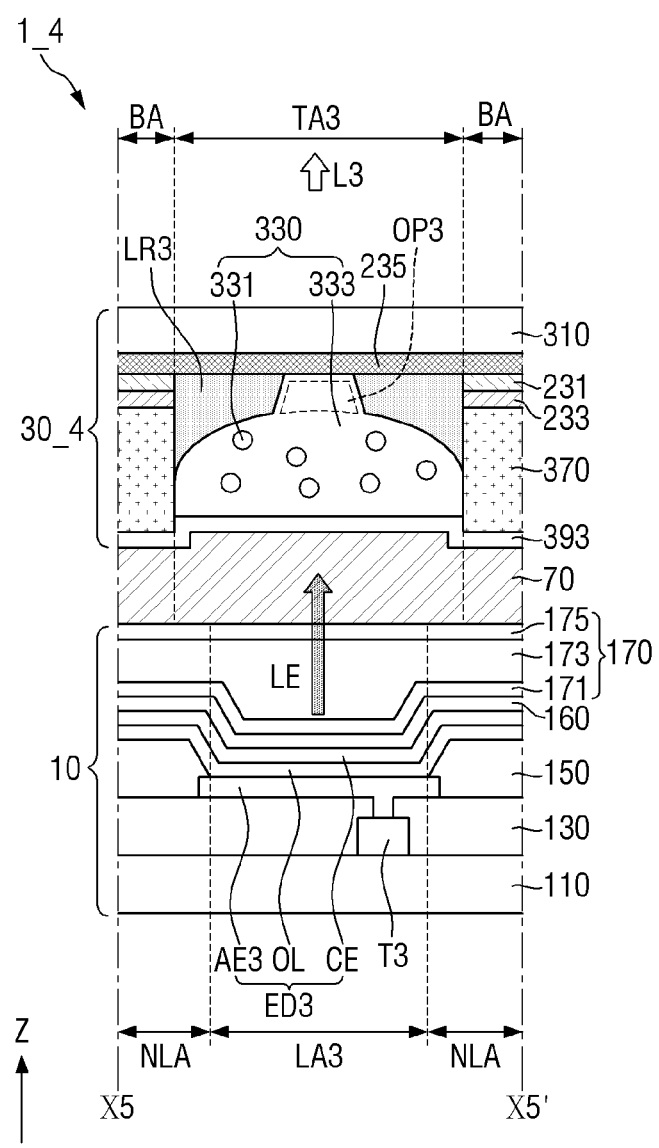
FIG. 28 is a cross-sectional view of a display device according to still another embodiment taken along line X5-X5' of FIGS. 3 and 4.
Figure 29:
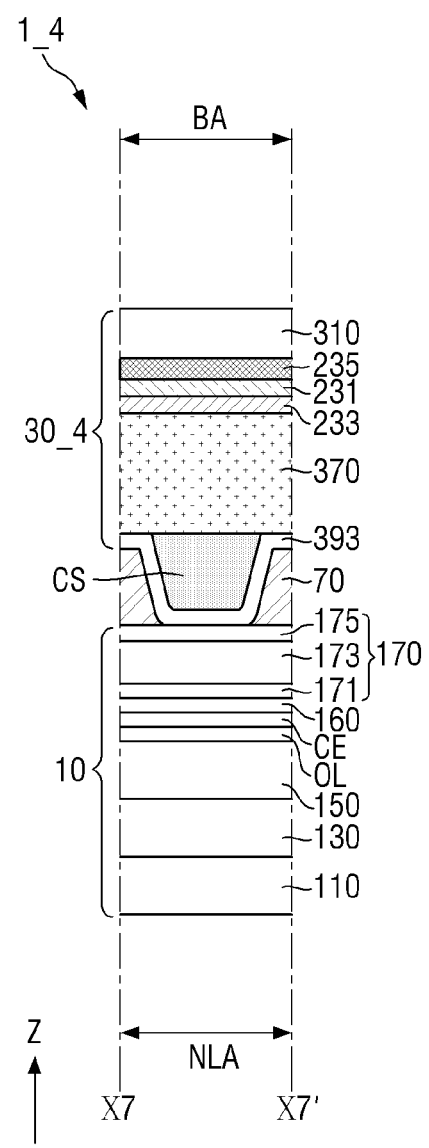
FIG. 29 is a cross-sectional view of a display device according to still another embodiment taken along line X7-X7' of FIGS. 3 and 4.
Figure 30:
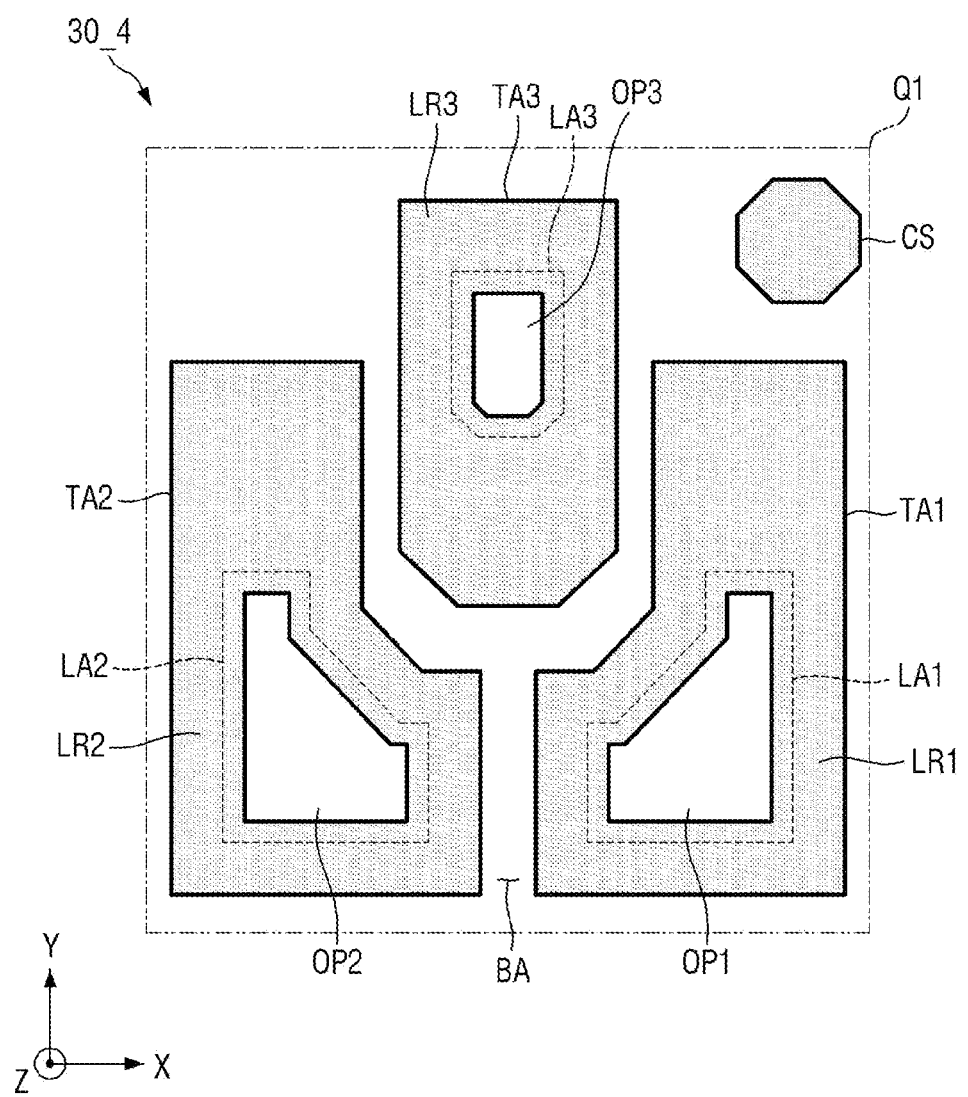
FIG. 30 is a plan view illustrating a schematic arrangement of an optical pattern and a column spacer in a color conversion substrate of a display device according to still another embodiment.

FIG. 27 is a cross-sectional view of a display device according to still another embodiment taken along line X3-X3' of FIGS. 3 and 4. FIG. 28 is a cross-sectional view of a display device according to still another embodiment taken along line X5-X5' of FIGS. 3 and 4. FIG. 29 is a cross-sectional view of a display device according to still another embodiment taken along line X7-X7' of FIGS. 3 and 4. FIG. 30 is a plan view illustrating a schematic arrangement of an optical pattern and a column spacer in a color conversion substrate of a display device according to still another embodiment.

Referring to FIGS. 27 to 30, a display device 1_4 according to an embodiment includes the display substrate 10, a color conversion substrate 30_4, and the filler 70. The embodiment of the display device 1_4 shown in FIGS. 27 to 30 is substantially the same as the embodiment of FIGS. 5 to 7 except for the color conversion substrate 30_4, particularly, except that a first opening OP1, a second opening OP2, and a third opening OP3 are further formed in the optical patterns LR1, LR2, and LR3 of the color conversion substrate 30_4. Other features of the embodiment of FIGS. 27 to 30 and the embodiment of FIGS. 5 to 7 are substantially the same as or similar to each other. Thus, any repetitive detailed description thereof will be omitted and differences will be mainly described.

The first opening OP1 that overlaps the first light transmitting area TA1 may be defined in the first optical pattern LR1, the second opening OP2 that overlaps the second light transmitting area TA2 may be defined in the second optical pattern LR2, and the third opening OP3 that overlaps the third light transmitting area TA3 may be defined in the third optical pattern LR3.

In some embodiments, the first color filter 231 may be partially exposed through the first opening OP1, the second color filter 233 may be partially exposed through the second opening OP2, and the third color filter 235 may be partially exposed through the third opening OP3.

In some embodiments, the first wavelength conversion pattern 340 may be disposed in the first opening OP1, the second wavelength conversion pattern 350 may be disposed in the second opening OP2, and the light transmission pattern 330 may be disposed in the third opening OP3.

The first opening OP1 may overlap the first emission area LAT. In some embodiments, in a plan view, as shown in FIG. 30, the size of the first opening OP1 may be smaller than that of the first emission area LA1, and the first opening OP1 may be completely surrounded by the edge of the first emission area LA1.

Similarly to the first opening OP1, the second opening OP2 may overlap the second emission area LA2, the size of the second opening OP2 may be smaller than that of the second emission area LA2, and the second opening OP2 may be completely surrounded by the edge of the second emission area LA2 in a plan view.

In addition, the third opening OP3 may overlap the third emission area LA3, the size of the third opening OP3 may be smaller than that of the third emission area LA3, and the third opening OP3 may be completely surrounded by the edge of the third emission area LA3 in a plan view.

In some embodiments, in a plan view, any one of the size of the first opening OP1, the size of the second opening OP2, and the size of the third opening OP3 may be different from another one thereof. For example, when the size of the first emission area LA1 and the size of the second emission area LA2 are larger than the size of the third emission area LA3, the size of the third opening OP3 may be smaller than that of the first opening OP1 and that of the second opening OP2.

As the first opening OP1, the second opening OP2, and the third opening OP3 are further provided, among external light incident to the display device 1_4 from the outside, a component reflected from the surfaces of the first optical pattern LR1, the second optical pattern LR2, and the third optical pattern LR3 may be reduced. That is, as the first opening OPT, the second opening OP2, and the third opening OP3 are further provided, external light reflection occurring in the first optical pattern LR1, the second optical pattern LR2, and the third optical pattern LR3 may be reduced.

In an embodiment, as illustrated in the drawings that one first opening OP1, one second opening OP2, and one third opening OP3 are formed, but this is merely an example. In another embodiment, two or more first openings OP1, second openings OP2, and third openings OP3 may be formed.

Figure 31:
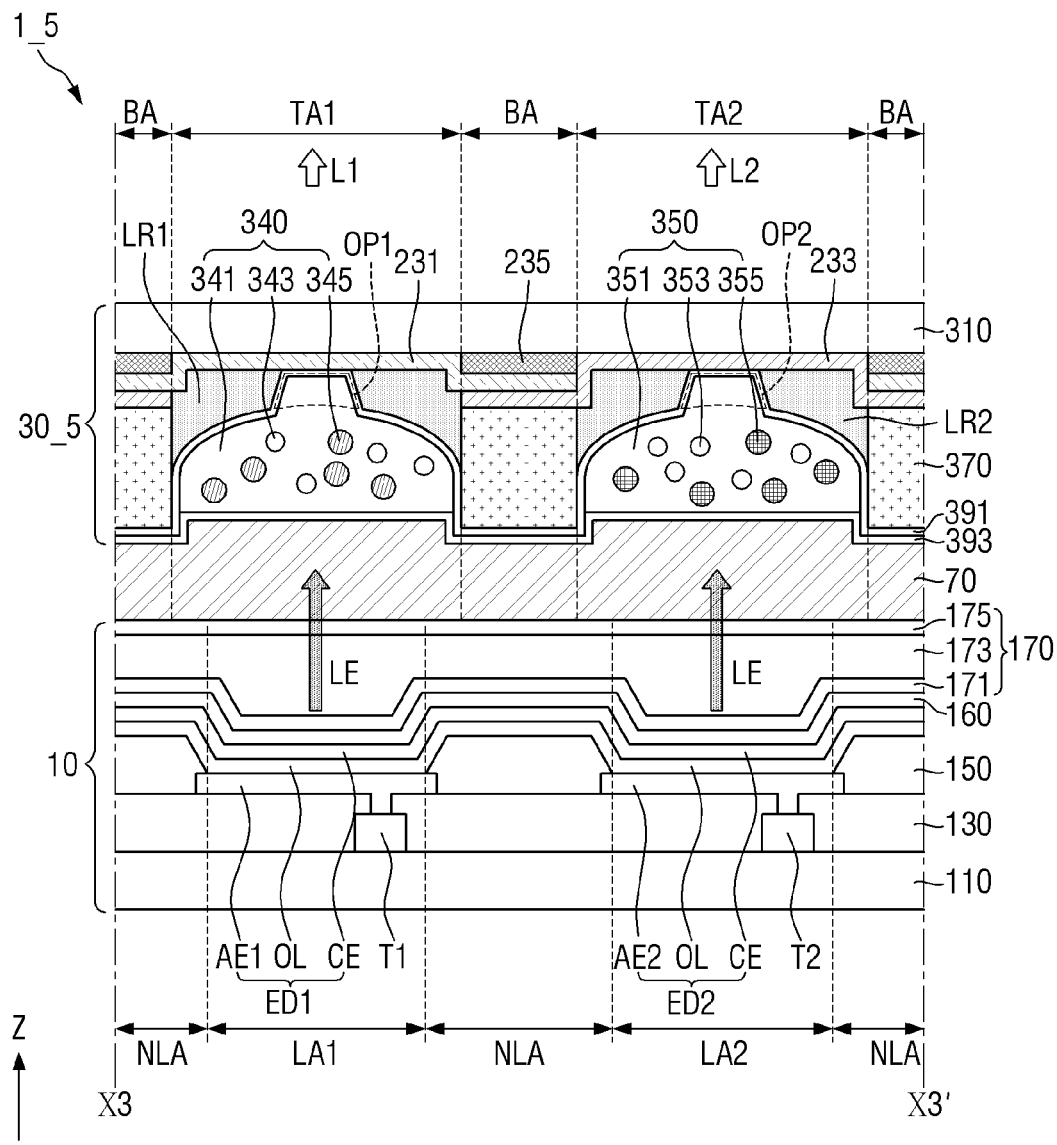
FIG. 31 is a cross-sectional view of a display device according to still another embodiment taken along line X1-X1' of FIGS. 3 and 4.
Figure 32:
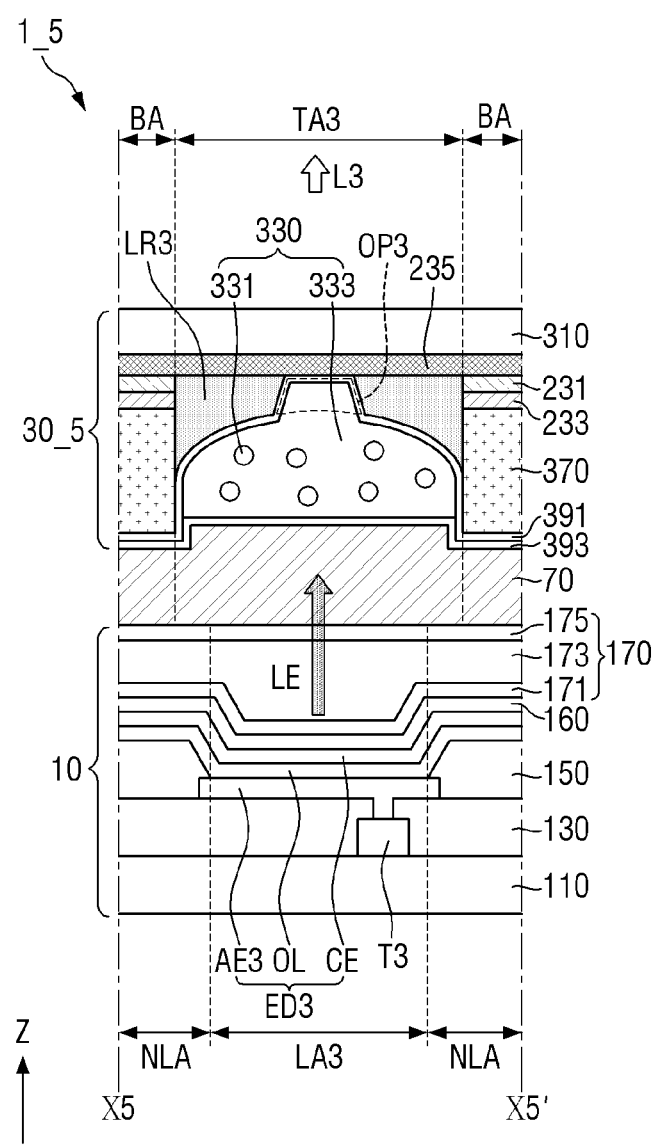
FIG. 32 is a cross-sectional view of a display device according to still another embodiment taken along line X3-X3' of FIGS. 3 and 4.
Figure 33:
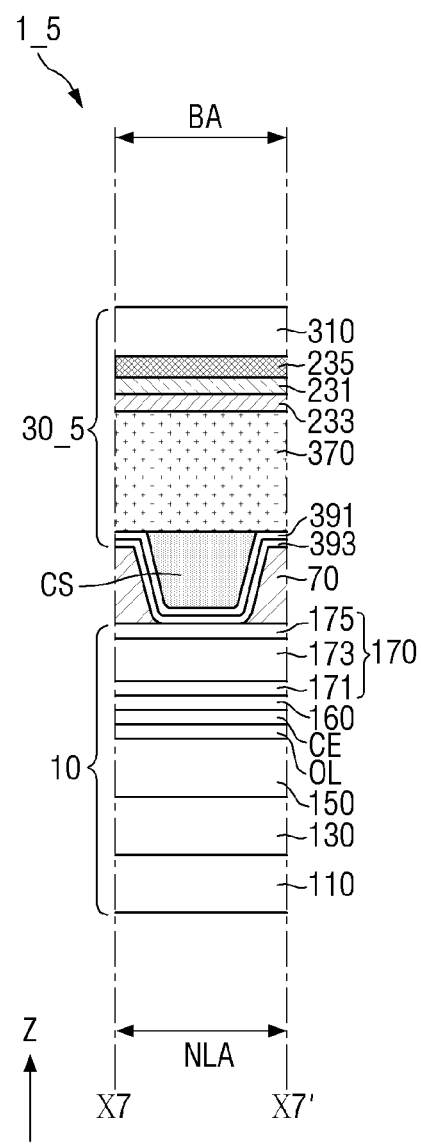
FIG. 33 is a cross-sectional view of a display device according to still another embodiment taken along line X5-X5' of FIGS. 3 and 4.

FIG. 31 is a cross-sectional view of a display device according to still another embodiment taken along line X1-X1' of FIGS. 3 and 4. FIG. 32 is a cross-sectional view of a display device according to still another embodiment taken along line X3-X3' of FIGS. 3 and 4. FIG. 33 is a cross-sectional view of a display device according to still another embodiment taken along line X5-X5' of FIGS. 3 and 4.

Referring to FIGS. 31 to 33, a display device 1_5 according to an embodiment includes the display substrate 10, a color conversion substrate 30_5, and the filler 70. The embodiment of the display device 1_5 shown in FIGS. 31 to 33 is substantially the same as the embodiment of FIGS. 27 to 30 except that the color conversion substrate 30_5 further includes a third capping layer 391. Other features of the embodiment of FIGS. 31 to 33 and the embodiment of FIGS. 27 to 30 are substantially the same as or similar to each other. Thus, any repetitive detailed description thereof will be omitted and differences will be mainly described.

The third capping layer 391 may be positioned on the first optical pattern LR1, the second optical pattern LR2, and the third optical pattern LR3, and may cover the side surface of the first optical pattern LR1 defining the first opening OP1, the side surface of the second optical pattern LR2 defining the second opening OP2, and the side surface of the third optical pattern LR3 defining the third opening OP3.

In some embodiments, the third capping layer 391 may be in contact with the first color filter 231 exposed through the first opening OP1, the second color filter 233 exposed through the second opening OP2, and the third color filter 235 exposed through the third opening OP3.

A detailed description of other features of the third capping layer 391, which are the same as those described with reference to FIGS. 18 to 20, will be omitted.

Figure 34:
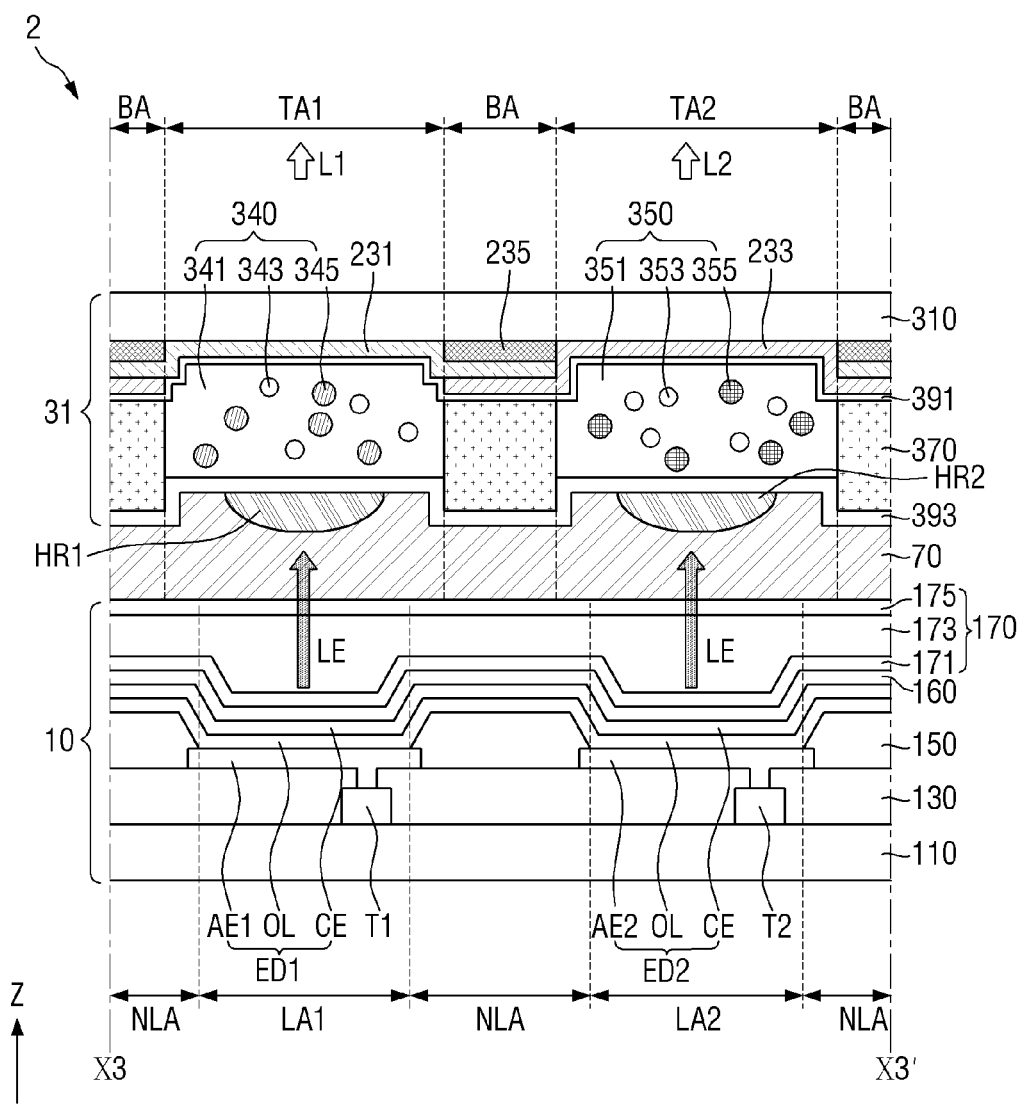
FIG. 34 is a cross-sectional view of a display device according to still another embodiment taken along line X3-X3' of FIGS. 3 and 4.
Figure 35:
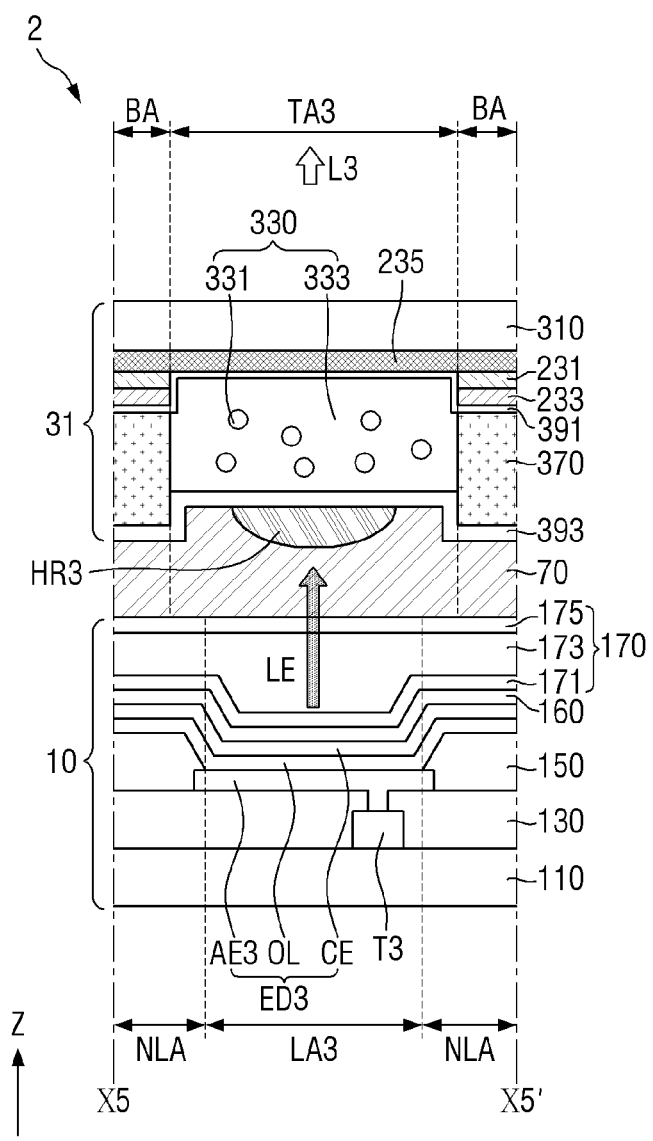
FIG. 35 is a cross-sectional view of a display device according to still another embodiment taken along line X5-X5' of FIGS. 3 and 4.
Figure 36:
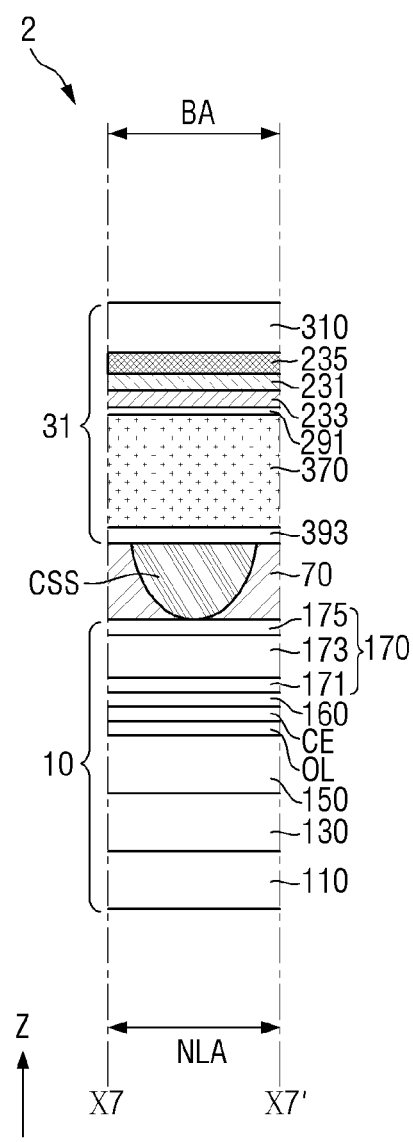
FIG. 36 is a cross-sectional view of a display device according to still another embodiment taken along line X7-X7' of FIGS. 3 and 4.
Figure 37:
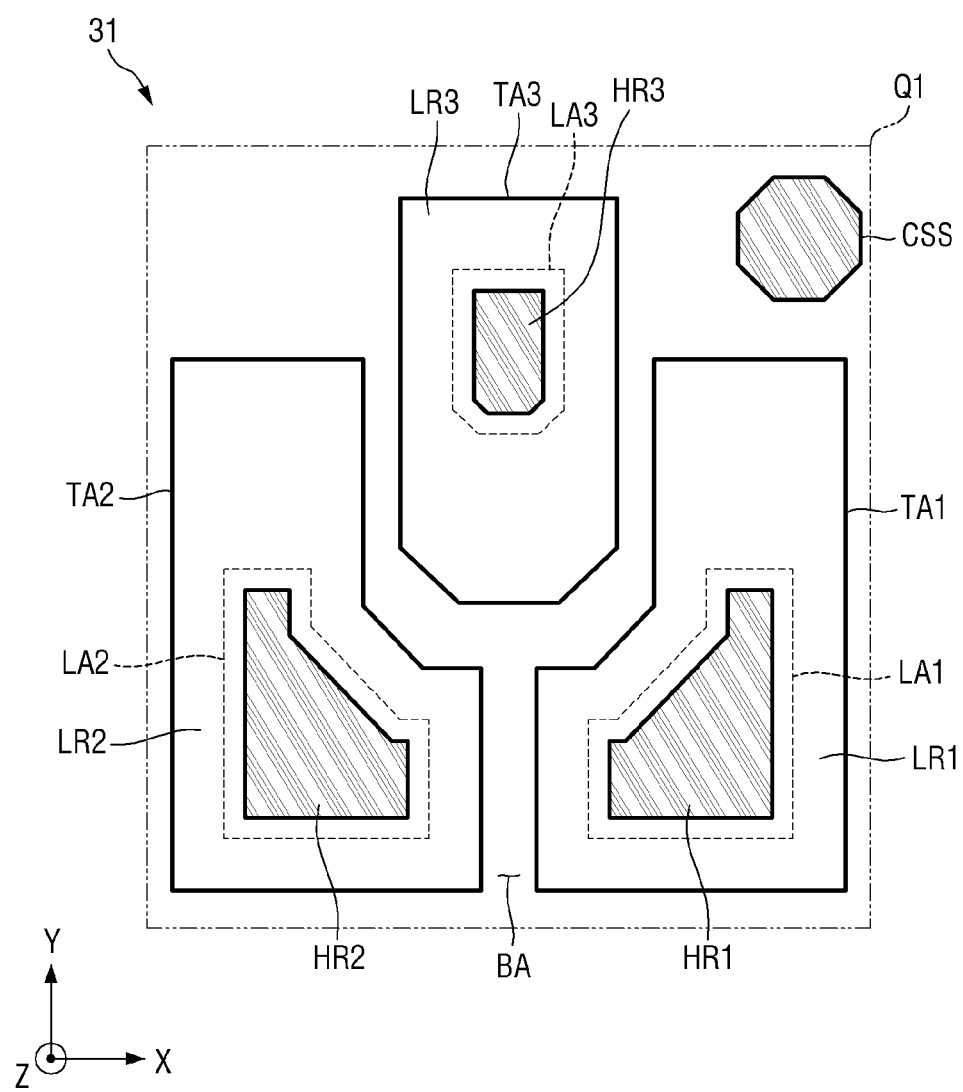
FIG. 37 is a plan view illustrating a schematic arrangement of an optical pattern and a column spacer in a color conversion substrate of a display device according to still another embodiment.

FIG. 34 is a cross-sectional view of a display device according to still another embodiment taken along line X3-X3' of FIGS. 3 and 4. FIG. 35 is a cross-sectional view of a display device according to still another embodiment taken along line X5-X5' of FIGS. 3 and 4. FIG. 36 is a cross-sectional view of a display device according to still another embodiment taken along line X7-X7' of FIGS. 3 and 4. FIG. 37 is a plan view illustrating a schematic arrangement of an optical pattern and a column spacer in a color conversion substrate of a display device according to still another embodiment.

Referring to FIGS. 34 to 37, a display device 2 according to an embodiment includes the display substrate 10, a color conversion substrate 31, and the filler 70. The embodiment of the display device 2 shown in FIGS. 34 to 37 is substantially the same as the embodiment of FIGS. 5 to 7 except that the color conversion substrate 31 includes a first optical pattern HR1, a second optical pattern HR2, a third optical pattern HR3, and a column spacer CSS, and further includes a third capping layer 391, without including the first optical pattern LR1 (see FIG. 5), the second optical pattern LR2 (see FIG. 5), the third optical pattern LR3 (see FIG. 6), and the column spacer CS (see FIG. 7) shown in FIGS. 5 to 7. Other features of the embodiment of FIGS. 34 to 37 and the embodiment of FIGS. 5 to 7 are substantially the same as or similar to each other. Thus, any repetitive detailed description thereof will be omitted and differences will be mainly described.

A third capping layer 391 covering the first color filter 231, the second color filter 233 and the third color filter 235 may be disposed on one surface of the second base portion 310. In some embodiments, the third capping layer 391 may be in direct contact with the first color filter 231, the second color filter 233 and the third color filter 235.

The bank pattern 370 may be positioned on one surface of the third capping layer 391 facing the display substrate 10. In some embodiments, the bank pattern 370 may be positioned directly on one surface of the third capping layer 391 and may be in direct contact with the third capping layer 391.

The first wavelength conversion pattern 340, the second wavelength conversion pattern 350, and the light transmission pattern 330 may be positioned on the third capping layer 391. The first wavelength conversion pattern 340, the second wavelength conversion pattern 350, and the light transmission pattern 330 may be located in a space partitioned by the bank pattern 370. In some embodiments, the first wavelength conversion pattern 340, the second wavelength conversion pattern 350, and the light transmission pattern 330 may be in contact with the third capping layer 391.

The second capping layer 393 may be positioned on the bank pattern 370, the light transmission pattern 330, the first wavelength conversion pattern 340, and the second wavelength conversion pattern 350. The second capping layer 393 may cover the light transmission pattern 330, the first wavelength conversion pattern 340, and the second wavelength conversion pattern 350.

The first optical pattern HR1, the second optical pattern HR2, the third optical pattern HR3, and the column spacer CSS may be positioned on the second capping layer 393.

The first optical pattern HR1 may overlap the first light transmitting area TA1 or the first wavelength conversion pattern 340. The second optical pattern HR2 may overlap the second light transmitting area TA2 or the second wavelength conversion pattern 350, and the third optical pattern HR3 may overlap the third light transmitting area TA3 or the light transmission pattern 330.

In some embodiments, the first optical pattern HR1, the second optical pattern HR2, and the third optical pattern HR3 may have a shape protruding toward the display substrate 10, and one surface of the first optical pattern HR1, one surface of the second optical pattern HR2, and one surface of the third optical pattern HR3 facing the filler 70 may each include a curved surface. In some embodiments, one surface of the first optical pattern HR1, one surface of the second optical pattern HR2, and one surface of the third optical pattern HR3 facing the filler 70 may each have a convex lens shape.

The first optical pattern HR1 may overlap the first emission area LA1. In some embodiments, in a plan view, as shown in FIG. 37, the size of the first optical pattern HR1 may be smaller than that of the first emission area LA1, and the edge of the first optical pattern HR1 may be completely surrounded by the edge of the first emission area LA1.

Similarly to the first optical pattern HR1, the second optical pattern HR2 may overlap the second emission area LA2, the size of the second optical pattern HR2 may be smaller than that of the second emission area LA2, and the edge of the second optical pattern HR2 may be completely surrounded by the edge of the second emission area LA2 in a plan view.

In addition, the third optical pattern HR3 may overlap the third emission area LA3, the size of the third optical pattern HR3 may be smaller than that of the third emission area LA3, and the edge of the third optical pattern HR3 may be completely surrounded by the edge of the third emission area LA3 in a plan view.

In some embodiments, in a plan view, any one of the size of the first optical pattern HR1, the size of the second optical pattern HR2, and the size of the third optical pattern HR3 may be different from another one thereof. For example, in an embodiment where the size of the first emission area LA1 and the size of the second emission area LA2 are larger than the size of the third emission area LA3, the size of the first optical pattern HR1 and the size of the second optical pattern HR2 may be larger than the size of the third optical pattern HR3.

The first optical pattern HR1, the second optical pattern HR2, and the third optical pattern HR3 may be spaced apart from the thin film encapsulation layer 170 of the display substrate 10. The filler 70 may be positioned between the thin film encapsulation layer 170 and the first optical pattern HR1, the second optical pattern HR2, and the third optical pattern HR3. The first optical pattern HR1, the second optical pattern HR2, and the third optical pattern HR3 may be in direct contact with the filler 70 and spaced apart from the thin film encapsulation layer 170 with the filler 70 interposed therebetween.

In some embodiments, the first optical pattern HR1, the second optical pattern HR2, and the third optical pattern HR3 may include or be made of the same material and may be simultaneously formed in the same process. In some embodiments, the first optical pattern HR1, the second optical pattern HR2, and the third optical pattern HR3 may be formed of a material having a high refractive index.

In some embodiments, the refractive index of the first optical pattern HR1, the refractive index of the second optical pattern HR2, and the refractive index of the third optical pattern HR3 may be greater than the refractive index of the filler 70. For example, in an embodiment where the refractive index of the filler 70 is in a range of 1.4 to 1.7, the refractive index of the first optical pattern HR1 may be in a range of 1.8 to 2.5.

In some embodiments, a material having the high refractive index included in the first optical pattern HR1, the second optical pattern HR2, and the third optical pattern HR3 may be an organic material. For example, the first optical pattern HR1, the second optical pattern HR2, and the third optical pattern HR3 may include at least one high refractive material selected from poly(3,4-ethylenedioxythiophene) (PEDOT), 4,4'-bis[N-(3-methylphenyl)-N-phenyl amino]biphenyl (TPD), 4,4',4"-tris[(3-methylphenyl) phenyl amino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4'-bis[N,N-bis(3-methylphenyl)-Amino]-diphenylmethane (BPPM), 4,4'-dicarbazolyl-1,1'-biphenyl (CBP), 4,4',4"-tris(N-carbazole)triphenylamine (TCTA), 2,2′,2″-(1,3,5-benzenetolyl)tris-[1-phenyl-1H-benzoimidazole] (TPBI), and 3-(4-biphenyl)-4-phenyl-5-t-butylphenyl-1,2,4-triazole (TAZ). In some embodiments, the high refractive material included in the first optical pattern HR1, the second optical pattern HR2, and the third optical pattern HR3 may have photosensitivity.

However, the present disclosure is not limited thereto. In addition, the high refractive material included in the first optical pattern HR1, the second optical pattern HR2, and the third optical pattern HR3 may be a mixture of an inorganic material and an organic material. In an embodiment where the high refractive material included in the first optical pattern HR1, the second optical pattern HR2, and the third optical pattern HR3 is formed of an organic material, the high refractive material may include a material other than those exemplified above.

As described above, the refractive index of the first optical pattern HR1, the refractive index of the second optical pattern HR2, and the refractive index of the third optical pattern HR3 may be greater than the refractive index of the filler 70. Accordingly, when the light LE provided from the display substrate 10 is incident on the first optical pattern HR1, the second optical pattern HR2, and the third optical pattern HR3 via the filler 70, the refraction angle of the light may become smaller than the incident angle thereof, and accordingly, the straightness of the light may be relatively improved. Accordingly, the amount of light provided to the first wavelength conversion pattern 340, the second wavelength conversion pattern 350, and the light transmission pattern 330 may be increased, and as a result, the light efficiency of the display device 2 may be improved. In addition, as the first optical pattern HR1, the second optical pattern HR2, and the third optical pattern HR3 have a convex lens shape, light may be more concentrated on the first wavelength conversion pattern 340, the second wavelength conversion pattern 350, and the light transmission pattern 330, and accordingly, the amount of light provided to the first wavelength conversion pattern 340, the second wavelength conversion pattern 350, and the light transmission pattern 330 may further increase.

Figure 40:
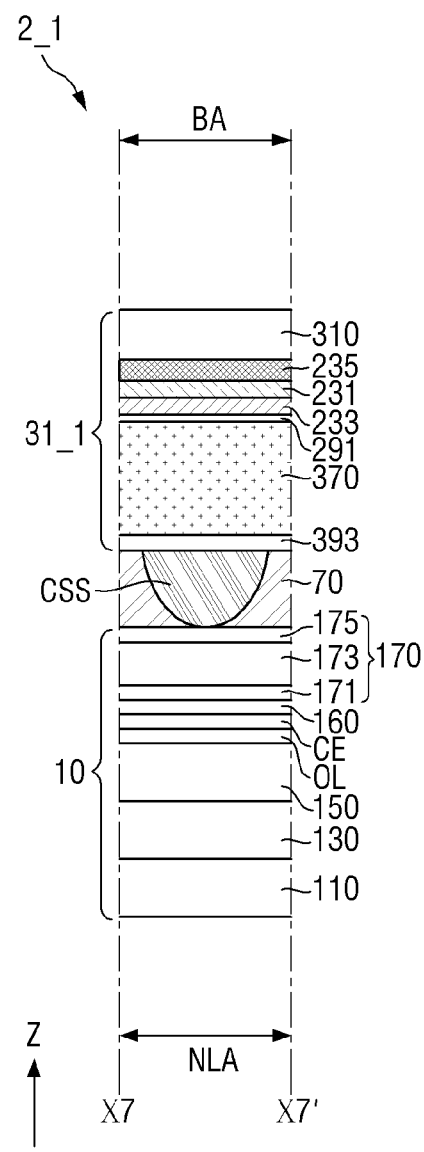
FIG. 40 is a cross-sectional view of a display device according to still another embodiment taken along line X7-X7' of FIGS. 3 and 4.

As shown in FIGS. 36 and 40, the column spacer CSS may be positioned on the second capping layer 393. As described above, the column spacer CSS may maintain a gap between the display substrate 10 and the color conversion substrate 31 to be substantially constant.

In some embodiments, the column spacers CSS may be positioned directly on the second capping layer 393 and be in direct contact with the second capping layer 393. In addition, the column spacer CSS may be in direct contact with the thin film encapsulation layer 170 of the display substrate 10. For example, the column spacer CSS may be in direct contact with the upper inorganic layer 175 of the thin film encapsulation layer 170.

In some embodiments, the column spacer CSS may include or be made of the same material as that of the first optical pattern HR1, the second optical pattern HR2, and the third optical pattern HR3, and may be simultaneously formed through the same process (e.g., photoresist process and the like) as that of the first optical pattern HR1, the second optical pattern HR2, and the third optical pattern HR3.

Since the column spacer CSS includes or is made of the same material as that of the first optical pattern HR1, the second optical pattern HR2, and the third optical pattern HR3, in some embodiments, the refractive index of the column spacer CSS may be the same as that of the first optical pattern HR1, and may be greater than that of the filler 70. In some embodiments, the refractive index of the column spacer CSS may be about 1.8 or more and 2.5 or less.

As described above, the display device 2 according to an embodiment includes the first optical pattern HR1, the second optical pattern HR2, and the third optical pattern HR3 having a refractive index relatively higher than that of the filler 70, such that the light use efficiency is improved. In addition, since the first optical pattern HR1, the second optical pattern HR2, and the third optical pattern HR3 can be formed together in a process of forming the column spacer CSS, the manufacturing process may be simplified.

Figure 38:
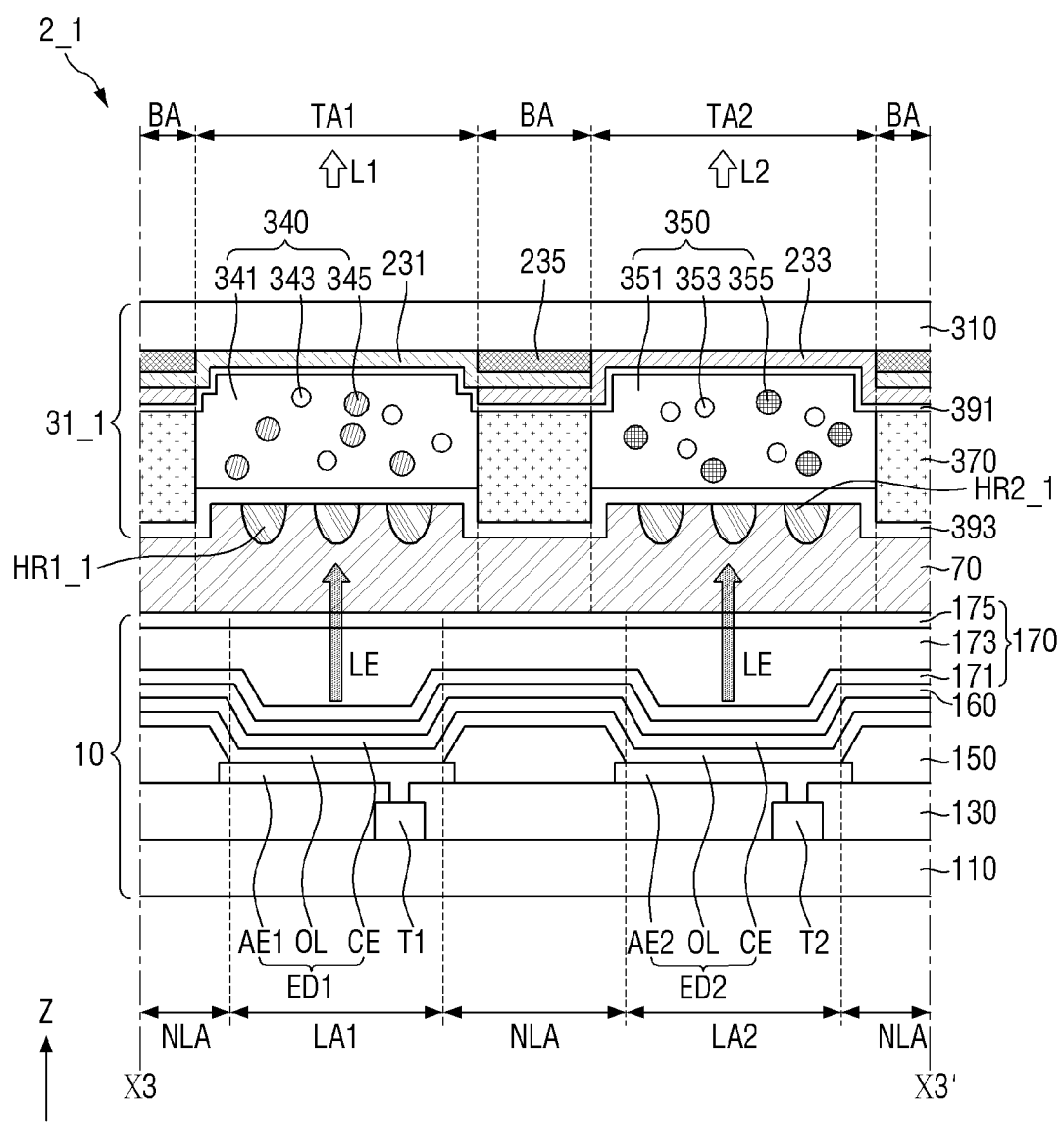
FIG. 38 is a cross-sectional view of a display device according to still another embodiment taken along line X3-X' of FIGS. 3 and 4.
Figure 39:
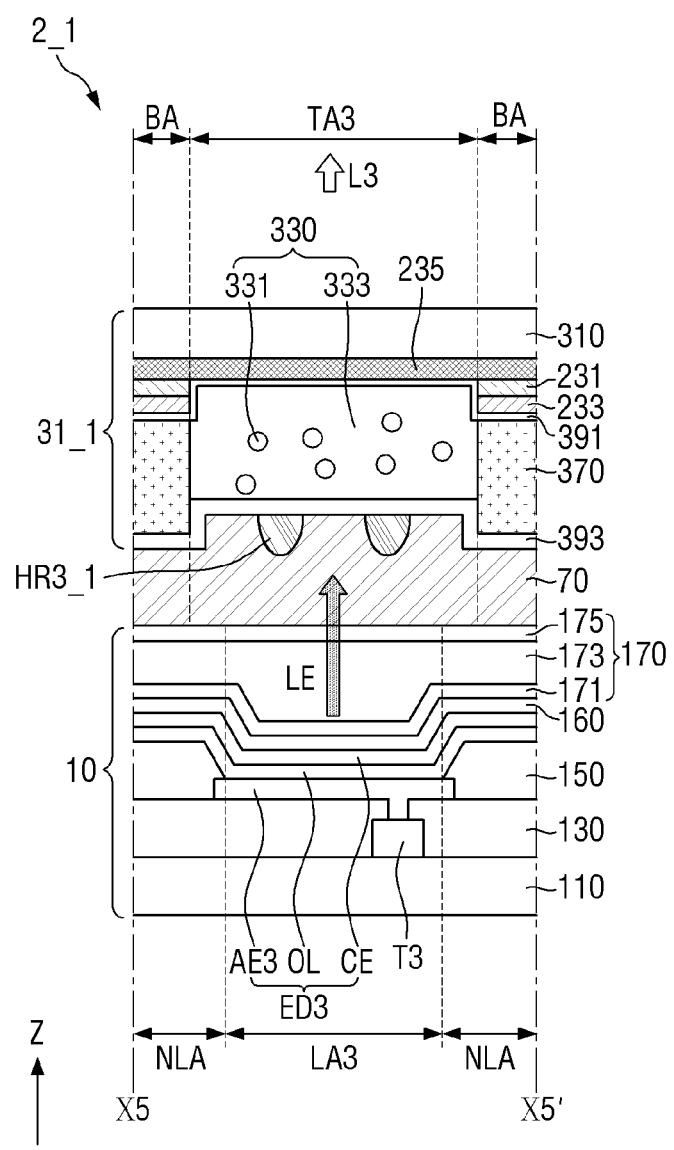
FIG. 39 is a cross-sectional view of a display device according to still another embodiment taken along line X5-X5' of FIGS. 3 and 4.
Figure 41:
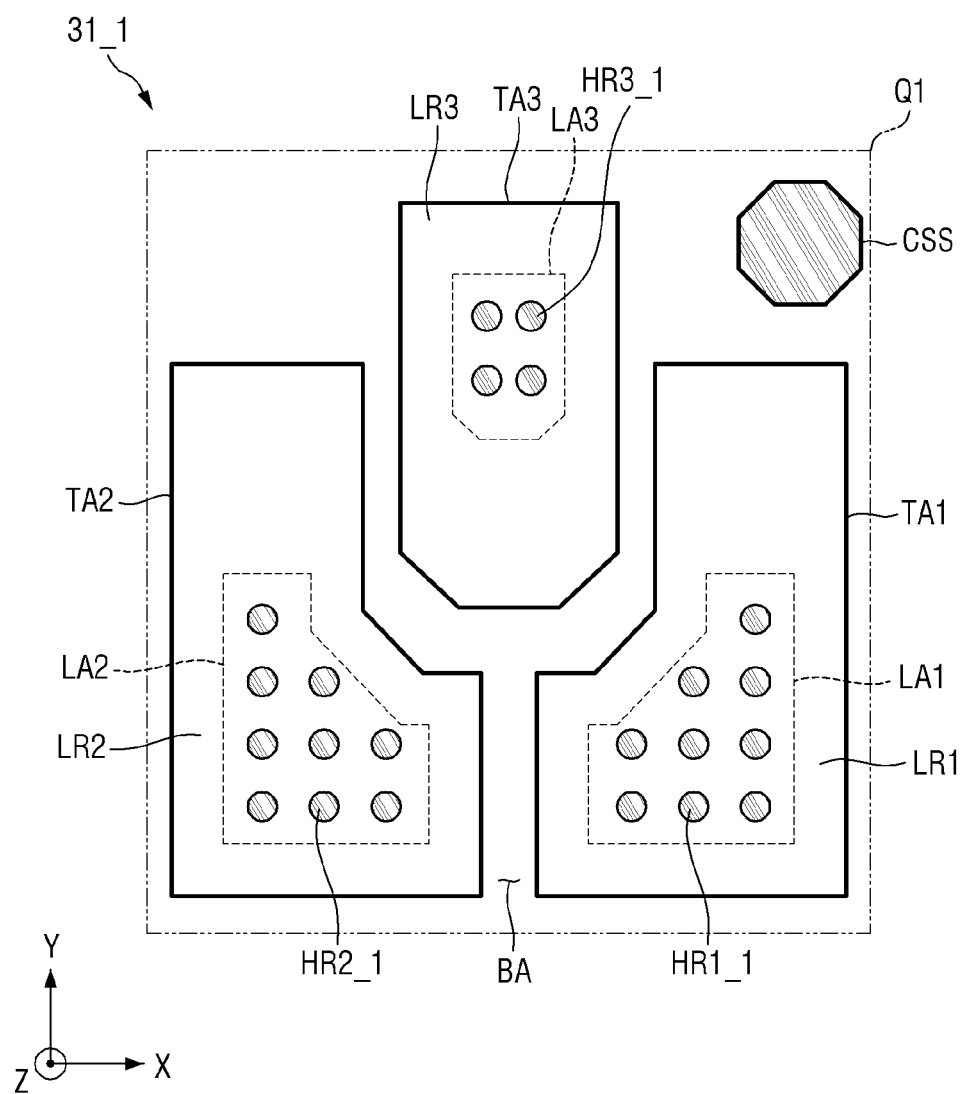
FIG. 41 is a plan view illustrating a schematic arrangement of an optical pattern and a column spacer in a color conversion substrate of a display device according to still another embodiment.

FIG. 38 is a cross-sectional view of a display device according to still another embodiment taken along line X3-X3′ of FIGS. 3 and 4. FIG. 39 is a cross-sectional view of a display device according to still another embodiment taken along line X5-X5′ of FIGS. 3 and 4. FIG. 40 is a cross-sectional view of a display device according to still another embodiment taken along line X7-X7′ of FIGS. 3 and 4. FIG. 41 is a plan view illustrating a schematic arrangement of an optical pattern and a column spacer in a color conversion substrate of a display device according to still another embodiment.

Referring to FIGS. 38 to 41, a display device 2_1 according to an embodiment includes the display substrate 10, a color conversion substrate 31_1, and the filler 70. The embodiment of the display device 2_1 shown in FIGS. 38 to 41 is substantially the same as the embodiment of FIGS. 34 to 37 except that the color conversion substrate 31_1 includes a plurality of first optical patterns HR1_1, a plurality of second optical patterns HR2_1, and a plurality of third optical patterns HR3_1. Other features of the embodiment of FIGS. 38 to 41 and the embodiment of FIGS. 34 to 37 are substantially the same as or similar to each other. Thus, any repetitive detailed description thereof will be omitted and differences will be mainly described.

The plurality of first optical patterns HR1_, the plurality of second optical patterns HR2_1, and the plurality of third optical patterns HR3_1 may be provided on one surface of the second capping layer 393.

In some embodiments, the shapes and sizes of the first optical pattern HR_1, the second optical pattern HR2_1, and the third optical pattern HR3_1 may be substantially the same. However, the present disclosure is not limited thereto, and the shapes or numbers of the first optical pattern HR_1, the second optical pattern HR2_1, and the third optical pattern HR3_1 may be different from each other.

In some embodiments, the first optical patterns HR1_1 that overlap the first light transmitting area TA1 or the first emission area LA1 may be spaced apart from each other, the second optical patterns HR2_1 that overlap the second light transmitting area TA2 or the second emission area LA2 may be spaced apart from each other, and the third optical patterns HR3_1 that overlap the third light transmitting area TA3 or the third emission area LA3 may be spaced apart from each other. However, the present disclosure is not limited thereto, and alternatively, the optical patterns that overlap the same light transmitting area may be connected to each other.

In some embodiments, any one of the number of the first optical patterns HR1_1, the number of the second optical patterns HR2_1, and the number of the third optical patterns HR3_1 may be different from another one thereof. For example, when the size of the first emission area LA1 and the size of the second emission area LA2 are larger than the size of the third emission area LA3, the number of the first optical patterns HR1_1 and the number of the second optical patterns HR2_1 may be greater than the number of the third optical patterns HR3_1.

A detailed description of other features such as the materials, shapes, and the like of the first optical pattern HR1_1, the second optical pattern HR2_1, and the third optical pattern HR31, which are substantially the same as those of the first optical pattern HR1 (see FIGS. 34 and 37), the second optical pattern HR2 (see FIGS. 34 and 37), and the third optical pattern HR3 (see FIGS. 35 and 37) described above with reference to FIGS. 34 to 37, will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

The invention claimed is:

1. A display device comprising:
a first base portion in which a first emission area and a non-emission area are defined;
a first light emitting element positioned on the first base portion and overlapping the first emission area;
a thin film encapsulation layer positioned on the first light emitting element;
a second base portion positioned on the thin film encapsulation layer;
a first color filter positioned between the second base portion and the first base portion and overlapping the first emission area;
a first wavelength conversion pattern positioned on the first color filter and overlapping the first emission area; and
a first optical pattern positioned between the first color filter and the first wavelength conversion pattern and overlapping the first emission area,
wherein a refractive index of the first optical pattern is smaller than a refractive index of the first wavelength conversion pattern,
one surface of the first optical pattern facing the first wavelength conversion pattern comprises a curved surface concave toward the second base portion, and
the first optical pattern further comprises a plurality of convex patterns protruding from one surface of the first optical pattern toward the first wavelength conversion pattern.

2. The display device of claim 1, wherein the refractive index of the first optical pattern is about 1.1 or more and about 1.4 or less, and
the refractive index of the first wavelength conversion pattern is about 1.7 or more and about 1.9 or less.

3. The display device of claim 1, wherein the first base portion further comprises a second emission area and a third emission area,
the display device further comprising:
a second light emitting element positioned on the first base portion and overlapping the second emission area;
a third light emitting element positioned on the first base portion and overlapping the third emission area;

a second color filter positioned between the second base portion and the first base portion and overlapping the second emission area;
a second wavelength conversion pattern positioned on the second color filter and overlapping the second emission area;
a second optical pattern positioned between the second color filter and the second wavelength conversion pattern and overlapping the second emission area;
a third color filter positioned between the second base portion and the first base portion and overlapping the third emission area;
a light transmission pattern positioned on the third color filter and overlapping the third emission area; and
a third optical pattern positioned between the third color filter and the light transmission pattern and overlapping the third emission area,
wherein the first optical pattern, the second optical pattern and the third optical pattern comprise a same material as each other.

4. The display device of claim 3, wherein a first opening exposing a part of the first color filter is defined in the first optical pattern, a second opening exposing a part of the second color filter is defined in the second optical pattern, and a third opening exposing a part of the third color filter is defined in the third optical pattern, and
in a plan view, an area of the third opening is different from an area of the first opening and an area of the second opening.

5. A display device comprising:
a first base portion in which a first emission area and a non-emission area are defined;
a first light emitting element positioned on the first base portion and overlapping the first emission area;
a thin film encapsulation layer positioned on the first light emitting element;
a second base portion positioned on the thin film encapsulation layer;
a first color filter positioned between the second base portion and the first base portion and overlapping the first emission area;
a first wavelength conversion pattern positioned on the first color filter and overlapping the first emission area; and
a first optical pattern positioned between the first color filter and the first wavelength conversion pattern and overlapping the first emission area,
wherein a refractive index of the first optical pattern is smaller than a refractive index of the first wavelength conversion pattern,
one surface of the first optical pattern facing the first wavelength conversion pattern comprises a curved surface concave toward the second base portion, and
the display device further comprising a bank pattern positioned between the second base portion and the first base portion and surrounding the first wavelength conversion pattern while overlapping the non-emission area,
wherein the first optical pattern is positioned in a space defined by the bank pattern.

6. The display device of claim 5, wherein a height of the bank pattern measured with respect to one surface of the second base portion is higher than a height of the first optical pattern measured with respect to the one surface of the second base portion.

7. The display device of claim 6, wherein the first optical pattern comprises a portion in which the height of the first optical pattern increases as a distance thereof from the bank pattern decreases.

8. The display device of claim 5, wherein the first optical pattern is in direct contact with the bank pattern in a space defined by the bank pattern.

9. The display device of claim 5, further comprising a column spacer positioned on one surface of the bank pattern facing the first base portion, wherein the column spacer comprises a same material as the first optical pattern.

10. The display device of claim 9, wherein the first optical pattern and the column spacer comprises a resin and a plurality of particles dispersed in the resin and including an inorganic material.

11. The display device of claim 9, further comprising a capping layer positioned on the first wavelength conversion pattern and the bank pattern and covering the column spacer,
wherein a portion of the capping layer overlapping the column spacer is in contact with the thin film encapsulation layer.

12. The display device of claim 11, further comprising a filler positioned between the capping layer and the thin film encapsulation layer,
wherein the filler is in contact with the capping layer and the thin film encapsulation layer.

13. The display device of claim 5, wherein the first optical pattern further comprises a plurality of convex patterns protruding from one surface of the first optical pattern toward the first wavelength conversion pattern.

14. A display device comprising:
a first base portion in which a first emission area and a non-emission area are defined;
a first light emitting element positioned on the first base portion and overlapping the first emission area;
a thin film encapsulation layer positioned on the first light emitting element;
a second base portion positioned on the thin film encapsulation layer;
a first color filter positioned between the second base portion and the first base portion and overlapping the first emission area;
a first wavelength conversion pattern positioned on the first color filter and overlapping the first emission area; and
a first optical pattern positioned between the first color filter and the first wavelength conversion pattern and overlapping the first emission area,
wherein a refractive index of the first optical pattern is smaller than a refractive index of the first wavelength conversion pattern,
one surface of the first optical pattern facing the first wavelength conversion pattern comprises a curved surface concave toward the second base portion, and
a first opening exposing a part of the first color filter is defined in the first optical pattern,
and a part of the first wavelength conversion pattern is positioned in the first opening.

15. The display device of claim 14, wherein an edge of the first emission area completely surrounds the first opening in a plan view.

16. The display device of claim 14, further comprising a capping layer positioned between the first optical pattern and the first wavelength conversion pattern,
wherein the capping layer is in contact with the part of the first color filter exposed through the first opening.

17. A display device comprising:
a first base portion in which a first emission area and a non-emission area are defined;
a first light emitting element positioned on the first base portion and overlapping the first emission area;
a thin film encapsulation layer positioned on the first light emitting element;
a second base portion positioned on the thin film encapsulation layer;
a first color filter positioned between the second base portion and the first base portion and overlapping the first emission area;
a first wavelength conversion pattern positioned on the first color filter and overlapping the first emission area; and
a first optical pattern positioned between the first color filter and the first wavelength conversion pattern and overlapping the first emission area,
wherein a refractive index of the first optical pattern is smaller than a refractive index of the first wavelength conversion pattern,
one surface of the first optical pattern facing the first wavelength conversion pattern comprises a curved surface concave toward the second base portion,
the first base portion further comprises a second emission area and a third emission area,
the display device further comprising:
a second light emitting element positioned on the first base portion and overlapping the second emission area;
a third light emitting element positioned on the first base portion and overlapping the third emission area;
a second color filter positioned between the second base portion and the first base portion and overlapping the second emission area;
a second wavelength conversion pattern positioned on the second color filter and overlapping the second emission area;
a second optical pattern positioned between the second color filter and the second wavelength conversion pattern and overlapping the second emission area;
a third color filter positioned between the second base portion and the first base portion and overlapping the third emission area;
a light transmission pattern positioned on the third color filter and overlapping the third emission area; and
a third optical pattern positioned between the third color filter and the light transmission pattern and overlapping the third emission area,
the first optical pattern, the second optical pattern and the third optical pattern comprise a same material as each other, and
in a plan view, an area of the third optical pattern is different from an area of the first optical pattern and an area of the second optical pattern.

18. A display device comprising:
a first base portion in which a first emission area and a non-emission area are defined;
a first light emitting element positioned on the first base portion and overlapping the first emission area;
a thin film encapsulation layer positioned on the first light emitting element;
a filler positioned on the thin film encapsulation layer;
a second base portion positioned on the filler;
a first color filter positioned between the second base portion and the first base portion and overlapping the first emission area;

a first wavelength conversion pattern positioned on the first color filter and overlapping the first emission area; and a first optical pattern positioned between the first wavelength conversion pattern and the filler and overlapping the first emission area, wherein a refractive index of the first optical pattern is greater than a refractive index of the filler, and one surface of the first optical pattern facing the filler comprises a curved surface convex toward the filler, the display device further comprising:
  a bank pattern positioned between the second base portion and the first base portion and surrounding the first wavelength conversion pattern while overlapping the non-emission area; and
  a column spacer positioned on one surface of the bank pattern facing the first base portion, and
the column spacer and the first optical pattern comprise a same material as each other.

19. The display device of claim 18, wherein the refractive index of the filler is about 1.4 or more and about 1.7 or less, and
the refractive index of the first optical pattern is about 1.8 or more and about 2.5 or less.

20. The display device of claim 18, wherein the column spacer is in contact with the thin film encapsulation layer, and
the first optical pattern is spaced apart from the thin film encapsulation layer with the filler interposed therebetween.

21. The display device of claim 18, further comprising a capping layer covering the first wavelength conversion pattern and the bank pattern,
wherein the first optical pattern and the column spacer are positioned on one surface of the capping layer facing the first base portion.

22. The display device of claim 18, wherein an edge of the first emission area completely surrounds the first optical pattern in a plan view.

23. The display device of claim 18, wherein the first base portion further comprises a second emission area and a third emission area,
the display device further comprising:
  a second light emitting element positioned on the first base portion and overlapping the second emission area;
  a third light emitting element positioned on the first base portion and overlapping the third emission area;
  a second color filter positioned between the second base portion and the first base portion and overlapping the second emission area;
  a second wavelength conversion pattern positioned on the second color filter and overlapping the second emission area;
  a second optical pattern positioned between the second wavelength conversion pattern and the filler and overlapping the second emission area;
  a third color filter positioned between the second base portion and the first base portion and overlapping the third emission area;
  a light transmission pattern positioned on the third color filter and overlapping the third emission area; and
  a third optical pattern positioned between the light transmission pattern and the filler and overlapping the third emission area, wherein one surface of the second optical pattern facing the filler and one surface of the third optical pattern facing the filler have a curved surface convex toward the filler.

24. A display device comprising:
a first base portion in which a first emission area and a non-emission area are defined;
a first light emitting element positioned on the first base portion and overlapping the first emission area;
a thin film encapsulation layer positioned on the first light emitting element;
a filler positioned on the thin film encapsulation layer;
a second base portion positioned on the filler;
a first color filter positioned between the second base portion and the first base portion and overlapping the first emission area;
a first wavelength conversion pattern positioned on the first color filter and overlapping the first emission area; and
a first optical pattern positioned between the first wavelength conversion pattern and the filler and overlapping the first emission area, wherein a refractive index of the first optical pattern is greater than a refractive index of the filler, one surface of the first optical pattern facing the filler comprises a curved surface convex toward the filler, the first base portion further comprises a second emission area and a third emission area, the display device further comprising:
  a second light emitting element positioned on the first base portion and overlapping the second emission area;
  a third light emitting element positioned on the first base portion and overlapping the third emission area;
  a second color filter positioned between the second base portion and the first base portion and overlapping the second emission area;
  a second wavelength conversion pattern positioned on the second color filter and overlapping the second emission area;
  a second optical pattern positioned between the second wavelength conversion pattern and the filler and overlapping the second emission area;
  a third color filter positioned between the second base portion and the first base portion and overlapping the third emission area;
  a light transmission pattern positioned on the third color filter and overlapping the third emission area; and
  a third optical pattern positioned between the light transmission pattern and the filler and overlapping the third emission area, one surface of the second optical pattern facing the filler and one surface of the third optical pattern facing the filler have a curved surface convex toward the filler, each of the first optical pattern, the second optical pattern, and the third optical pattern is provided in plural, and the number of the first optical patterns overlapping the first emission area and the number of the second optical patterns overlapping the second emission area are different from the number of the third optical patterns overlapping the third emission area.

25. The display device of claim 24, further comprising:
a bank pattern positioned between the second base portion and the first base portion and surrounding the first wavelength conversion pattern while overlapping the non-emission area; and a column spacer positioned on one surface of the bank pattern facing the first base portion,
wherein the column spacer and the first optical pattern comprise a same material as each other.

* * * * *